US012262598B2

(12) United States Patent
Kim et al.

(10) Patent No.: US 12,262,598 B2
(45) Date of Patent: Mar. 25, 2025

(54) DISPLAY DEVICE AND METHOD OF MANUFACTURING THE DISPLAY DEVICE

(71) Applicant: Samsung Display Co., Ltd., Yongin-Si (KR)

(72) Inventors: Jaybum Kim, Yongin-si (KR); Myeongho Kim, Yongin-si (KR); Yeonhong Kim, Yongin-si (KR); Kyoungseok Son, Yongin-si (KR); Seungjun Lee, Yongin-si (KR); Seunghun Lee, Yongin-si (KR); Junhyung Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/378,656

(22) Filed: Oct. 11, 2023

(65) Prior Publication Data

US 2024/0040861 A1 Feb. 1, 2024

Related U.S. Application Data

(63) Continuation of application No. 17/353,640, filed on Jun. 21, 2021, now Pat. No. 11,818,923.

(30) Foreign Application Priority Data

Dec. 18, 2020 (KR) .......................... 10-2020-0178939

(51) Int. Cl.
*H10K 59/124* (2023.01)
*H01L 27/12* (2006.01)
(Continued)

(52) U.S. Cl.
CPC ....... *H10K 59/124* (2023.02); *H01L 27/1225* (2013.01); *H01L 27/1251* (2013.01);
(Continued)

(58) Field of Classification Search
CPC ............ H01L 27/1251; H01L 27/1255; H10K 59/121; H10K 59/1213; H10K 59/1216;
(Continued)

(56) References Cited

U.S. PATENT DOCUMENTS 9,911,941 B2 3/2018 Choi et al.
10,170,525 B2 1/2019 Lee et al.
(Continued)

FOREIGN PATENT DOCUMENTS

KR 10-2006-0000850 A 1/2006
KR 10-0611655 B1 8/2006
(Continued)

*Primary Examiner* — Victoria K. Hall
(74) *Attorney, Agent, or Firm* — Innovation Counsel LLP

(57) ABSTRACT

A display device is disclosed that includes: a substrate comprising a display area and a component area including a transmission area; a first thin-film transistor comprising a first semiconductor layer and a first gate electrode, the first semiconductor layer including a silicon semiconductor; a first insulating layer covering the first gate electrode; a second thin-film transistor comprising a second semiconductor layer arranged on the first insulating layer and a second gate electrode, the second semiconductor layer including an oxide semiconductor; a second insulating layer covering the second gate electrode and having a transmission hole overlapping the transmission area; an intermediate insulating layer between the first insulating layer and the second insulating layer; a conductive pattern between the intermediate insulating layer and the first insulating layer; and a display element arranged on the second insulating layer, wherein the transmission hole exposes an upper surface of the intermediate insulating layer.

9 Claims, 36 Drawing Sheets

(51) Int. Cl.
*H10K 59/121* (2023.01)
*H10K 71/00* (2023.01)
*H01L 25/16* (2023.01)
*H01L 25/18* (2023.01)
*H10K 59/12* (2023.01)
*H10K 59/65* (2023.01)

(52) U.S. Cl.
CPC ..... *H01L 27/1255* (2013.01); *H10K 59/1213* (2023.02); *H10K 59/1216* (2023.02); *H10K 71/00* (2023.02); *H01L 25/167* (2013.01); *H01L 25/18* (2013.01); *H10K 59/1201* (2023.02); *H10K 59/121* (2023.02); *H10K 59/65* (2023.02)

(58) Field of Classification Search
CPC ...... H10K 59/124; H10K 59/34; H10K 59/60; H10K 59/65
See application file for complete search history.

(56) References Cited

U.S. PATENT DOCUMENTS

| | | | |
|---|---|---|---|
| 11,641,769 B2 | 5/2023 | Cha et al. | |
| 11,818,923 B2* | 11/2023 | Kim | H10K 71/00 |
| 12,058,889 B2* | 8/2024 | Yun | H10K 59/121 |
| 2017/0133444 A1* | 5/2017 | Lee | H10K 50/844 |
| 2019/0081089 A1 | 3/2019 | Cho et al. | |
| 2019/0115407 A1 | 4/2019 | Cho et al. | |
| 2019/0288048 A1* | 9/2019 | Kang | H10K 59/1213 |
| 2019/0349550 A1 | 11/2019 | Bang et al. | |
| 2020/0273927 A1* | 8/2020 | Oh | H10K 77/10 |
| 2020/0357871 A1 | 11/2020 | Chung et al. | |
| 2022/0238614 A1 | 7/2022 | Luo et al. | |

FOREIGN PATENT DOCUMENTS

| | | |
|---|---|---|
| KR | 10-2016-0130042 A | 11/2016 |
| KR | 10-2017-0055587 A | 5/2017 |
| KR | 10-2019-0130094 A | 11/2019 |
| KR | 10-2020-0039866 A | 4/2020 |

* cited by examiner

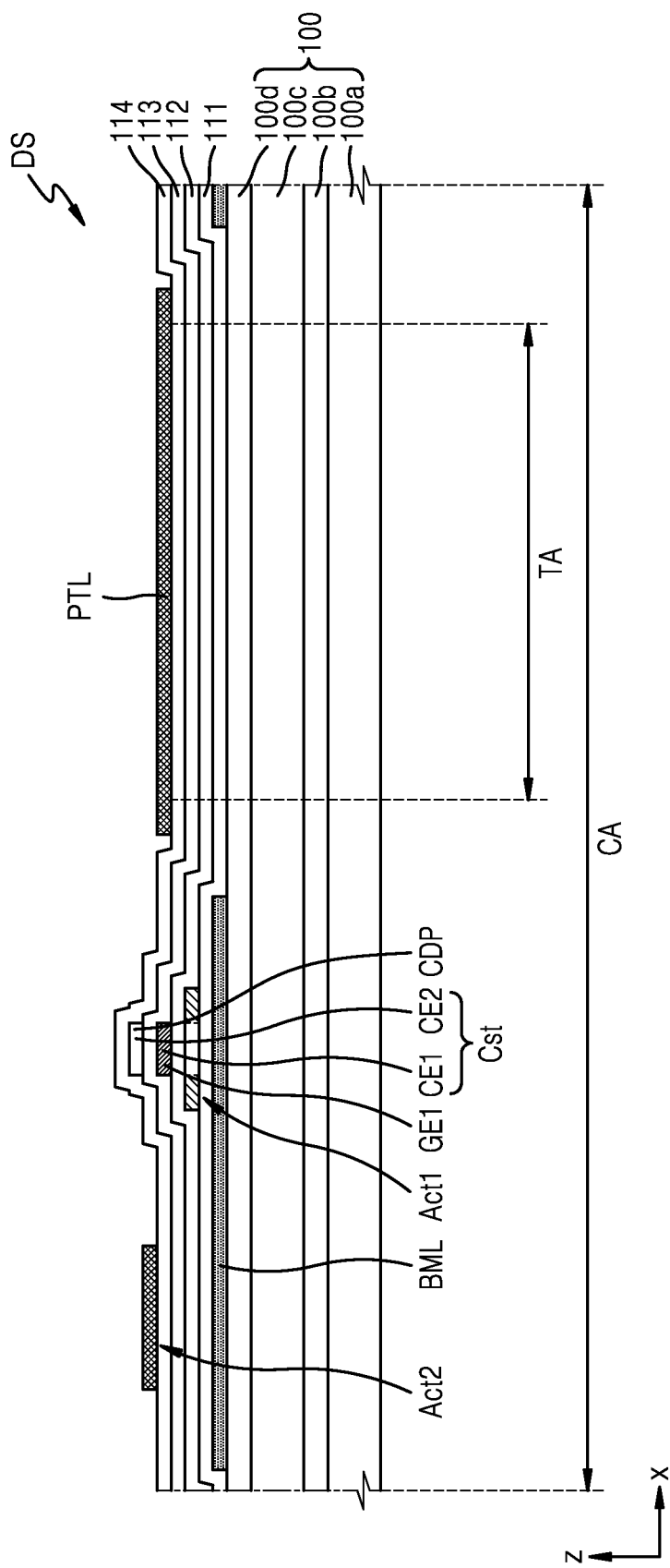

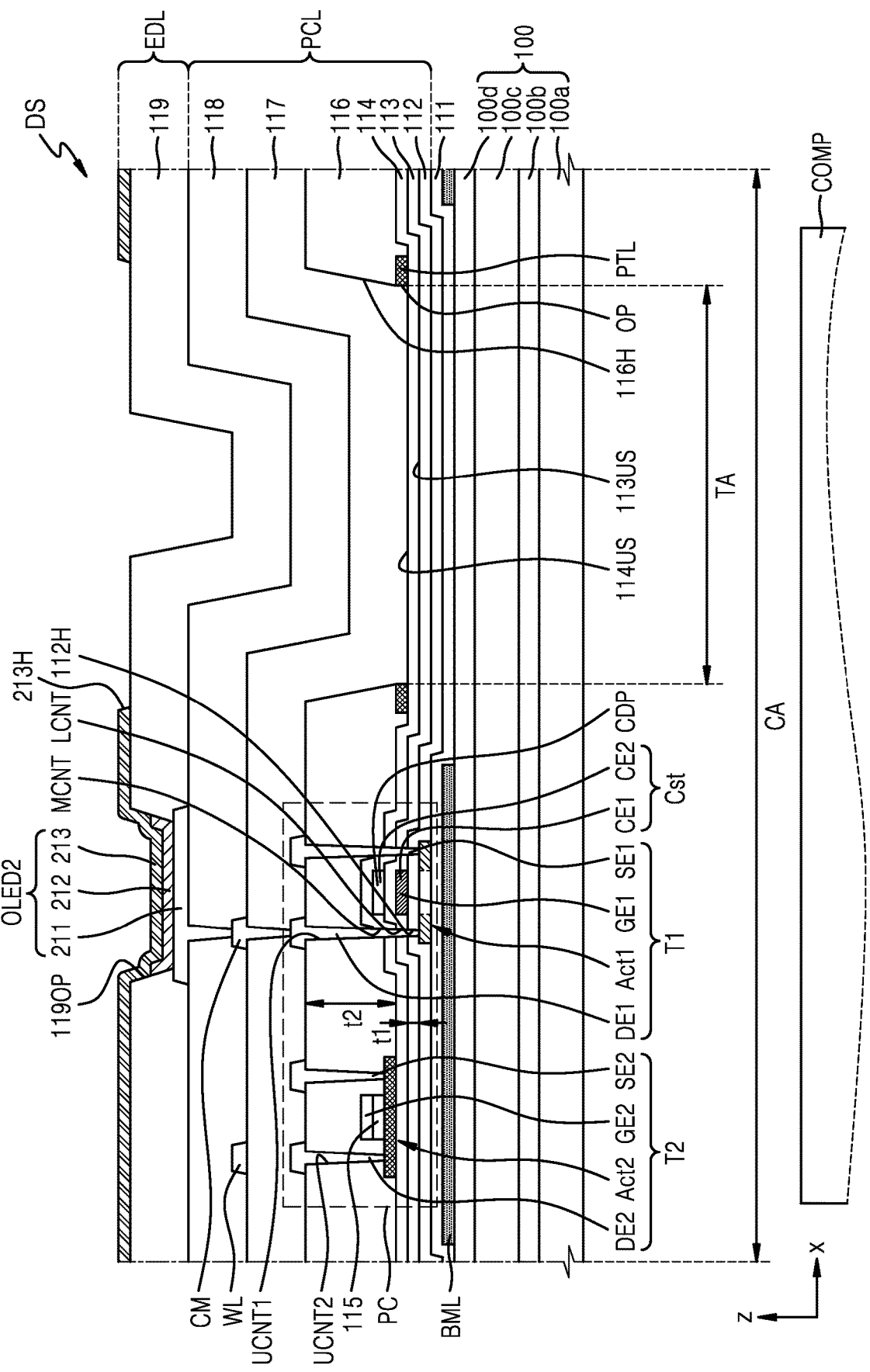

DISPLAY DEVICE AND METHOD OF MANUFACTURING THE DISPLAY DEVICE

CROSS-REFERENCE TO RELATED APPLICATIONS

This application is a continuation of U.S. patent application Ser. No. 17/353,640, filed on Jun. 21, 2021, now U.S. Pat. No. 11,818,923, issued on Nov. 14, 2023, which is based on and claims priority under 35 U.S.C. § 119 to Korean Patent Application No. 10-2020-0178939, filed on Dec. 18, 2020, in the Korean Intellectual Property Office, the disclosures of which are incorporated by reference herein in their entireties.

BACKGROUND

1. Field

One or more embodiments relate to a display device and a method of manufacturing the display device.

2. Description of the Related Art

As display devices have become thinner and lighter, the usage thereof has steadily diversified and expanded.

As the area occupied by a display area in a display device has been expanded, various functions combined with or linked to display devices have been added. As a way to add various functions to a display device while expanding a display area, there is ongoing research on display devices that have an area inside the display area in which various functions other than displaying an image are added.

SUMMARY

According to an embodiment, a display device includes a substrate comprising a component area and a display area adjacent to the component area, the component area including a transmission area, a first thin-film transistor including a first semiconductor layer arranged on the substrate and a first gate electrode overlapping the first semiconductor layer, the first semiconductor layer including a silicon semiconductor, a first insulating layer covering the first gate electrode and overlapping the transmission area, a second thin-film transistor including a second semiconductor layer arranged on the first insulating layer and a second gate electrode overlapping the second semiconductor layer, the second semiconductor layer including an oxide semiconductor, a second insulating layer covering the second gate electrode and having a transmission hole overlapping the transmission area, an intermediate insulating layer between the first insulating layer and the second insulating layer, a conductive pattern between the intermediate insulating layer and the first insulating layer, and a display element arranged on the second insulating layer and spaced apart from the transmission area, wherein the transmission hole exposes an upper surface of the intermediate insulating layer.

The display area may surround the component area.

The second semiconductor layer may be arranged between the intermediate insulating layer and the second insulating layer, and the first thin-film transistor may further include any one of a first source electrode and a first drain electrode arranged above the second insulating layer and electrically connected to the first semiconductor layer through a lower contact hole of the first insulating layer, an intermediate contact hole of the intermediate insulating layer, and a first upper contact hole of the second insulating layer.

The second thin-film transistor may further include any one of a second source electrode and a second drain electrode arranged above the second insulating layer and electrically connected to the second semiconductor layer through a second upper contact hole of the second insulating layer.

The display device may further include a pattern layer arranged between the intermediate insulating layer and the second insulating layer and overlapping the component area, and the pattern layer and the second semiconductor layer include a same material.

The pattern layer may include an opening that overlaps the transmission hole and exposes the upper surface of the intermediate insulating layer.

The pattern layer may overlap the transmission area, and an upper surface of the pattern layer may be exposed by the transmission hole.

A second thickness of the second insulating layer may be greater than a first thickness of the first insulating layer.

The display device may further include a bottom metal layer arranged between the substrate and the first semiconductor layer and overlapping the component area, and at least one of the first thin-film transistor and the second thin-film transistor may overlap the bottom metal layer.

The display device may further include a component overlapping the component area, and the display element may include a first display element and a second display element, wherein the first display element overlaps the display area, and the second display element overlaps the component area.

According to another embodiment, a display device includes a substrate including a component area including a transmission area, and a display area adjacent to the component area, a first thin-film transistor including a first semiconductor layer arranged on the substrate and including a silicon semiconductor, and a first gate electrode overlapping the first semiconductor layer, a first insulating layer covering the first gate electrode and overlapping the transmission area, a second thin-film transistor including a second semiconductor layer arranged on the first insulating layer and including an oxide semiconductor, and a second gate electrode overlapping the second semiconductor layer, a second insulating layer covering the second gate electrode and having a transmission hole overlapping the transmission area, a conductive pattern arranged between the first insulating layer and the second insulating layer and including a same material as the second semiconductor layer, and a display element arranged on the second insulating layer and spaced apart from the transmission area, wherein the transmission hole exposes an upper surface of the first insulating layer.

The display device may further include a pattern layer arranged between the first insulating layer and the second insulating layer and overlapping the component area, and the pattern layer and the second semiconductor layer include a same material.

The pattern layer may include an opening that overlaps the transmission hole and exposes the upper surface of the first insulating layer.

According to another embodiment, a method of manufacturing a display device may include preparing a display substrate comprising a substrate including a transmission area, a first semiconductor layer arranged on the substrate and including a silicon semiconductor, and a first gate electrode overlapping the first semiconductor layer, forming a first insulating layer that covers the first gate electrode and overlaps the transmission area, forming, on the first insulating layer, a second semiconductor layer including an oxide semiconductor, and a pattern layer, forming a second insulating layer that covers the second semiconductor layer and the pattern layer, and forming, in the second insulating layer, a transmission hole exposing at least a portion of the pattern layer and overlapping the transmission area.

The forming of the transmission hole may include forming, in the first insulating layer, a lower contact hole that exposes at least a portion of the first semiconductor layer, and forming, in the second insulating layer, a first upper contact hole that exposes the at least the portion of the first semiconductor layer.

The method may further include removing the at least the portion of the pattern layer by etching the pattern layer.

The method may further include forming, in the pattern layer, an opening that overlaps the transmission hole and exposes an upper surface of the first insulating layer.

The forming of the transmission hole may include forming, in the second insulating layer, a second upper contact hole that exposes at least a portion of the second semiconductor layer.

An upper surface of the pattern layer may be exposed by the transmission hole.

The method may further include forming a conductive pattern on the first insulating layer, and forming an intermediate insulating layer that covers the conductive pattern, and the second semiconductor layer may be formed on the intermediate insulating layer.

The forming of the second semiconductor layer and the pattern layer may include forming a conductive pattern on the first insulating layer.

A second thickness of the second insulating layer may be formed to be greater than a first thickness of the first insulating layer.

The method may further include forming, on the second insulating layer, a display element spaced apart from the transmission area, and placing a component that overlaps the display element and the transmission area.

BRIEF DESCRIPTION OF THE DRAWINGS

The above and other aspects, features, and advantages of embodiments of the present disclosure will be more apparent from the following description taken in conjunction with the accompanying drawings, in which:

FIGS. 10A, 10B, 10C, 10D, 10E, 10F, 10G, 10H, 10I, 10J, and 10K are cross-sectional views illustrating a method of manufacturing a display device, according to an embodiment;

DETAILED DESCRIPTION

Figure 1A:
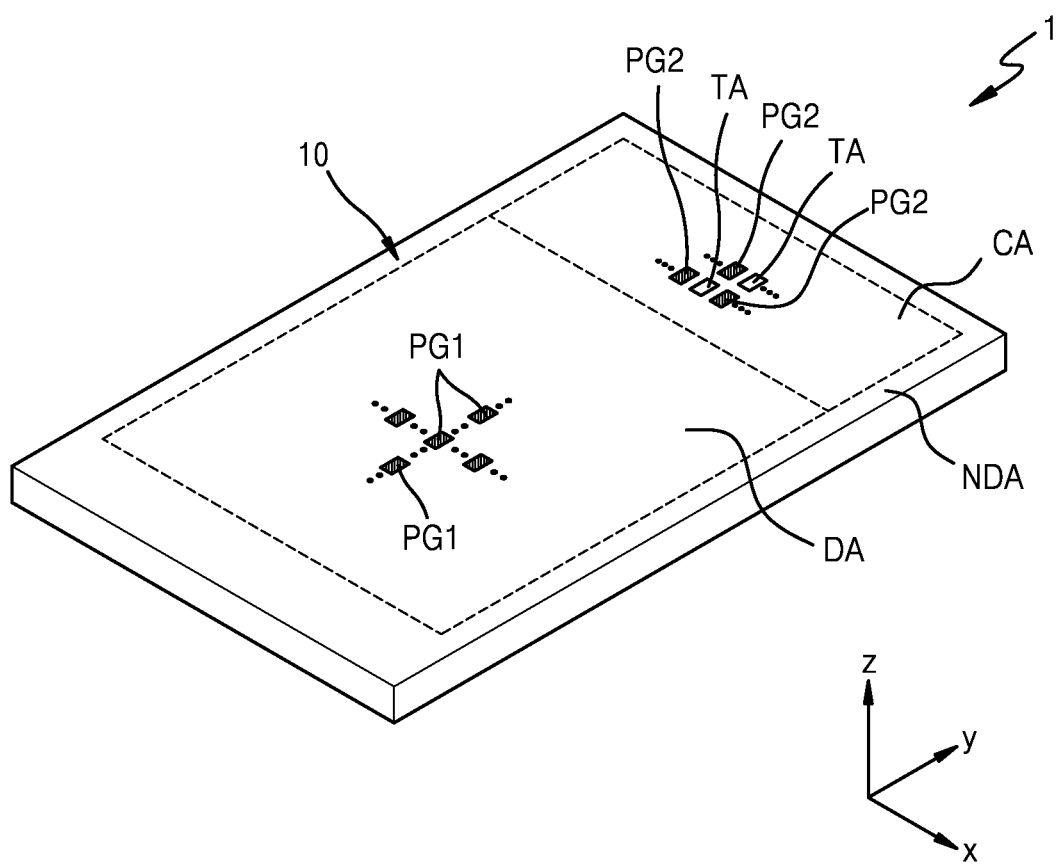
FIG. 1A is a perspective view schematically illustrating a display device according to an embodiment.

One or more embodiments provide a display device with improved light transmittance in a transmission area included in a component area and improved optical functions in the transmission area.

In addition, one or more embodiments of the present disclosure provide a method of manufacturing a display device having improved optical functions in a transmission area.

Additional aspects of the present disclosure will be set forth in part in the description that follows and, in part, will be apparent from the description, or may be learned by practice of the embodiments of the present disclosure described herein.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B." Throughout the present disclosure, the expression "at least one of a, b or c" indicates only a, only b, only c, both a and b, both a and c, both b and c, all of a, b, and c, or any variations thereof.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises," "comprising," "includes," and "including" used herein specify the presence of stated features or elements, but do not preclude the presence or addition of one or more other features or elements.

It will be further understood that when a layer, region, or element is referred to as being "formed on" another layer, area, or element, it can be directly or indirectly formed on the other layer, region, or element. That is, for example, one or more intervening layers, regions, or elements may be present therebetween.

Sizes of elements in the drawings may be exaggerated or contracted for convenience of explanation. In other words, because sizes and thicknesses of components in the drawings are arbitrarily illustrated for convenience of explanation, the following embodiments are not limited thereto.

When an embodiment may be implemented differently, a process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

Display devices display images, and may be portable mobile devices such as game machines, multimedia devices, and micro PCs. Display devices to be described later below may include liquid crystal displays, electrophoretic displays, organic light-emitting displays, inorganic electroluminescent (EL) displays, field emission displays, surface-conduction electron-emitter displays, quantum dot displays, plasma displays, cathode ray displays, and the like. Hereinafter, an organic light-emitting display is described as an example of a display device according to an embodiment, but display devices of various types as described above may be used in embodiments of the present disclosure.

A display device may include a display element. In an embodiment, the display element may include a light-emitting diode. As an emission layer, the light-emitting diode may include an organic light-emitting diode including an organic material. In some embodiments, the light-emitting diode may include an inorganic light-emitting diode. In some embodiments, the light-emitting diode may include quantum dots as an emission layer. In some embodiments, the light-emitting diode may be a micro light-emitting diode. In some embodiments, the light-emitting diode may be a nanorod light-emitting diode. In an embodiment, the nanorod light-emitting diode may include gallium nitride (GaN). In an embodiment, a color conversion layer may be arranged on the nanorod light-emitting diode. The color conversion layer may include quantum dots. Hereinafter, a detailed description will be given focusing on a case where the display element is an organic light-emitting diode.

Figure 1B:
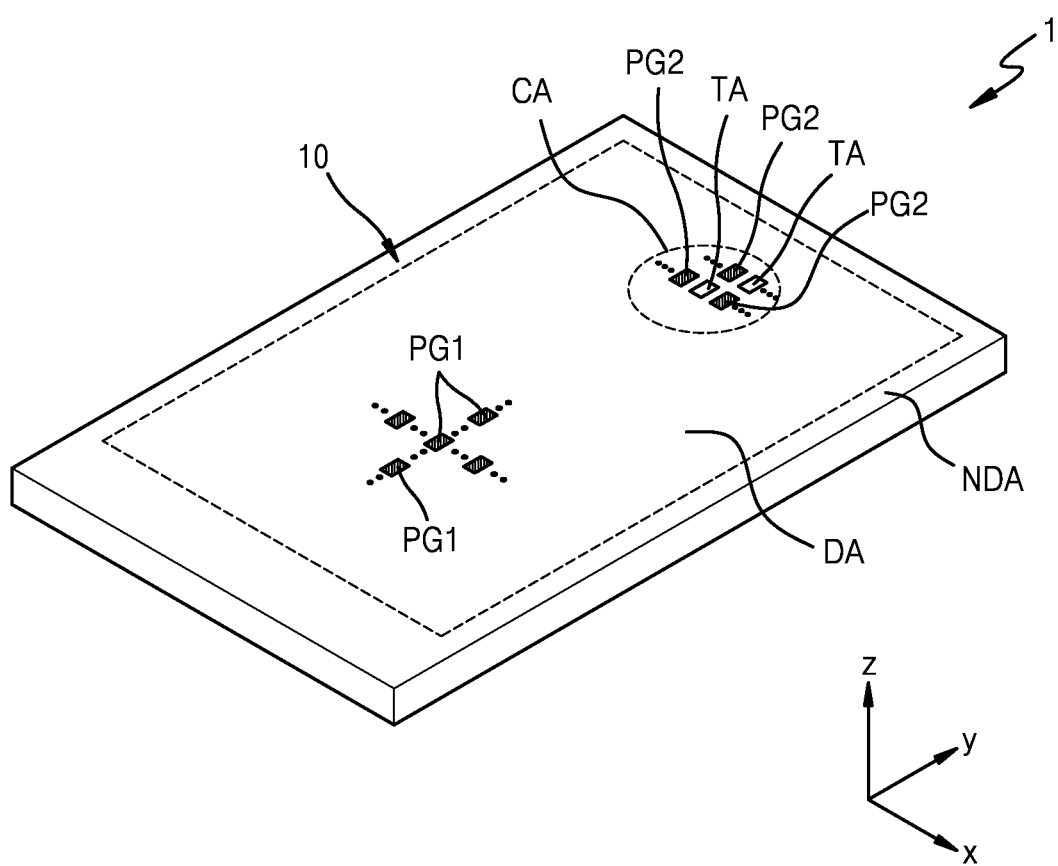
FIG. 1B is a perspective view schematically illustrating a display device according to another embodiment.

FIG. 1A is a perspective view schematically illustrating a display device 1 according to an embodiment. FIG. 1B is a perspective view schematically illustrating the display device 1 according to another embodiment.

Referring to FIG. 1A, the display device 1 may include a display panel 10. The display panel 10 may include a display area DA, a component area CA, and a non-display area NDA.

The display area DA may implement images. A first pixel group PG1 may be arranged in the display area DA. The first pixel group PG1 may include a plurality of display elements, for example, a plurality of organic light-emitting diodes. The display panel 10 may provide a first image using light emitted from the first pixel group PG1.

In the component area CA, an image may be implemented and a component (not shown) may be arranged. A second pixel group PG2 may also be arranged in the component area CA. In addition, the component area CA may include a transmission area TA. As will be described below with reference to FIG. 2A, the component may be a sensor or a camera using infrared rays, visible light, sound, or the like therebelow.

In an embodiment, the component area CA may be at least partially surrounded by the display area DA. In FIG. 1A, the component area CA is arranged in a bar type at one side of the display area DA, but the component area CA may be arranged in a notch type at one side of the display area DA. In another embodiment, the component area CA may be arranged in various ways inside the display area DA.

The component area CA may include the transmission area TA through which light or sound that is output from the component to the outside or progressing toward the component from the outside may transmit. The transmission area TA may include no pixels arranged therein. In this case, when infrared rays are transmitted toward the transmission area TA, the infrared ray transmittance of the component area CA may be about 15% or more, for example, about 20% or more, about 25% or more, about 85% or more, or about 90% or more.

The second pixel group PG2 may be arranged in the component area CA, and may emit light to provide a second image. The second pixel group PG2 may include a plurality of display elements, for example, a plurality of organic light-emitting diodes. In this case, the first image and the second image may be portions of an image provided by the display device 1 or the display panel 10. In some embodiments, the first image and the second image may be images independent from each other.

The non-display area NDA is an area that does not provide an image, and no pixel group is arranged in the non-display area NDA. The non-display area NDA may entirely surround the display area DA and the component area CA. A driver for providing electrical signals or power to the first pixel group PG1 and the second pixel group PG2, etc. may be arranged in the non-display area NDA. The non-display area NDA may include a pad portion, which is an area to which electronic elements, printed circuit boards, or the like may be electrically connected.

In FIG. 1B, the component area CA is entirely surrounded by the display area DA.

In an embodiment, the component area CA may have a circular shape or an elliptical shape in a plan view. In another embodiment, the component area CA may have a polygonal shape such as a quadrilateral shape in a plan view. In another embodiment, the component area CA may include a curved portion. In addition, a location of the component area CA and the number of component areas CA may be modified in various ways. For example, the display panel 10 may include a plurality of component areas CA.

FIGS. 2A to 2D are cross-sectional views schematically illustrating part of the display device 1 according to an embodiment.

Referring to FIGS. 2A to 2D, the display device 1 may include a display panel 10 and a component COMP overlapping the display panel 10. The display panel 10 may include a component area CA that is an area overlapping the component COMP, and a display area DA in which a first image is displayed.

The display panel 10 may include a substrate 100, a display layer DISL, a touch screen layer TSL, and an optical functional layer OFL above the substrate 100, and a panel protection member PB below the substrate 100. The display layer DISL may include a buffer layer, a pixel circuit layer PCL including a main thin-film transistor TFTm, and an auxiliary thin-film transistor TFTa, a display element layer EDL including an organic light-emitting diode as a display element, and an encapsulation member ENCM such as a thin-film encapsulation layer TFEL or an encapsulation substrate ENS.

The display area DA and the component area CA may be defined on the substrate 100. In other words, the substrate 100 may include the display area DA and the component area CA. The substrate 100 may include glass or a polymer resin such as polyether sulfone, polyarylate, polyether imide, polyethylene naphthalate, polyethylene terephthalate, polyphenylene sulfide, polyimide, polycarbonate, cellulose triacetate, or cellulose acetate propionate. The substrate 100 including a polymer resin may be flexible, rollable, or bendable. The substrate 100 may have a multi-layer structure including a base layer and a barrier layer (not shown), the base layer including the above-described polymer resin.

The buffer layer 111 may be located on the substrate 100 to reduce or prevent the penetration of foreign substances, moisture, or ambient air from a lower portion of the substrate 100, and may provide a flat surface on the substrate 100. The buffer layer 111 may include an inorganic material, such as oxide or nitride, an organic material, or an organic and inorganic compound, and may have a single-layer or multi-layer structure including an inorganic material or an organic material. In some embodiments, the buffer layer 111 may include silicon oxide ($SiO_2$) or silicon nitride ($SiN_x$).

In the display area DA of the display panel 10, the main thin-film transistor TFTm and a first organic light-emitting diode OLED1 connected thereto may be arranged to implement a first sub-pixel P1. In the component area CA, the auxiliary thin-film transistor TFTa and a second organic light-emitting diode OLED2 connected thereto may be arranged to implement a second sub-pixel P2. The first sub-pixel P1 may be part of the first pixel group PG1 of FIG. 1A, and the second sub-pixel P2 may be part of the second pixel group PG2 of FIG. 1A.

The component area CA may include a transmission area TA where no display element is arranged. The transmission area TA may be spaced apart from a display element. The transmission area TA may be an area through which light/signals emitted from the component COMP corresponding to the component area CA or incident on the component COMP transmits.

Figure 2A:
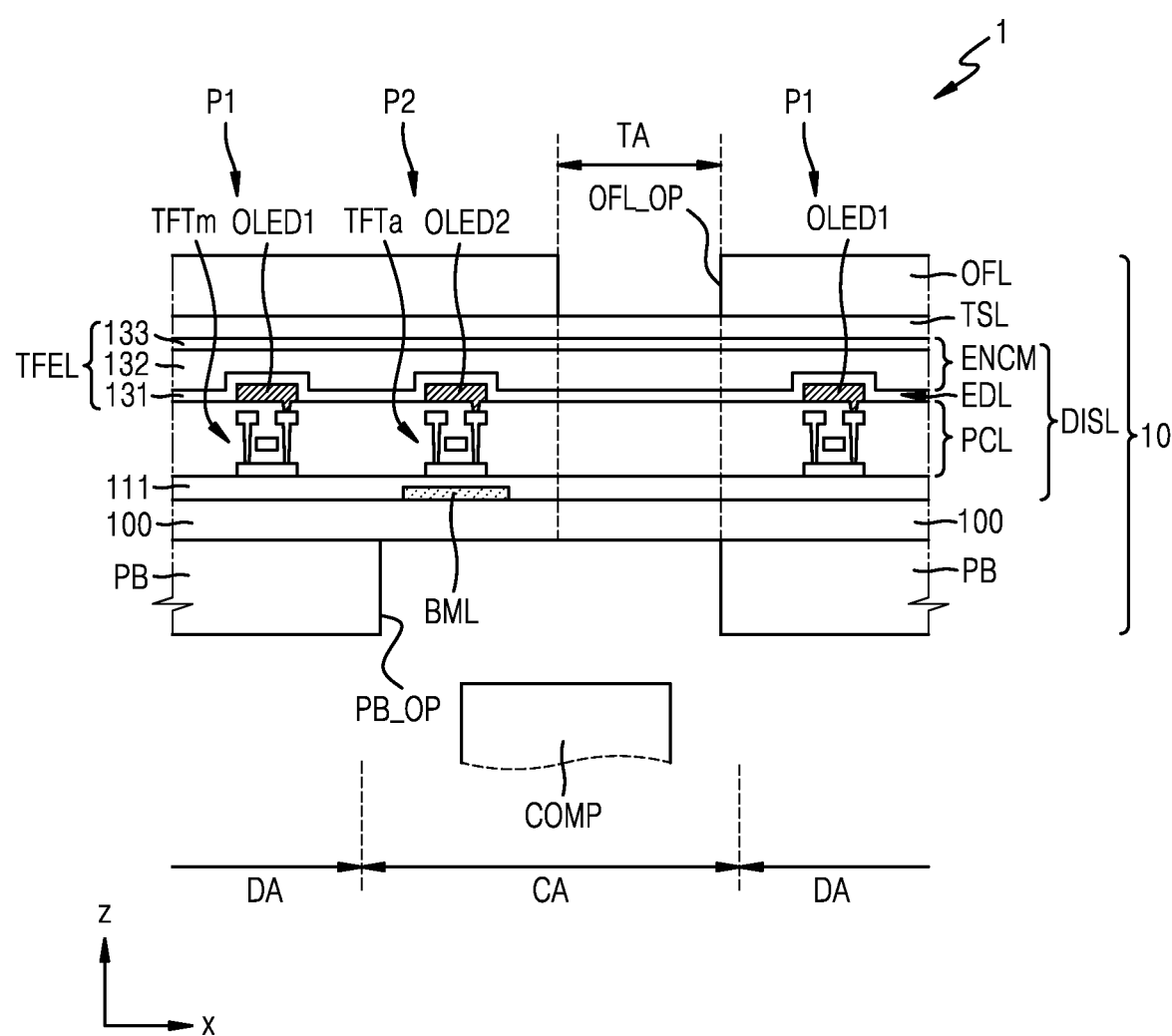
FIGS. 2A, 2B, 2C, and 2D are cross-sectional views schematically illustrating part of a display device according to an embodiment.

A bottom metal layer BML may be arranged in the component area CA. The bottom metal layer BML may be arranged to correspond to a lower portion of the auxiliary thin-film transistor TFTa. The bottom metal layer BML may block external light from reaching the auxiliary thin-film transistor TFTa. In some embodiments, a constant voltage or a signal may be transmitted to the bottom metal layer BML to prevent damage of a pixel circuit due to an electrostatic discharge. A plurality of bottom metal layers BML may be arranged in the component area CA, and according to cases, each of the bottom metal layers may receive different voltages from each other. However, one bottom metal layer BML having a hole overlapping the transmission area TA may be located in the component area CA. In FIG. 2A, the bottom metal layer BML is arranged on the substrate 100, but in some embodiments, the bottom metal layer BML may be inserted into the substrate 100.

The display element layer EDL may be covered with the thin-film encapsulation layer TFEL or the encapsulation substrate ENS. In some embodiments, as shown in FIG. 2A, the thin-film encapsulation layer TFEL may include at least one inorganic encapsulation layer and at least one organic encapsulation layer. In an embodiment, the thin-film encapsulation layer TFEL may include a first inorganic encapsulation layer 131, an organic encapsulation layer 132, and a second inorganic encapsulation layer 133.

Figure 2B:
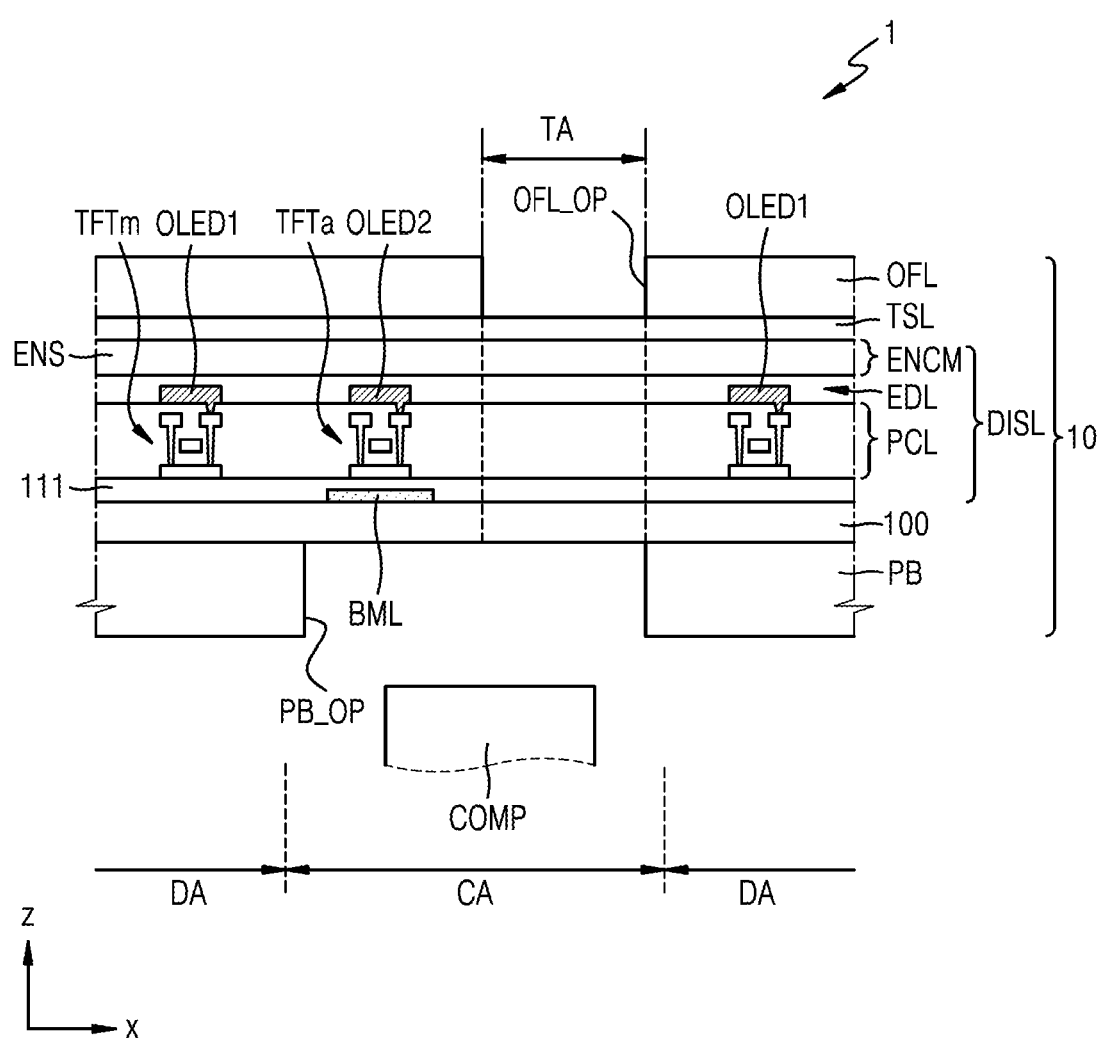

In some embodiments, as shown in FIG. 2B, the encapsulation substrate ENS may face the substrate 100 with the display element layer EDL therebetween. There may be a gap between the encapsulation substrate ENS and the display element layer EDL. The encapsulation substrate ENS may include glass. A sealant including frit, etc. is arranged between the substrate 100 and the encapsulation substrate ENS, and the sealant may be arranged in the non-display area NDA shown in FIG. 1A. The sealant arranged in the non-display area NDA may surround the display area DA and prevent the penetration of moisture through a side surface of the display panel 10. In some embodiments, the thin-film encapsulation layer TFEL of FIG. 2A and the encapsulation substrate ENS of FIG. 2B may be both applied.

The touch screen layer TSL may sense coordinate information according to an external input, for example, a touch event. The touch screen layer TSL may include a touch electrode and touch lines connected to the touch electrode. The touch screen layer TSL may sense an external input based on a self-capacitance method or a mutual capacitance method.

The touch screen layer TSL may be formed on the thin-film encapsulation layer TFEL. In some embodiments, the touch screen layer TSL may be separately formed on a touch substrate, and then coupled to the thin-film encapsulation layer TFEL through an adhesive layer, such as an optical clear adhesive. In an embodiment, as shown in FIG. 2A, the touch screen layer TSL may be formed directly on the thin-film encapsulation layer TFEL. In this case, an adhesive layer may not be present between the touch screen layer TSL and the thin-film encapsulation layer TFEL.

The optical functional layer OFL may include an anti-reflection layer. The anti-reflection layer may reduce the reflectance of light (external light) incident from the outside toward the display device 1.

In some embodiments, the optical functional layer OFL may include a polarization film. The optical functional layer OFL may have an opening OFL_OP overlapping the transmission area TA. Thus, the light transmittance of the transmission area TA may be significantly improved. The opening OFL_OP overlapping the transmission area TA may be filled with a transparent material such as an optically clear resin (OCR).

Figure 2C:
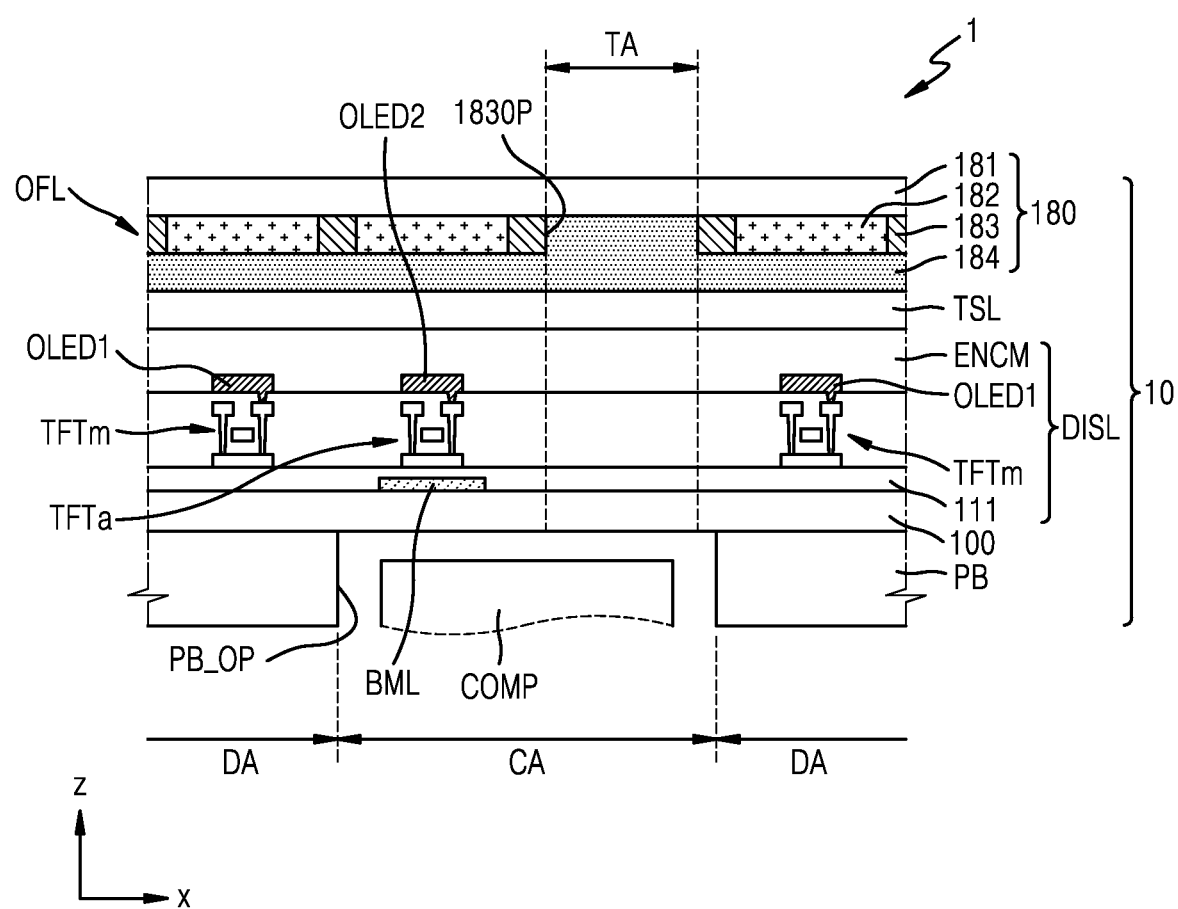

In some embodiments, as shown in FIG. 2C, the optical functional layer OFL may include a filter plate 180 including a black matrix and color filters. The filter plate 180 may include a base layer 181, color filters 182, a black matrix 183, and an overcoat layer 184 on the base layer 181.

The color filters 182 may be arranged by taking into account a color of light emitted from each of pixels of the display panel 10. For example, the color filter 182 may have one of red, green, and blue colors depending on the color of light emitted from the first organic light-emitting diode OLED1 or the second organic light-emitting diode OLED2. The transmission area TA may not overlap the color filter 182 and the black matrix 183. For example, a layer including the color filter 182 and the black matrix 183 may include an opening 1830P overlapping the transmission area TA, and part of the overcoat layer 184 may be at least partially filled in the opening 1830P. The overcoat layer 184 may include an organic material such as a resin, and the organic material may be transparent.

Figure 2D:
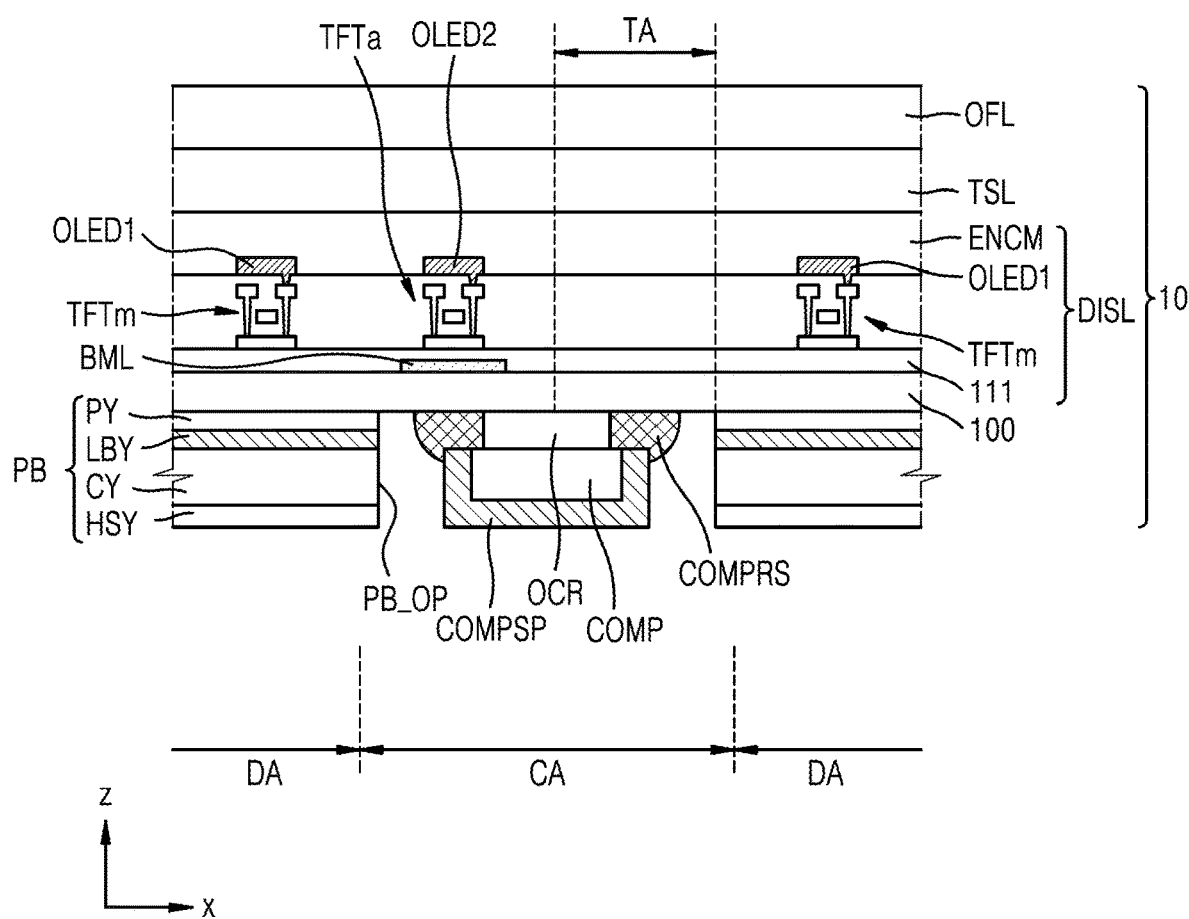

In some embodiments, the component COMP may be attached to a lower portion of the display panel 10. In addition, as shown in FIG. 2D, the panel protection member PB may include a protective layer PY, a light-blocking layer LBY, a cushion layer CY, and a heat dissipation layer HSY. The protective layer PY is attached to a lower surface of the substrate 100 and may protect the substrate 100 from the outside. For example, the protective layer PY may absorb physical shocks from the outside or block foreign substances, moisture, or the like from penetrating into the display layer DISL. The protective layer PY may be coated on the lower surface of the substrate 100 or may be attached in the form of a film.

In an embodiment, the protective layer PY may include a material that blocks ultraviolet rays (UV). For example, the protective layer PY may include a base resin, an ultraviolet absorber, and inorganic particles. The ultraviolet absorber and the inorganic particles may be provided by being dispersed in the base resin. The base resin may be an acrylate-based resin, for example, urethane acrylate. However, embodiments are not limited thereto, and a base resin that is optically clear and capable of dispersing the ultraviolet absorber and the inorganic particles may be used for the protective layer PY without limitation.

For example, the ultraviolet absorber may include at least one of a benzotriazol-based compound, a benzophenone-based compound, a salicylic acid-based compound, a salicylate-based compound, a cyanoacrylate-based compound, a cinnamate-based compound, an oxanilide-based compound, a polystyrene-based compound, an azomethine-based compound, and a triazine-based compound.

The light-blocking layer LBY may be arranged on a lower surface of the protective layer PY, and the cushion layer CY may be arranged on a lower surface of the light-blocking layer LBY. The light-blocking layer LBY may be a double-sided adhesive arranged between the protective layer PY and the cushion layer CY. In addition, the light-blocking layer LBY may be provided as a black layer to absorb external light. As described above, the light-blocking layer LBY may include various materials capable of absorbing external light.

The cushion layer CY is attached to the lower surface of the light-blocking layer LBY and may protect the display panel 10 from the outside. The cushion layer CY may include an elastic material, and for example, may be provided with a sponge, rubber, or the like.

The heat dissipation layer HSY may be arranged below the cushion layer CY. The heat dissipation layer HSY may include a first heat dissipation layer and a second heat dissipation layer, the first heat dissipation layer including graphite, carbon nanotubes, or the like, and the second heat dissipation layer including a thin film of a metal such as copper, nickel, ferrite, and silver capable of shielding electromagnetic waves and having excellent thermal conductivity.

The panel protection member PB may have an opening PB_OP overlapping the component area CA, and the component COMP may be arranged in the opening PB_OP.

The component COMP is mounted on a package COMPSP, and the package COMPSP may be attached to the lower surface of the substrate 100 by an adhesive member COMPRS. The package COMPSP may include a control circuit electrically connected to the component COMP.

In an embodiment, an optically clear resin OCR may be filled between the component COMP and the lower surface of the substrate 100. The optically clear resin OCR is optically clear and may minimize the loss of light incident on the component COMP.

The adhesive member COMPRS may fix the package COMPSP to the lower surface of the substrate 100. The adhesive member COMPRS may include a resin. In other words, after the resin is arranged to contact each of the package COMPSP and the lower surface of the substrate 100, a curing operation by ultraviolet rays may be performed. The adhesive member COMPRS may include a light-absorbing material.

In some embodiments, as shown in FIGS. 2A to 2C, the component COMP may be spaced apart from the display panel 10. In this case, the component COMP may be attached and fixed to a lower cover of the display device 1, etc.

The component COMP may be an electronic element using light or sound. For example, the electronic element may include a sensor that measures a distance, such as a proximity sensor, a sensor that recognizes a user's body part (e.g., a fingerprint, an iris, a face, etc.), a small lamp that outputs light, or an image sensor (e.g., a camera) that captures an image. An electronic element using light may use light of various wavelength bands, such as visible light, infrared light, or ultraviolet light. An electronic element using sound may use ultrasound or sound of another frequency band.

In some embodiments, the component COMP may include sub-components such as a light emitter and a light receiver. The light emitter and the light receiver may have an integrated structure or a physically separated structure in which a pair of the light emitter and the light receiver constitute one component COMP.

Figure 3:
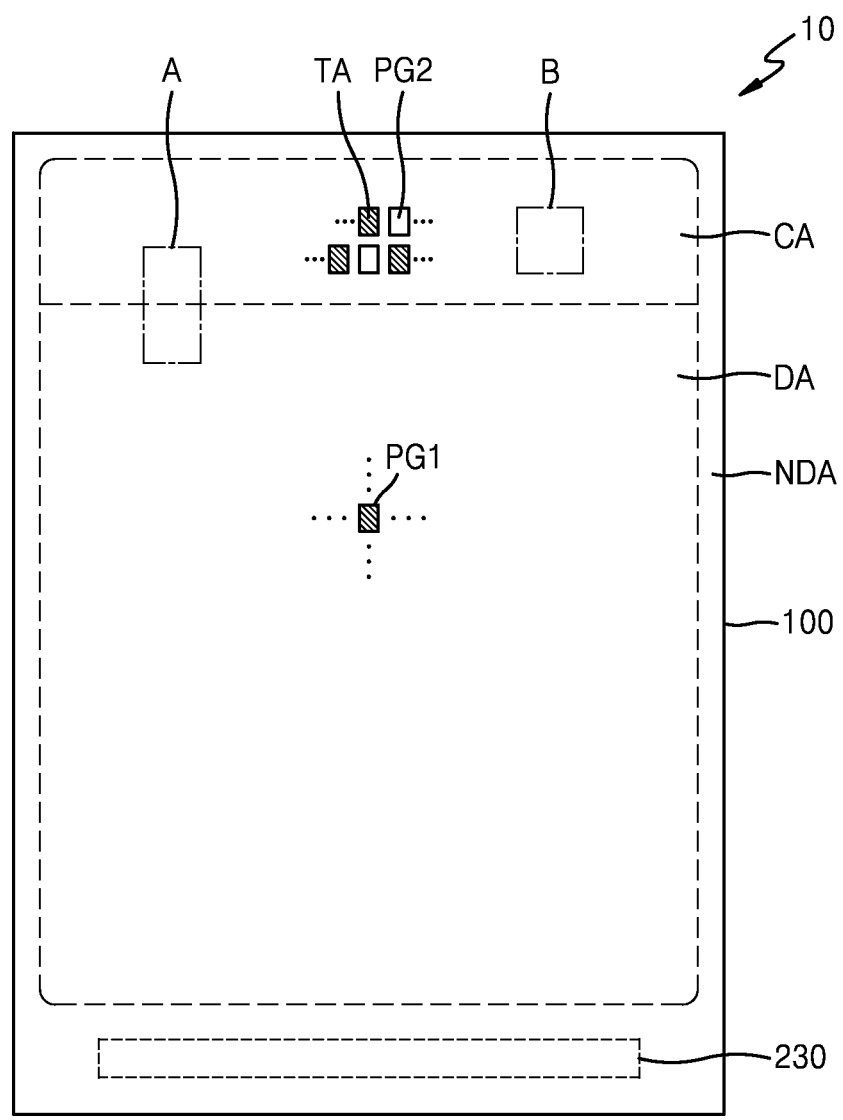
FIG. 3 is a plan view of a display panel according to an embodiment.
Figure 3:
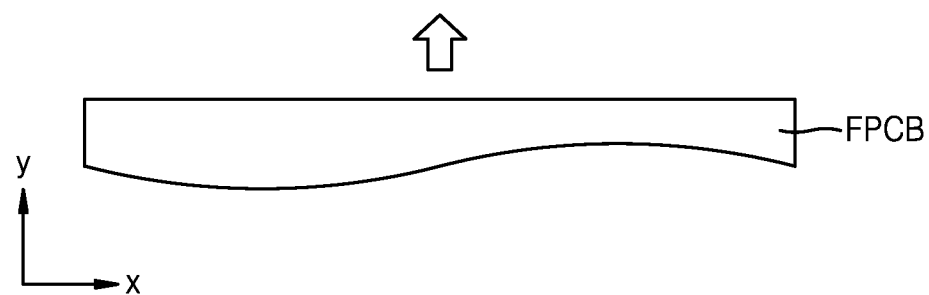

FIG. 3 is a plan view schematically illustrating a display panel 10 according to an embodiment.

Referring to FIG. 3, the display panel 10 may include a substrate 100 and a multi-layer film arranged on the substrate 100. In an embodiment, a display area DA, a component area CA, and a non-display area NDA may be defined on the substrate 100 or the multi-layer film. For example, the display area DA, the component area CA, and the non-display area NDA may be defined on the substrate 100. In other words, the substrate 100 may include the display area DA, the component area CA, and the non-display area NDA. Hereinafter, a detailed description will be given focusing on a case where the substrate 100 includes the display area DA, the component area CA, and the non-display area NDA.

The display panel 10 may include a plurality of pixel groups on the substrate 100. For example, the display panel 10 may include a first pixel group PG1 in the display area DA and a second pixel group PG2 in the component area CA.

In an embodiment, an area of the display area DA may be different from an area of the component area CA. For example, the area of the display area DA may be greater than the area of the component area CA.

The first pixel groups PG1 may be two-dimensionally arranged in the display area DA, and the second pixel groups PG2 may be two-dimensionally arranged in the component area CA. In addition, a transmission area TA may be arranged in the component area CA.

The non-display area NDA may entirely surround the display area DA. A scan driver, a data driver, etc. may be arranged in the non-display area NDA. A pad portion 230 may be arranged in the non-display area NDA. The pad portion 230 may be arranged adjacent to one edge of the substrate 100. The pad portion 230 is exposed without being covered by an insulating layer, and may be electrically connected to a flexible printed circuit board FPCB. The flexible printed circuit board FPCB may electrically connect a controller to the pad portion 230 and may supply signals or power received from the controller. In some embodiments, a data driver may be arranged on the flexible printed circuit board FPCB. To transmit a signal or a voltage from the flexible printed circuit board FPCB to the first pixel group PG1 and the second pixel group PG2, the pad portion 230 may be connected to a plurality of lines.

Each of a first sub-pixel of the first pixel group PG1 and a second sub-pixel of the second pixel group PG2 may emit light of a color using an organic light-emitting diode. For example, each organic light-emitting diode may emit one of red light, green light, and blue light. Each organic light-emitting diode may be connected to a pixel circuit including a thin-film transistor and a storage capacitor.

Figure 4:
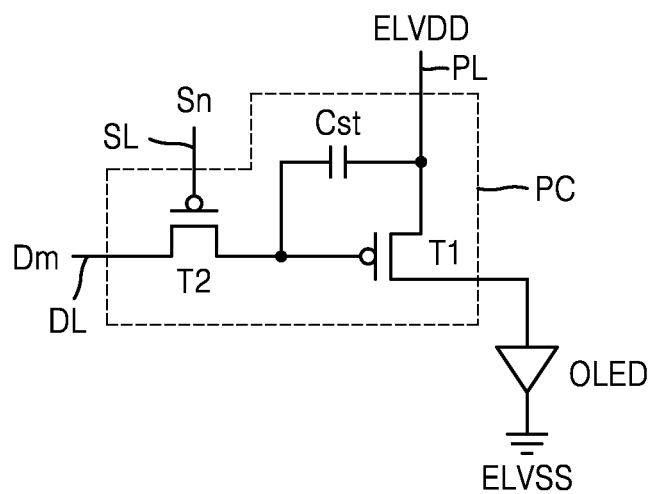
FIG. 4 is an equivalent circuit diagram illustrating a pixel circuit and an organic light-emitting diode connected thereto, according to an embodiment.

FIG. 4 is an equivalent circuit diagram showing a pixel circuit PC and an organic light-emitting diode OLED connected to the pixel circuit PC, according to an embodiment.

Referring to FIG. 4, the organic light-emitting diode OLED may be electrically connected to the pixel circuit PC. The pixel circuit PC may include a first thin-film transistor T1, a second thin-film transistor T2, and a storage capacitor Cst. In an embodiment, the first thin-film transistor T1 may be a driving thin-film transistor. In an embodiment, the second thin-film transistor T2 may be a switching thin-film transistor.

The second thin-film transistor T2 may be connected to a scan line SL and a data line DL and may transfer, according to a switching voltage or a switching signal Sn received via the scan line SL, a data voltage or a data signal Dm received via the data line DL to the first thin-film transistor T1. The storage capacitor Cst is connected to the second thin-film transistor T2 and a driving voltage line PL and may store a voltage corresponding to a voltage difference between the data voltage received via the second thin-film transistor T2 and a first power voltage ELVDD applied to the driving voltage line PL.

The first thin-film transistor T1 is connected to the driving voltage line PL and the storage capacitor Cst and may control a driving current flowing from the driving voltage line PL to the organic light-emitting diode OLED corresponding to a voltage stored in the storage capacitor Cst. The organic light-emitting diode OLED may emit light having a luminance according to the driving current. An opposite electrode (e.g., a cathode) of the organic light-emitting diode OLED may receive a second power voltage ELVSS.

In FIG. 4, the pixel circuit PC includes two thin-film transistors and one storage capacitor, but the number of thin-film transistors or the number of storage capacitors may vary according to the design of the pixel circuit PC. For example, the pixel circuit PC may include three or more thin-film transistors.

Figure 5:
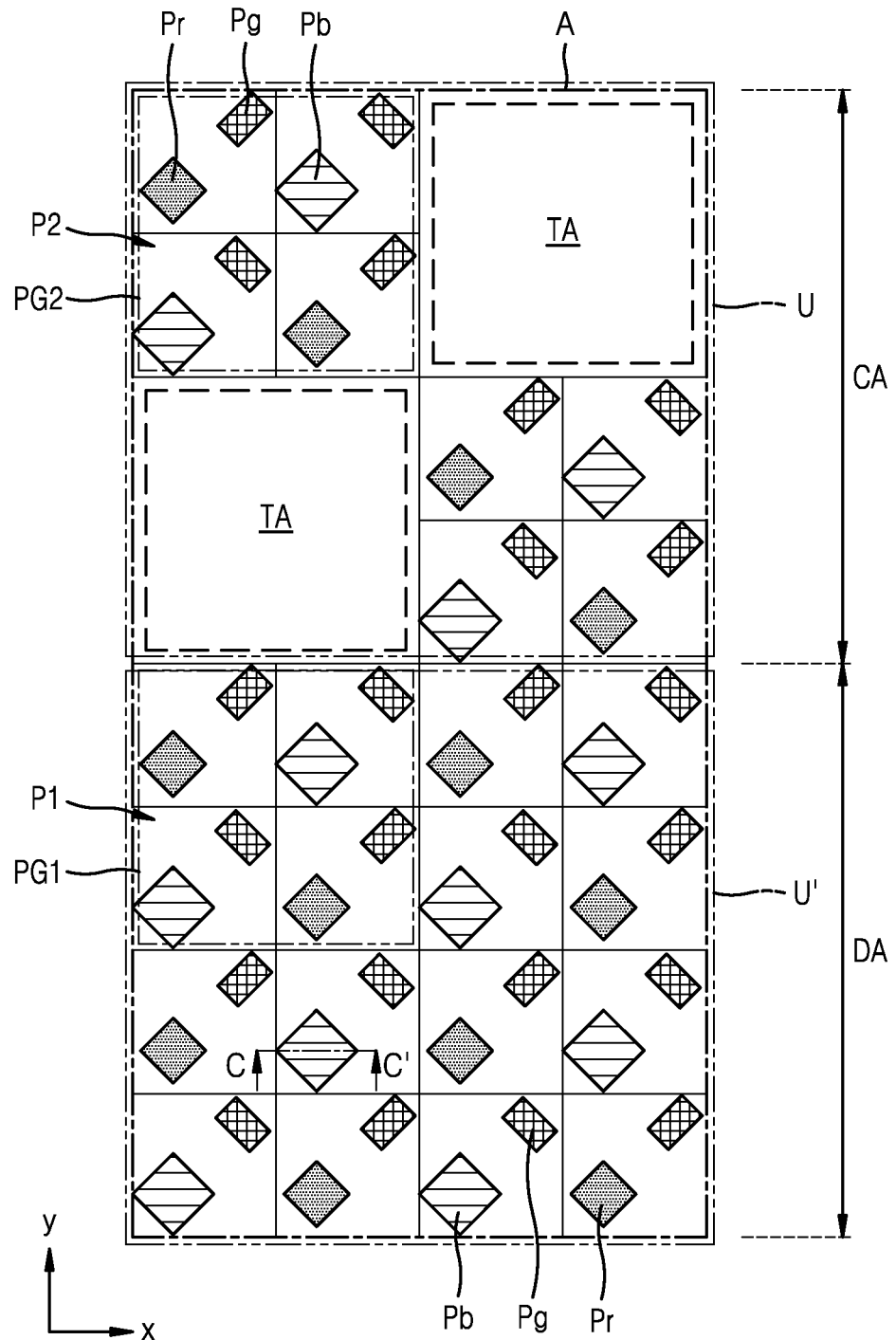
FIG. 5 is an enlarged view of region A in FIG. 3, according to an embodiment.

FIG. 5 is an enlarged view of region A in FIG. 3, according to an embodiment.

Referring to FIG. 5, a substrate may include a display area DA and a component area CA. A first pixel group PG1 may be arranged in the display area DA, and a second pixel group PG2 may be arranged in the component area CA. The component area CA may include a transmission area TA.

The first pixel group PG1 may be defined as a sub-pixel aggregate in which a plurality of first sub-pixels P1 are grouped in a preset unit. In the present disclosure, a sub-pixel denotes an emission area as a smallest unit for implementing an image. When an organic light-emitting diode is used as a display element, the emission area may be defined by an opening in a pixel-defining layer. This will be described below.

One first pixel group PG1 may include 32 first sub-pixels P1 arranged in a PENTILE® structure. For example, one first pixel group PG1 may include eight red sub-pixels Pr, 16 green sub-pixels Pg, and eight blue sub-pixels Pb. In another embodiment, the red sub-pixel Pr, the green sub-pixel Pg, and the blue sub-pixel Pb may be arranged in various ways, such as being arranged in a stripe type in the first pixel group PG1. In an embodiment, each of the blue sub-pixel Pb and the red sub-pixel Pr may be provided larger than the green sub-pixel Pg. In another example, the first pixel group PG1 may further include a white sub-pixel.

The second pixel group PG2 may be defined as a sub-pixel aggregate in which a plurality of second sub-pixels P2 are grouped in a preset unit. For example, eight second sub-pixels P2 arranged in a PENTILE® structure may be included in one second pixel group PG2. In other words, one second pixel group PG2 may include two red sub-pixels Pr, four green sub-pixels Pg, and two blue sub-pixels Pb. In another embodiment, the second pixel group PG2 may be arranged in various ways, such as being arranged in a stripe type. In another example, the second pixel group PG2 may further include a white sub-pixel.

In the component area CA, a plurality of transmission areas TA may be provided. The second pixel group PG2 and the transmission area TA are alternately arranged in a first direction (e.g., an x direction or a −x direction) or a second direction (e.g., a y direction or a −y direction) and for example, may be arranged in a grid shape. In this case, a plurality of second pixel groups PG2 and a plurality of transmission areas TA may be arranged in the component area CA.

In the component area CA, a basic unit U in which a certain number of second pixel groups PG2 and a certain number of transmission areas TA are bound may be repeatedly arranged in the first direction (e.g., the x direction or the −x direction) or the second direction (e.g., the y direction or the −y direction). The basic unit U may include two second pixel groups PG2 and two transmission areas TA therearound, in a quadrilateral shape. The basic unit U is a repetitive structure and does not indicate a disconnected configuration.

A corresponding unit U' provided with a same area as the basic unit U may be configured in the display area DA. In this case, the number of first sub-pixels P1 included in the corresponding unit U' may be greater than the number of second sub-pixels P2 included in the basic unit U. For example, the number of second sub-pixels P2 included in the basic unit U is 16, and the number of first sub-pixels P1 included in the corresponding unit U' is 32, and the number of second sub-pixels P2 and the number of first sub-pixels P1 arranged per the same area may be provided in a ratio of 1:2. In another embodiment, the number of second sub-pixels P2 and the number of first sub-pixels P1 arranged per the same area may be provided in a ratio of 1:4 or 1:16. However, the present disclosure is not limited thereto.

An arrangement structure of the second sub-pixels P2 as shown in FIG. 5 is a PENTILE® structure, and a pixel arrangement structure of the component area CA of which the resolution is one-half (½) of that of the display area DA is referred to as a ½ PENTILE® structure.

In some embodiments, an arrangement structure of the first sub-pixels P1 may be a PENTILE® structure, and an arrangement structure of the second sub-pixels P2 may be an S-stripe structure. As described above, the number and arrangement structure of second sub-pixels P2 included in the second pixel group PG2 may be variously designed according to a resolution of the component area CA.

Figure 6:
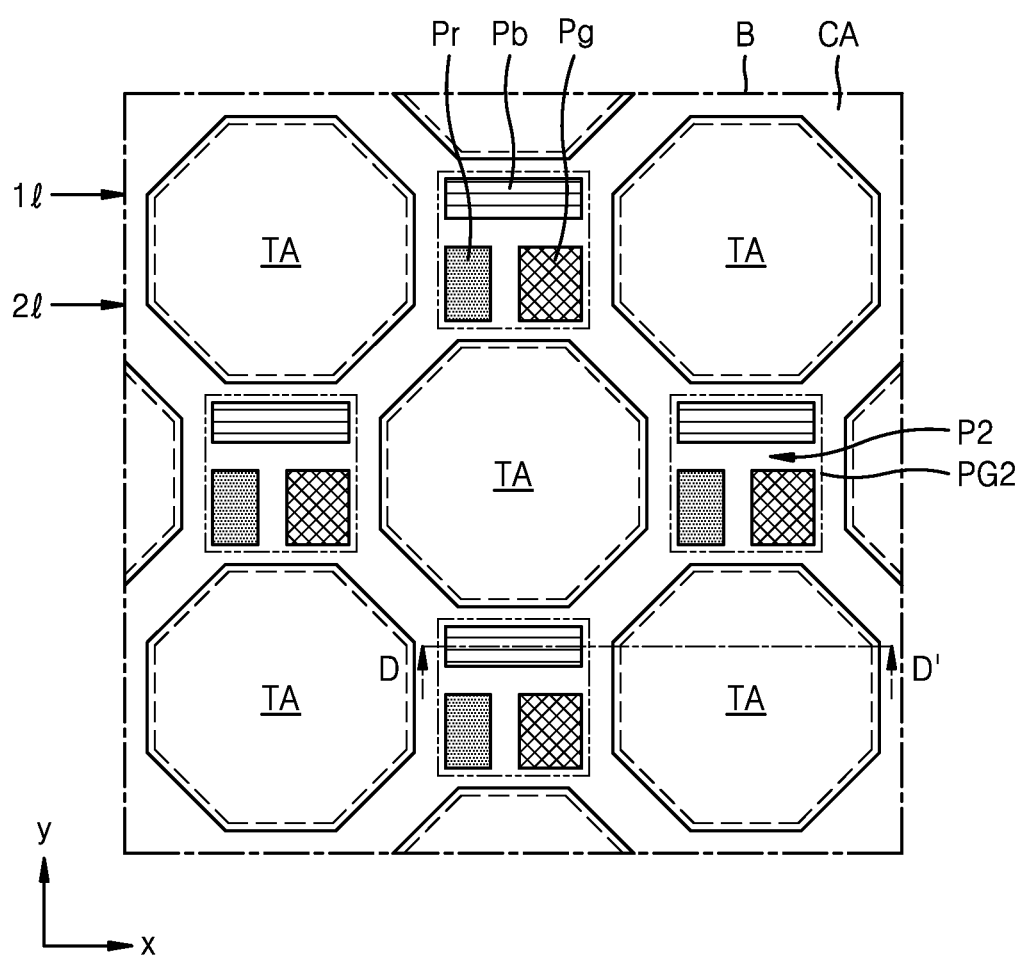
FIG. 6 is an enlarged view of region B in FIG. 3, according to another embodiment.

FIG. 6 is an enlarged view of region B in FIG. 3, according to another embodiment.

Referring to FIG. 6, a substrate may include the component area CA, and the second pixel group PG2 may be arranged in the component area CA. The component area CA may include the transmission area TA.

In the component area CA, a plurality of transmission areas TA may be provided. The second pixel group PG2 and the transmission area TA are alternately arranged in the first direction (e.g., the x direction or the −x direction) or the second direction (e.g., the y direction or the −y direction), and for example, may be arranged in a grid shape. In this case, a plurality of second pixel groups PG2 and a plurality of transmission areas TA may be arranged in the component area CA.

In the component area CA, a basic unit U in which a certain number of second pixel groups PG2 and a certain number of transmission areas TA are bound may be repeatedly arranged in the first direction (e.g., the x direction or the −x direction) or the second direction (e.g., the y direction or the −y direction).

The second pixel group PG2 may be defined as a sub-pixel aggregate in which a plurality of second sub-pixels P2 are grouped in a preset unit. For example, one second pixel group PG2 may be arranged in an S-stripe structure. One second pixel group PG2 may include one red sub-pixel Pr, one green sub-pixel Pg, and one blue sub-pixel Pb.

The blue sub-pixel Pb may be arranged in a first row 11. In a second row 21, the red sub-pixel Pr and the green sub-pixel Pg may be alternately arranged. The red sub-pixel Pr and the green sub-pixel Pg may be arranged in a quadrilateral shape having a long side in the second direction (e.g., the y direction or the −y direction), and the blue sub-pixel Pb may be arranged in a quadrilateral shape having a long side in the first direction (e.g., the x direction or the −x direction). In other words, the red sub-pixel Pr and the green sub-pixel Pg may be arranged such that long sides thereof face each other, and a short side of the red sub-pixel Pr and a short side of the green sub-pixel Pg may face a long side of the blue sub-pixel Pb.

A length of the blue sub-pixel Pb in the first direction (for example, the x direction or the −x direction) may be greater than or equal to a sum of a length of the red sub-pixel Pr in the first direction (for example, the x direction or the −x direction) and a length of the green sub-pixel Pg in the first direction (for example, the x direction or the −x direction). In an embodiment, the length of the red sub-pixel Pr in the first direction (for example, the x direction or the −x direction) may be less than the length of the green sub-pixel Pg in the first direction (for example, the x direction or the −x direction).

Figure 7:
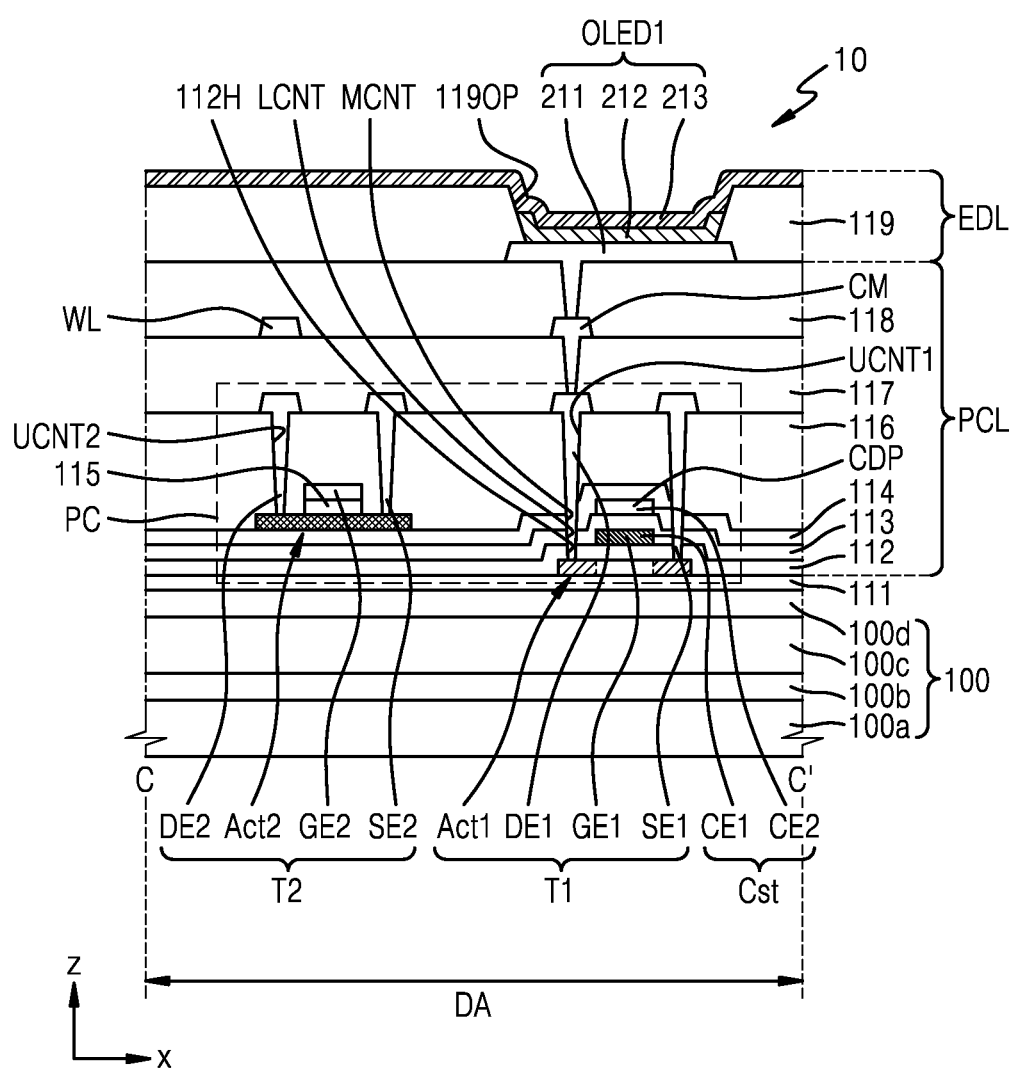
FIG. 7 is a cross-sectional view schematically illustrating a display panel according to an embodiment.

FIG. 7 is a cross-sectional view schematically illustrating a display panel 10 according to an embodiment. FIG. 7 is a cross-sectional view of the display panel 10, taken along line C-C' in FIG. 5, according to an embodiment.

Referring to FIG. 7, the display panel 10 may include a substrate 100, a buffer layer 111, a pixel circuit layer PCL, and a display element layer EDL.

The substrate 100 may include a display area DA and a component area. The substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in the substrate 100. In another embodiment, the substrate 100 may include glass.

At least one of the first base layer 100a and the second base layer 100c may include a polymer resin such as polyethersulfone, polyacrylate, polyetherimide, polyethylene naphthalate, polyethylene terephthalate, polyphenylene sulfide, polyimide, polycarbonate, cellulose triacetate, cellulose acetate propionate, and the like.

The first barrier layer 100b and the second barrier layer 100d are barrier layers that prevent the penetration of foreign substances, and may be a single layer or multiple layers including an inorganic material such as silicon nitride ($SiN_x$), silicon oxide ($SiO_2$), silicon oxynitride (SiON), or the like.

The buffer layer 111 may be arranged on the substrate 100. The buffer layer 111 may include an inorganic insulating material such as silicon nitride ($SiN_x$), silicon oxynitride (SiON), and silicon oxide ($SiO_2$), and may be a single layer or multiple layers including the aforementioned inorganic insulating material.

The pixel circuit layer PCL may be arranged on the buffer layer 111. The pixel circuit layer PCL may include a first gate insulating layer 112, a first insulating layer 113, an intermediate insulating layer 114, a second gate insulating layer 115, a second insulating layer 116, a first organic insulating layer 117, a second organic insulating layer 118, a pixel circuit PC, a connection electrode CM, a line WL, and a conductive pattern CDP. The pixel circuit PC may include a first thin-film transistor T1, a second thin-film transistor T2, and a storage capacitor Cst. The first thin-film transistor T1 may include a first semiconductor layer Act1, a first gate electrode GE1, a first source electrode SE1, and a first drain electrode DEL The second thin-film transistor T2 may include a second semiconductor layer Act2, a second gate electrode GE2, a second source electrode SE2, and a second drain electrode DE2.

The first semiconductor layer Act1 may include a silicon semiconductor. The first semiconductor layer Act1 may include polysilicon. In some embodiments, the first semiconductor layer Act1 may include amorphous silicon. In some embodiments, the first semiconductor layer Act1 may include oxide semiconductor, or may include organic semiconductor or the like. The first semiconductor layer Act1 may include a channel area, a drain area, and a source area, the drain area and the source area being respectively arranged at opposite sides of the channel area. The first gate electrode GE1 may overlap the channel area.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), titanium (Ti), or the like, and may be a single layer or multiple layers including the above material.

The first gate insulating layer 112 may be arranged between the first semiconductor layer Act1 and the first gate electrode GE1. Thus, the first semiconductor layer Act1 may be insulated from the first gate electrode GE1. The first gate insulating layer 112 may include an inorganic insulating layer such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

The first insulating layer 113 may cover the first gate electrode GE1. The first insulating layer 113 may be arranged on the first gate electrode GE1. Similar to the first gate insulating layer 112, the first insulating layer 113 may include an inorganic insulating layer such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like.

The conductive pattern CDP may be arranged on the first insulating layer 113. In an embodiment, the conductive pattern CDP may be arranged between the first insulating layer 113 and the intermediate insulating layer 114. In an embodiment, the conductive pattern CDP may overlap the first gate electrode GE1 therebelow. In this case, the first gate electrode GE1 of the first thin-film transistor T1 and the conductive pattern CDP overlapping each other with the first insulating layer 113 therebetween may form the storage capacitor Cst. In other words, the first gate electrode GE1 of the first thin-film transistor T1 may function as a lower electrode CE1 of the storage capacitor Cst. The conductive pattern CDP may function as an upper electrode CE2 of the storage capacitor Cst.

As described above, the storage capacitor Cst and the first thin-film transistor T1 may overlap each other. In some embodiments, the storage capacitor Cst may be formed so as not to overlap the first thin-film transistor T1.

The conductive pattern CDP may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), or copper (Cu), and may be a single layer or multiple layers including the above-described materials.

The intermediate insulating layer 114 may cover the conductive pattern CDP. The intermediate insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The intermediate insulating layer 114 may be a single layer or multiple layers including the above-described inorganic insulating material.

The second semiconductor layer Act2 may be arranged on the first insulating layer 113. In an embodiment, the second semiconductor layer Act2 may be arranged on the intermediate insulating layer 114. In an embodiment, the second semiconductor layer Act2 may include a channel area, a source area, and a drain area, the source area and the drain area being respectively arranged at opposite sides of the channel area. The second semiconductor layer Act2 may include silicon semiconductor. In some embodiments, the second semiconductor layer Act2 may include a Zn oxide-based material such as Zn oxide, In—Zn oxide, and Ga—In—Zn oxide. In some embodiments, the second semiconductor layer Act2 may include In—Ga—Zn—O (IGZO), In—Sn—Zn—O (ITZO), or In—Ga—Sn—Zn—O (IGTZO) semiconductor, in which a metal such as indium (In), gallium (Ga), or stannum (Sn) is included in ZnO.

The source area and the drain area of the second semiconductor layer Act2 may be formed by adjusting a carrier concentration of the oxide semiconductor to make the oxide semiconductor conductive. For example, the source area and the drain area of the second semiconductor layer Act2 may be formed by increasing the carrier concentration through plasma treatment using a hydrogen-based gas, a fluorine-based gas, or a combination thereof on the oxide semiconductor.

The second gate electrode GE2 may overlap the second semiconductor layer Act2. The second gate electrode GE2 may overlap the channel area of the second semiconductor layer Act2. The second gate insulating layer 115 may be arranged between the second gate electrode GE2 and the second semiconductor layer Act2. Thus, the second gate electrode GE2 may be insulated from the second semiconductor layer Act2. In FIG. 7, the second gate insulating layer 115 is patterned according to a shape of the second gate electrode GE2, but in another embodiment, the second gate insulating layer 115 may be entirely arranged on the substrate 100.

The second insulating layer 116 may cover the second gate electrode GE2. The second insulating layer 116 may be arranged on the second semiconductor layer Act2, the second gate electrode GE2, and the intermediate insulating layer 114. The second insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The second insulating layer 116 may be a single layer or multiple layers including the inorganic insulating material described above.

The first source electrode SE1 and the first drain electrode DE1 may be arranged on the second insulating layer 116. The first source electrode SE1 and the first drain electrode DE1 may be connected to the first semiconductor layer Act1. The first source electrode SE1 and the first drain electrode DE1 may be connected to the first semiconductor layer Act1 through a contact hole of insulating layers. For example, the first gate insulating layer 112 may have a lower hole 112H. The first insulating layer 113 may include a lower contact hole LCNT. The intermediate insulating layer 114 may have an intermediate contact hole MCNT. The second insulating layer 116 may include a first upper contact hole UCNT1. The lower hole 112H, the lower contact hole LCNT, the intermediate contact hole MCNT, and the first upper contact hole UCNT1 may overlap each other.

The first source electrode SE1 and the first drain electrode DE1 may be connected to the first semiconductor layer Act1 through the lower hole 112H, the lower contact hole LCNT, the intermediate contact hole MCNT, and the first upper contact hole UCNT1. In other words, the first thin-film transistor T1 may include any one of the first source electrode SE1 and the first drain electrode DE1 arranged on the second insulating layer 116 and electrically connected to the first semiconductor layer Act1 through the lower contact hole LCNT, the intermediate contact hole MCNT, and the first upper contact hole UCNT1.

The second source electrode SE2 and the second drain electrode DE2 may be arranged on the second insulating layer 116. The second source electrode SE2 and the second drain electrode DE2 may be electrically connected to the second semiconductor layer Act2. The second source electrode SE2 and the second drain electrode DE2 may be electrically connected to the second semiconductor layer Act2 through a second upper contact hole UCNT2 of the second insulating layer 116. In other words, the second thin-film transistor T2 may include any one of the second source electrode SE2 and the second drain electrode DE2 arranged on the second insulating layer 116 and electrically connected to the second semiconductor layer Act2.

Each of the first source electrode SE1, the first drain electrode DE1, the second source electrode SE2, and the second drain electrode DE2 may include a material having good conductivity. Each of the first source electrode SE1, the first drain electrode DE1, the second source electrode SE2, and the second drain electrode DE2 may include a conductive material including molybdenum (Mo), aluminum (Al), copper (Cu), titanium (Ti), etc., and may include multiple layers or a single layer including the above-described material. In an embodiment, each of the first source electrode SE1, the first drain electrode DE1, the second source electrode SE2, and the second drain electrode DE2 may have a multi-layer structure of a Ti layer, an Al layer, and another Ti layer.

Because the first thin-film transistor T1 having the first semiconductor layer Act1 including a silicon semiconductor is highly reliable, it may be employed as a driving thin-film transistor to implement the display panel 10 of high-display quality.

Because an oxide-based semiconductor has a high carrier mobility and a low leakage current, even if a driving time is long, a voltage drop may not be large. In other words, because a color change of an image according to a voltage drop is not large during a low-frequency driving, a display device may be driven at low frequencies. Because the oxide semiconductor described above has an advantage of a small leakage current, the oxide semiconductor may be employed in at least one of other thin-film transistors than the driving thin-film transistor so that power consumption may be reduced and a leakage current may be prevented. For example, the second thin-film transistor T2 may include the second semiconductor layer Act2 that includes oxide semiconductor.

The first organic insulating layer 117 may cover the first source electrode SE1, the first drain electrode DE1, the second source electrode SE2, and the second drain electrode DE2. The first organic insulating layer 117 may include an organic material. For example, the first organic insulating layer 117 may include an organic insulating material including a general-purpose polymer such as poly(methyl methacrylate) (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof.

The connection electrode CM and the line WL may be arranged on the first organic insulating layer 117. In this case, the connection electrode CM may be connected to the first drain electrode DE1 or the first source electrode SE1 through a contact hole of the first organic insulating layer 117. In some embodiments, the line WL may also be arranged between the second insulating layer 116 and the first organic insulating layer 117.

Each of the connection electrode CM and the line WL may include a material with good conductivity. Each of the connection electrode CM and the line WL may include a conductive material including molybdenum (Mo), aluminum (Al), copper (Cu), titanium (Ti), etc., and may include multiple layers or a single layer including the above-described material. In an embodiment, each of the connection electrode CM and the line WL may have a multi-layer structure of a Ti layer, an Al layer, and another Ti layer.

The second organic insulating layer 118 may cover the connection electrode CM and the line WL. The second organic insulating layer 118 may include an organic material. For example, the second organic insulating layer 118 may include an organic insulating material including a general-purpose polymer such as poly(methyl methacrylate) (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof.

The display element layer EDL may be arranged on the pixel circuit layer PCL. The display element layer EDL may include a display element, for example, an organic light-emitting diode. A first organic light-emitting diode OLED1 may be arranged in the display area DA. The first organic light-emitting diode OLED1 may overlap the display area DA. The first organic light-emitting diode OLED1 may include a pixel electrode 211, an emission layer 212, and an opposite electrode 213.

The pixel electrode 211 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or any compounds thereof. In another embodiment, the pixel electrode 211 may further include a layer including ITO, IZO, ZnO, or $In_2O_3$ on/under the reflective layer.

A pixel-defining layer 119 having an opening 1190P through which a central portion of the pixel electrode 211 is exposed may be arranged on the pixel electrode 211. The pixel-defining layer 119 may include an organic insulating material or an inorganic insulating material. The opening 1190P of the pixel-defining layer 119 may define an emission area of light emitted from the first organic light-emitting diode OLED1.

The emission layer 212 may be arranged in the opening 1190P of the pixel-defining layer 119. The emission layer 212 may include a polymer or low-molecular-weight organic material that emits light of a color.

Although not shown, a first functional layer and a second functional layer may be arranged below and above the emission layer 212, respectively. For example, the first functional layer may include a hole transport layer (HTL), or may include an HTL and a hole injection layer (HIL). The second functional layer is an element arranged on the emission layer 212, and is optional. The second functional layer may include an electron transport layer (ETL) or an electron injection layer (EIL). Like the opposite electrode 213 to be described later below, the first functional layer or the second functional layer may be common layers that entirely cover the substrate 100.

The opposite electrode 213 may include a conductive material having a low work function. For example, the opposite electrode 213 may include a (semi-) transparent layer including Ag, Mg, Al, Pt, Pd, Au, Ni, Nd, Jr, Cr, Li, Ca, or any alloys thereof. In some embodiments, the opposite electrode 213 may further include a layer including ITO, IZO, ZnO, or $In_2O_3$ on the (semi-) transparent layer including the above material.

In some embodiments, a capping layer (not shown) may be further arranged on the opposite electrode 213. The capping layer may include lithium fluoride (LiF), an inorganic material, or an organic material. In addition, in an embodiment, a sealing member, a touch screen layer, an optical functional layer, and the like may be arranged on the opposite electrode 213.

Figure 8:
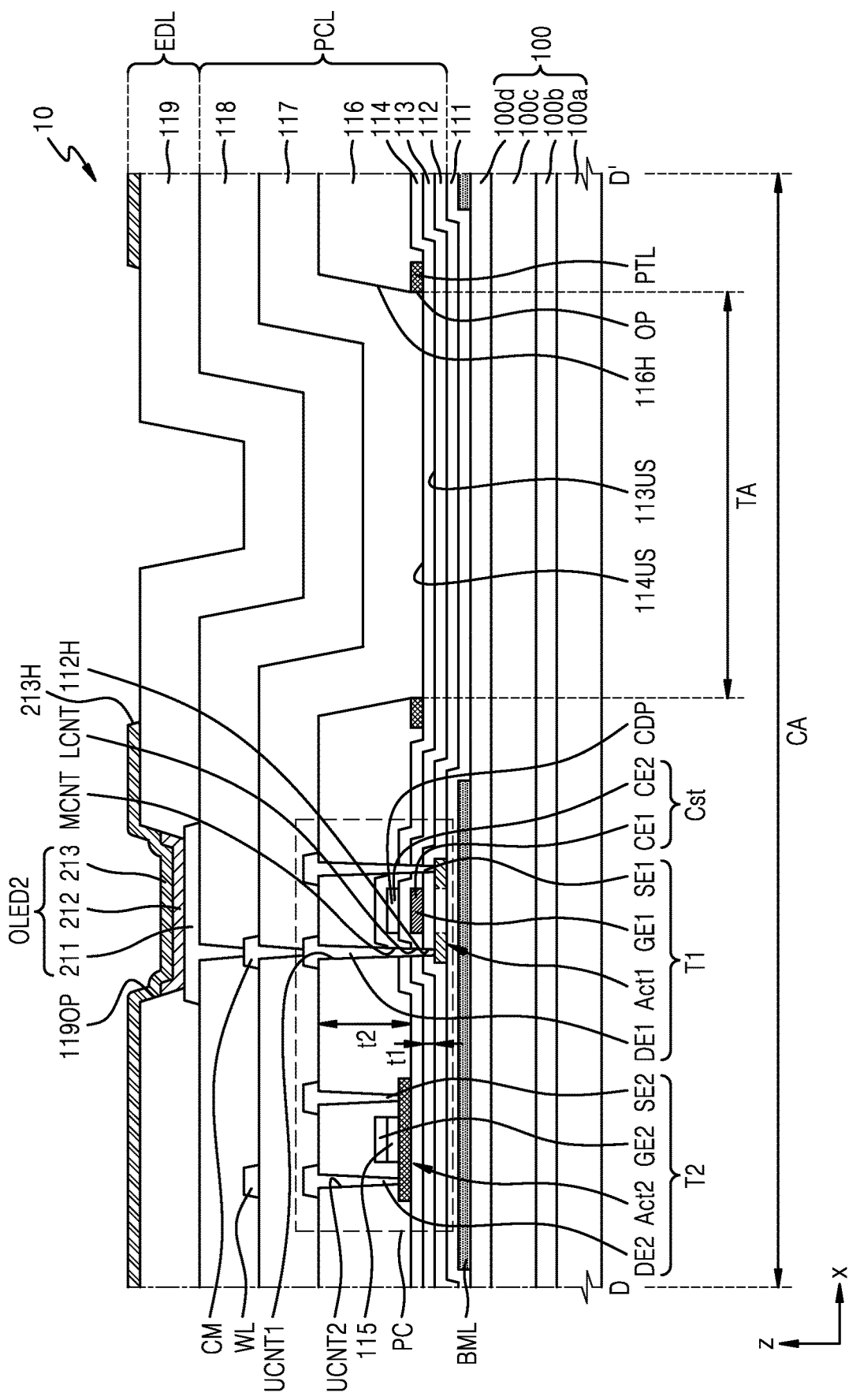
FIG. 8 is a cross-sectional view schematically illustrating a display panel according to an embodiment.

FIG. 8 is a cross-sectional view schematically illustrating a display panel 10 according to an embodiment. FIG. 8 is a cross-sectional view of the display panel in FIG. 6, taken along line D-D', according to an embodiment. In FIG. 8, the same reference symbols as those of FIG. 7 denote the same, and redundant descriptions thereof will be omitted.

Referring to FIG. 8, the display panel 10 may include a substrate 100, a bottom metal layer BML, a buffer layer 111, a pixel circuit layer PCL, and a display element layer EDL.

The substrate 100 may include a display area and a component area CA. The component area CA may include a transmission area TA.

The buffer layer 111 may be arranged on the substrate 100, and the pixel circuit layer PCL may be arranged on the buffer layer 111. The pixel circuit layer PCL may include a first gate insulating layer 112, a first insulating layer 113, an intermediate insulating layer 114, a second gate insulating layer 115, a second insulating layer 116, a first organic insulating layer 117, a second organic insulating layer 118, a pixel circuit PC, a pattern layer PTL, a connection electrode CM, a line WL, and a conductive pattern CDP.

The bottom metal layer BML may be arranged in the component area CA. The bottom metal layer BML may be spaced apart from the transmission area TA. In an embodiment, a plurality of bottom metal layers BML may be provided in the component area CA, and the plurality of bottom metal layers BML may be spaced apart from each other. In this case, the transmission area TA may not overlap the plurality of bottom metal layers BML. In another embodiment, the bottom metal layer BML may include a plurality of holes overlapping the component area CA. In this case, the plurality of holes may overlap the transmission area TA.

The bottom metal layer BML may be arranged between the substrate 100 and a first semiconductor layer Act1. In an embodiment, the bottom metal layer BML may be arranged between the substrate 100 and the buffer layer 111. In another embodiment, the buffer layer 111 may include a first buffer layer and a second buffer layer on the first buffer layer, and the bottom metal layer BML may be arranged between the first buffer layer and the second buffer layer. In another embodiment, the bottom metal layer BML may be inserted into the substrate 100.

The bottom metal layer BML may overlap at least one of a first thin-film transistor T1 and a second thin-film transistor T2. The bottom metal layer BML is arranged under at least one of the first thin-film transistor T1 and the second thin-film transistor T2 and may prevent or reduce the deterioration of characteristics of at least one of the first thin-film transistor T1 and the second thin-film transistor T2 by light emitted from a component or the like. In addition, the bottom metal layer BML may prevent or reduce light emitted from the component or the like or traveling toward the component from being diffracted through a narrow gap between lines connected to the pixel circuit PC.

In an embodiment, the bottom metal layer BML may receive a constant voltage or a signal. When the bottom metal layer BML receives a constant voltage or a signal, the probability of occurrence of electrostatic discharge may be significantly reduced.

The bottom metal layer BML may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), or copper (Cu). The bottom metal layer BML may include a single layer or multiple layers including the materials described above.

In an embodiment, the buffer layer 111 and the first gate insulating layer 112 may overlap the transmission area TA. The buffer layer 111 and the first gate insulating layer 112 may be continuously arranged in the transmission area TA. An upper surface of the buffer layer 111 and an upper surface of the first gate insulating layer 112 may be mostly flat in the transmission area TA.

The pixel circuit PC may include the first thin-film transistor T1, the second thin-film transistor T2, and a storage capacitor Cst. The first thin-film transistor T1 may include the first semiconductor layer Act1, a first gate electrode GE1, a first source electrode SE1, and a first drain electrode DE1. The second thin-film transistor T2 may include a second semiconductor layer Act2, a second gate electrode GE2, a second source electrode SE2, and a second drain electrode DE2.

In an embodiment, the first semiconductor layer Act1 may include silicon semiconductor, and may be arranged in the component area CA. The first gate electrode GE1 may overlap the first semiconductor layer Act1. The first gate insulating layer 112 is arranged between the first semiconductor layer Act1 and the first gate electrode GE1, and the first semiconductor layer Act1 may be insulated from the first gate electrode GE1.

The first insulating layer 113 may cover the first gate electrode GE1. The first insulating layer 113 may overlap the component area CA. In an embodiment, the first insulating layer 113 may overlap the transmission area TA. The first insulating layer 113 may be continuously arranged in the transmission area TA. In this case, an upper surface 113US of the first insulating layer 113 may be mostly flat in the transmission area TA.

A conductive pattern CDP may be arranged on the first insulating layer 113. In an embodiment, the conductive pattern CDP may be arranged between the first insulating layer 113 and the intermediate insulating layer 114. The intermediate insulating layer 114 may cover the conductive pattern CDP. In an embodiment, the intermediate insulating layer 114 may overlap the transmission area TA. The intermediate insulating layer 114 may be continuously arranged in the transmission area TA. In this case, an upper surface 114US of the intermediate insulating layer 114 may be mostly flat in the transmission area TA.

The second semiconductor layer Act2 may be arranged on the first insulating layer 113. In an embodiment, the second semiconductor layer Act2 may be arranged on the intermediate insulating layer 114. The second semiconductor layer Act2 may be arranged between the intermediate insulating layer 114 and the second insulating layer 116. The second semiconductor layer Act2 may include oxide semiconductor, and may be arranged in the component area CA. The second gate electrode GE2 may overlap the second semiconductor layer Act2. The second gate insulating layer 115 is arranged between the second semiconductor layer Act2 and the second gate electrode GE2, and the second semiconductor layer Act2 may be insulated from the second gate electrode GE2.

The second insulating layer 116 may cover the second gate electrode GE2. In an embodiment, a second thickness t2 of the second insulating layer 116 may be greater than a first thickness t1 of the first insulating layer 113. Here, the second thickness t2 of the second insulating layer 116 may be an average distance between a lower surface of the second insulating layer 116 and an upper surface of the second insulating layer 116. The first thickness t1 of the first insulating layer 113 may be an average distance between the upper surface 113US of the first insulating layer 113 and a lower surface of the first insulating layer 113. The second insulating layer 116 may have a transmission hole 116H overlapping the transmission area TA. The transmission hole 116H may overlap the first insulating layer 113 in the transmission area TA. In an embodiment, the transmission hole 116H may overlap the buffer layer 111, the first gate insulating layer 112, the first insulating layer 113, and the intermediate insulating layer 114.

The transmission hole 116H may expose the upper surface 113US of the first insulating layer 113. In an embodiment, the transmission hole 116H may overlap the upper surface 113US of the first insulating layer 113. In addition, the transmission hole 116H may expose the upper surface 114US of the intermediate insulating layer 114. In an embodiment, the transmission hole 116H may overlap the upper surface 114US of the intermediate insulating layer 114. In the display panel 10 according to an embodiment, the second insulating layer 116 may include the transmission hole 116H through which the upper surface 113US of the first insulating layer 113 or the upper surface 114US of the intermediate insulating layer 114 is exposed. In some embodiments, in the display panel 10 according to an embodiment, the second insulating layer 116 may have the transmission hole 116H that overlaps the upper surface 113US of the first insulating layer 113 and/or the upper surface 114US of the intermediate insulating layer 114. Thus, the light transmittance in the transmission area TA may be improved. For example, in a case where the second thickness t2 of the second insulating layer 116 is greater than the first thickness t1 of the first insulating layer 113, when the second insulating layer 116 has the transmission hole 116H, the transmittance of light passing through the transmission area TA may be improved.

The buffer layer 111, the first gate insulating layer 112, the first insulating layer 113, and the intermediate insulating layer 114 overlapping the transmission area TA may each have a flat upper surface. For example, the upper surface 113US of the first insulating layer 113 and/or the upper surface 114US of the intermediate insulating layer 114 may be mostly flat in the transmission area TA. Thus, the unexpected refraction of light passing through the transmission area TA may be reduced or prevented. In addition, the diffuse reflection of light passing through the transmission area TA may be reduced or prevented. Therefore, an optical function in the transmission area TA together with the transmittance of light passing through the transmission area TA may be improved.

The pattern layer PTL may be arranged in the component area CA. In other words, the pattern layer PTL may overlap the component area CA. The pattern layer PTL may be arranged between the first insulating layer 113 and the second insulating layer 116. In an embodiment, the pattern layer PTL may be arranged between the intermediate insulating layer 114 and the second insulating layer 116.

In an embodiment, the pattern layer PTL may have an opening OP overlapping the transmission hole 116H. The opening OP may overlap the buffer layer 111, the first gate insulating layer 112, the first insulating layer 113, and the intermediate insulating layer 114. The opening OP may expose the upper surface 113US of the first insulating layer 113 and/or the upper surface 114US of the intermediate insulating layer 114. The opening OP may overlap the upper surface 113US of the first insulating layer 113 and/or the upper surface 114US of the intermediate insulating layer 114. The pattern layer PTL may maintain the upper surface 113US of the first insulating layer 113 and/or the upper surface 114US of the intermediate insulating layer 114 mostly flat in the transmission area TA. Thus, the unexpected refraction of light passing through the transmission area TA may be reduced or prevented. In addition, the diffuse reflection of light passing through the transmission area TA may be reduced or prevented.

The pattern layer PTL and the second semiconductor layer Act2 may include a same material. The pattern layer PTL may include a Zn oxide-based material such as Zn oxide, In—Zn oxide, Ga—In—Zn oxide, and the like. In some embodiments, the second semiconductor layer Act2 may include In—Ga—Zn—O (IGZO), In—Sn—Zn—O (ITZO), or In—Ga—Sn—Zn—O (IGTZO) semiconductor, in which a metal such as indium (In), gallium (Ga), or stannum (Sn) is included in ZnO. Thus, the pattern layer PTL may be transparent, and light may pass through the pattern layer PTL.

When forming the transmission hole 116H of the second insulating layer 116, the pattern layer PTL may maintain the upper surface 113US of the first insulating layer 113 and/or the upper surface 114US of the intermediate insulating layer 114 flat. For example, when at least part of the second insulating layer 116 is etched, the pattern layer PTL may prevent or reduce the etching of an insulating layer arranged under the second insulating layer 116. Thus, the upper surface 113US of the first insulating layer 113 and/or the upper surface 114US of the intermediate insulating layer 114 may be kept flat.

The first source electrode SE1 and the first drain electrode DE1 may be arranged on the second insulating layer 116. The first source electrode SE1 and the first drain electrode DE1 may be connected to the first semiconductor layer Act1 through a lower hole 112H, a lower contact hole LCNT, an intermediate contact hole MCNT, and a first upper contact hole UCNT1. In other words, the first thin-film transistor T1 may include any one of the first source electrode SE1 and the first drain electrode DE1 arranged on the second insulating layer 116 and electrically connected to the first semiconductor layer Act1 through the lower contact hole LCNT, the intermediate contact hole MCNT, and the first upper contact hole UCNT1.

The second source electrode SE2 and the second drain electrode DE2 may be arranged on the second insulating layer 116. The second source electrode SE2 and the second drain electrode DE2 may be connected to the second semiconductor layer Act2. The second source electrode SE2 and the second drain electrode DE2 may be connected to the second semiconductor layer Act2 through a second upper contact hole UCNT2 of the second insulating layer 116.

In an embodiment, the transmission hole 116H of the second insulating layer 116 may be formed simultaneously when the first upper contact hole UCNT1 is formed. In another embodiment, the transmission hole 116H of the second insulating layer 116 may be formed simultaneously when the second upper contact hole UCNT2 is formed.

The first organic insulating layer 117 may cover the first source electrode SE1, the first drain electrode DE1, the second source electrode SE2, and the second drain electrode DE2. In an embodiment, the first organic insulating layer 117 may overlap the transmission area TA. In this case, the first organic insulating layer 117 may cover the transmission hole 116H. In another embodiment, the first organic insulating layer 117 may have a transmission hole overlapping the transmission hole 116H.

The connection electrode CM and the line WL may be arranged on the first organic insulating layer 117. The second organic insulating layer 118 may cover the connection electrode CM and the line WL. In an embodiment, the second organic insulating layer 118 may overlap the transmission area TA. In this case, the second organic insulating layer 118 may cover the transmission hole 116H. In another embodiment, the second organic insulating layer 118 may have a transmission hole overlapping the transmission hole 116H.

The display element layer EDL may be arranged on the pixel circuit layer PCL. The display element layer EDL may include a display element, for example, an organic light-emitting diode. A second organic light-emitting diode OLED2 may be arranged in the component area CA. The second organic light-emitting diode OLED2 may overlap the component area CA. The second organic light-emitting diode OLED2 may be spaced apart from the transmission area TA. The second organic light-emitting diode OLED2 may include a pixel electrode 211, an emission layer 212, and an opposite electrode 213.

A pixel-defining layer 119 having an opening 1190P through which a central portion of the pixel electrode 211 is exposed may be arranged on the pixel electrode 211. In an embodiment, the pixel-defining layer 119 may overlap the transmission area TA. In this case, the pixel-defining layer 119 may cover the transmission hole 116H. In another embodiment, the pixel-defining layer 119 may have a transmission hole overlapping the transmission hole 116H.

In an embodiment, the opposite electrode 213 may have an opposite electrode hole 213H overlapping the transmission area TA. The opposite electrode hole 213H may overlap the transmission hole 116H. Thus, the light transmittance of the transmission area TA may be improved.

Figure 9A:
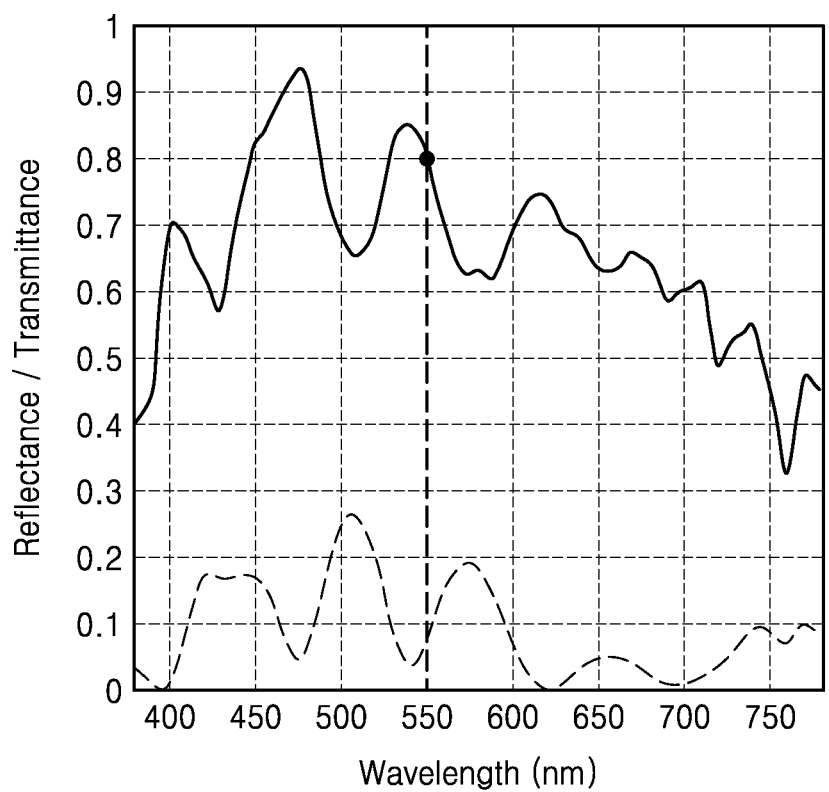
FIG. 9A is a graph showing a light transmittance simulation result according to a Comparative Example.
Figure 9B:
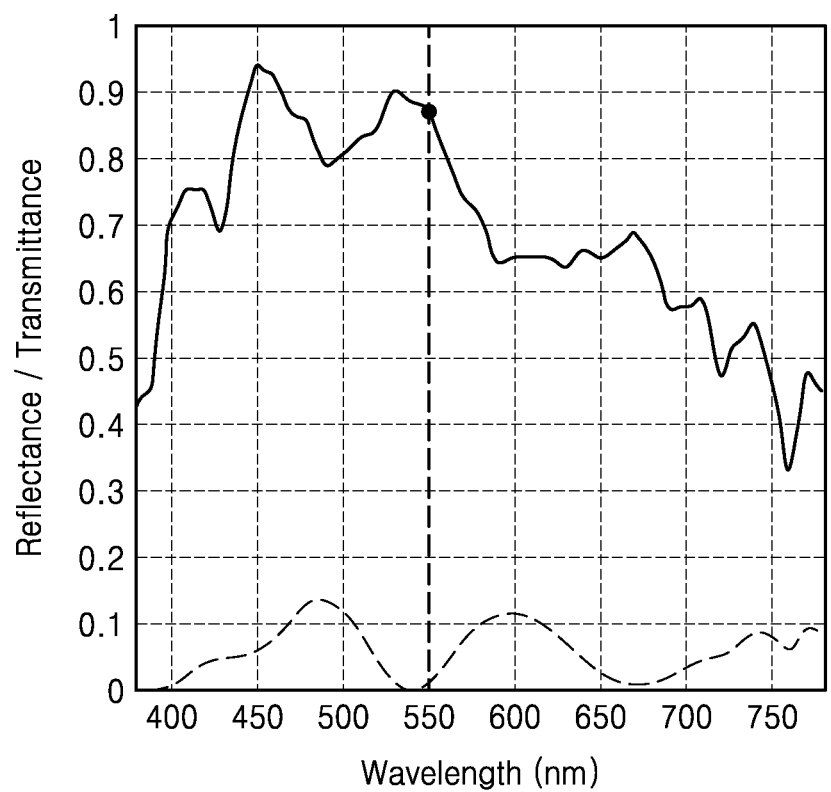
FIG. 9B is a graph showing a light transmittance simulation result according to embodiments of the present disclosure.

FIG. 9A is a graph showing a light transmittance simulation result according to a Comparative Example. FIG. 9B is a graph showing a light transmittance simulation result according to an embodiment of the present disclosure. FIG. 9A is a simulation result of light transmittance when a second insulating layer does not have a transmission hole, and FIG. 9B is a simulation result of light transmittance when the second insulating layer includes a transmission hole.

Referring to FIG. 9A, when the second insulating layer does not have a transmission hole as in the Comparative Example, the transmittance of light having a wavelength of 550 nm is about %. Referring to FIG. 9B, when the second insulating layer has a transmission hole as in embodiments of the present disclosure, the transmittance of light having a wavelength of 550 nm is about 88%. When the second insulating layer has a transmission hole, the transmittance of light having a wavelength of 550 nm is increased by about 8%.

Thus, according to embodiments of the present disclosure, the light transmittance of a transmission area may be improved by having a transmission hole in the second insulating layer.

FIGS. 10A to 10K are cross-sectional views illustrating a method of manufacturing a display device, according to an embodiment. In FIGS. 10A to 10K, the same reference symbols as those of FIG. 8 denote the same, and redundant descriptions thereof will be omitted.

Figure 10A:
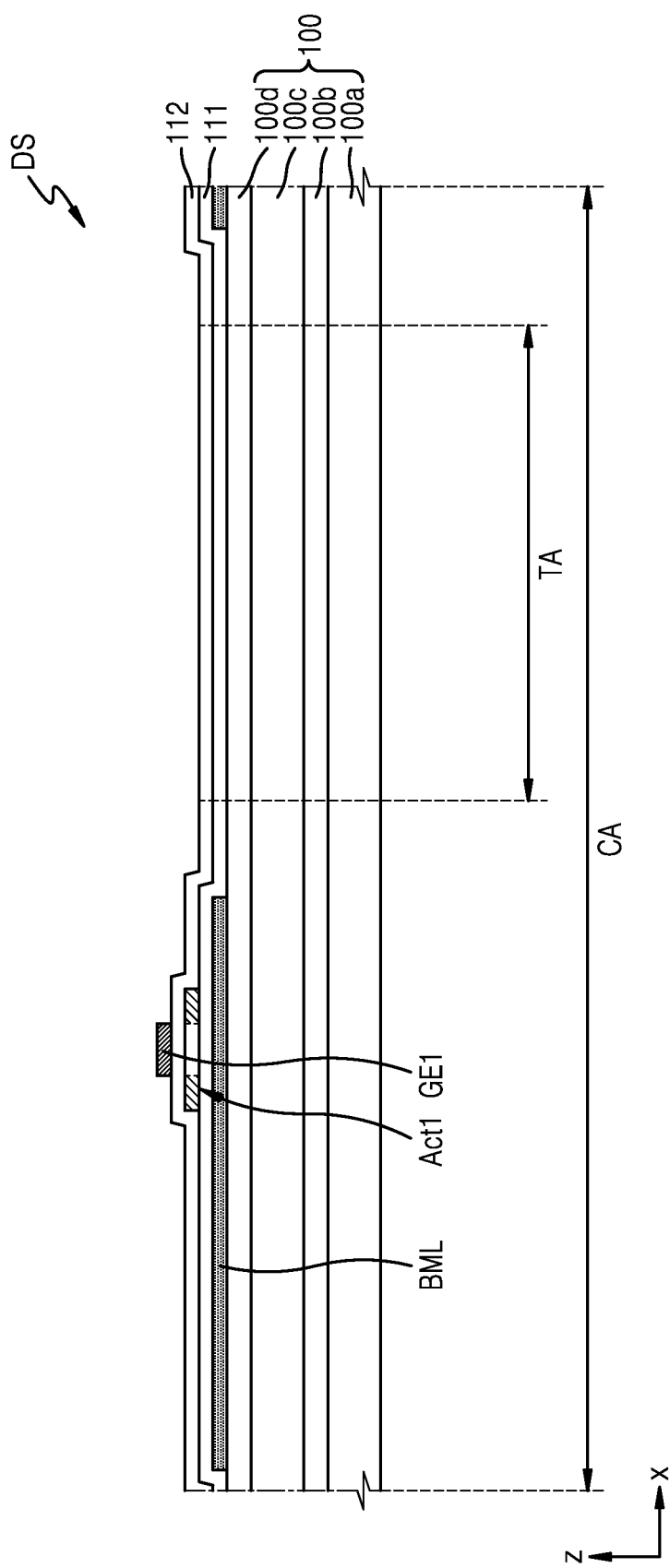

Referring to FIG. 10A, a display substrate DS may be prepared. The display substrate DS may be a display device being manufactured. The display substrate DS may include a substrate 100, a bottom metal layer BML, a buffer layer 111, a first semiconductor layer Act1, a first gate insulating layer 112, and a first gate electrode GE1.

The substrate 100 may include a display area and a component area CA. The component area CA may include a transmission area TA. The bottom metal layer BML may be arranged in the component area CA. The bottom metal layer BML may be spaced apart from the transmission area TA.

In an embodiment, the buffer layer 111 may cover the bottom metal layer BML. In an embodiment, the buffer layer 111 may overlap the transmission area TA. An upper surface of the buffer layer 111 may be mostly flat in the transmission area TA.

The first semiconductor layer Act1 may be arranged on the substrate 100. The first semiconductor layer Act1 may be arranged on the buffer layer 111. In an embodiment, the first semiconductor layer Act1 may overlap the bottom metal layer BML. The first semiconductor layer Act1 may include silicon semiconductor.

The first gate insulating layer 112 may cover the first semiconductor layer Act1. The first gate insulating layer 112 may overlap the transmission area TA. An upper surface of the first gate insulating layer 112 may be mostly flat in the transmission area TA.

The first gate electrode GE1 may overlap the first semiconductor layer Act1. The first gate insulating layer 112 is arranged between the first semiconductor layer Act1 and the first gate electrode GE1, and the first semiconductor layer Act1 may be insulated from the first gate electrode GE1.

Figure 10B:
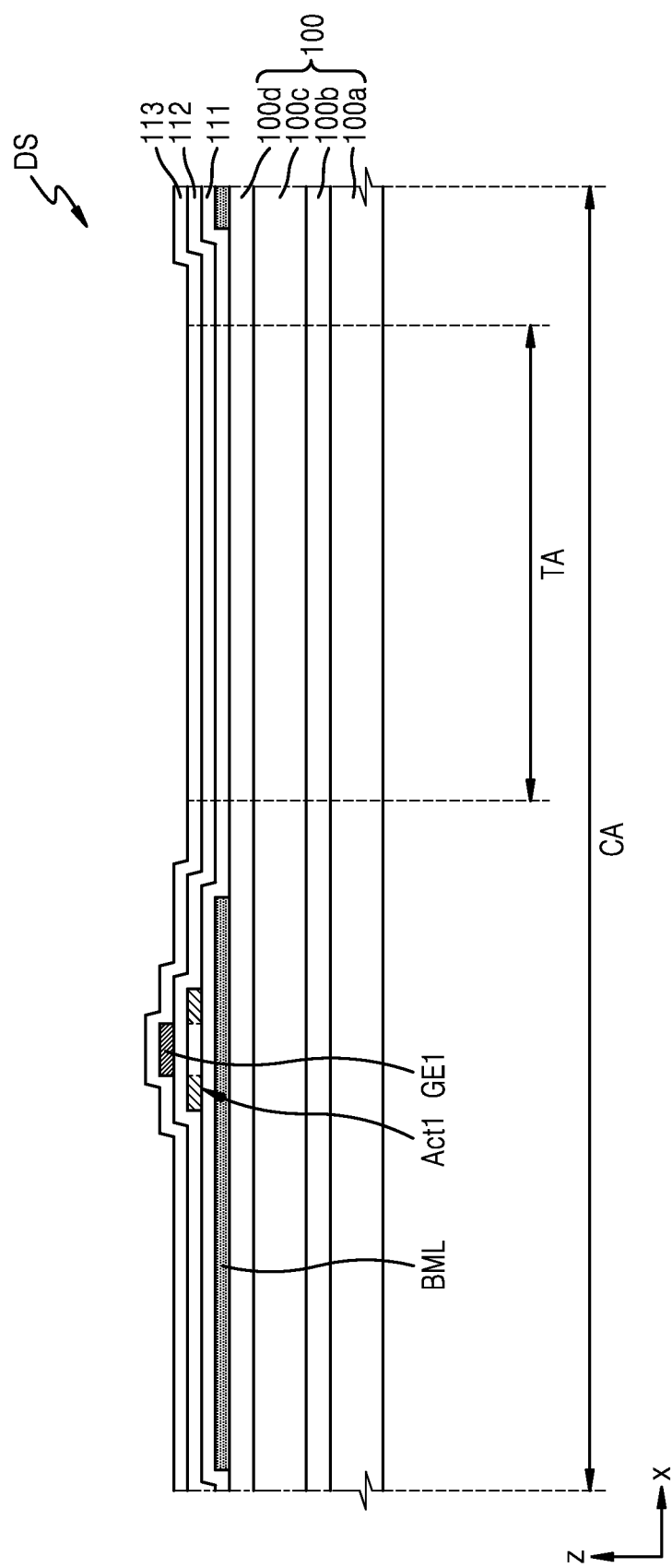

Referring to FIG. 10B, a first insulating layer 113 may be formed. The first insulating layer 113 may cover the first gate electrode GE1. The first insulating layer 113 may overlap the component area CA. In an embodiment, the first insulating layer 113 may overlap the transmission area TA. The first insulating layer 113 may be continuously formed in the transmission area TA. In an embodiment, the first insulating layer 113 may be formed by chemical vapor deposition (CVD). In this case, an upper surface of the first insulating layer 113 may be mostly flat in the transmission area TA.

Figure 10C:
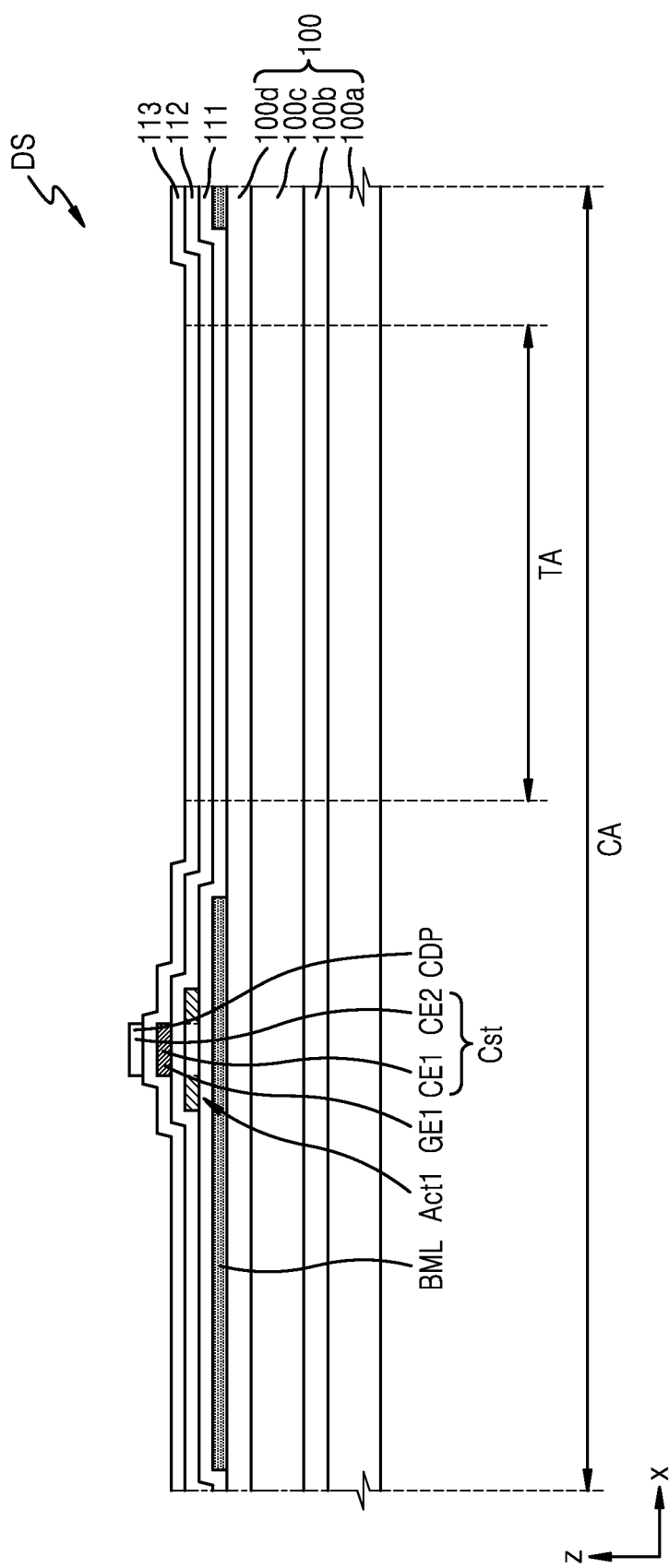

Referring to FIG. 10C, a conductive pattern CDP may be formed. The conductive pattern CDP may be formed on the first insulating layer 113. In an embodiment, the first gate electrode GE1 and the conductive pattern CDP overlapping each other with the first insulating layer 113 therebetween may form a storage capacitor Cst.

Figure 10D:
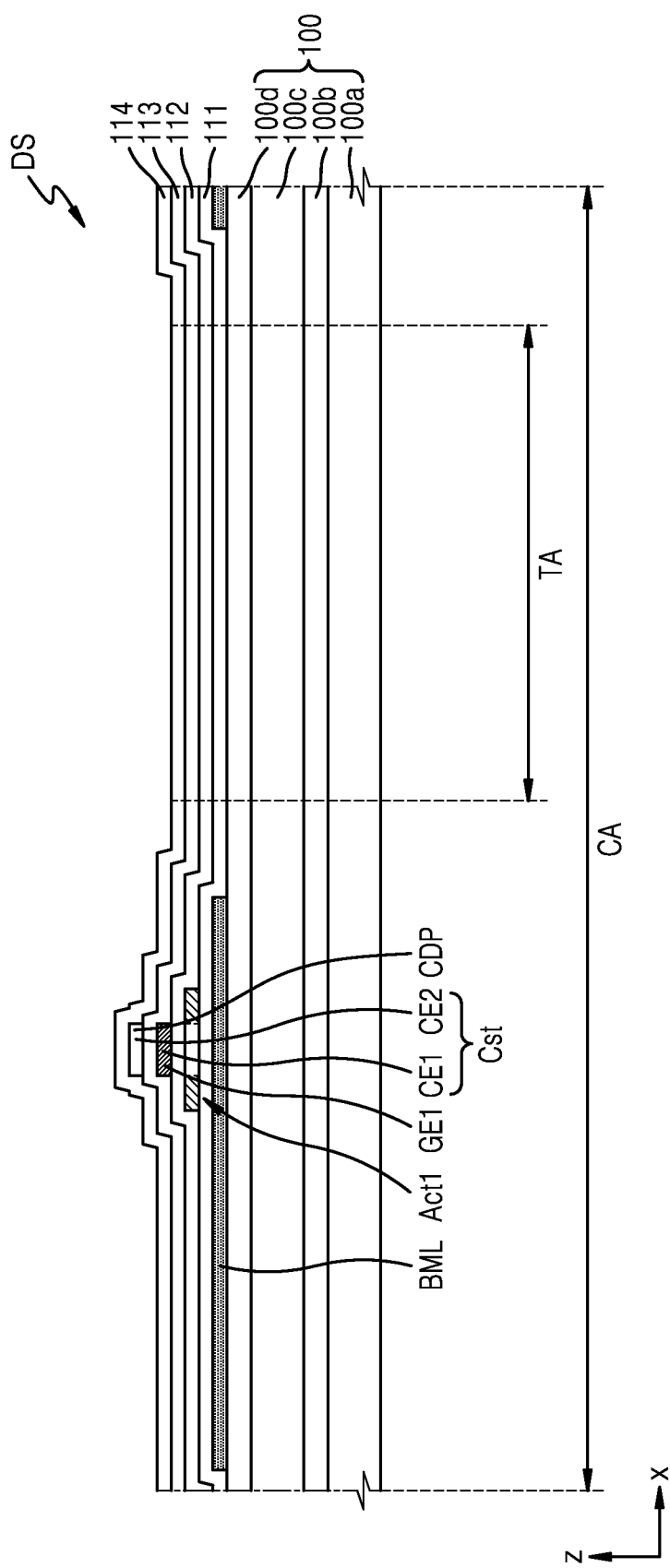

Referring to FIG. 10D, an intermediate insulating layer 114 may be formed. The intermediate insulating layer 114 may cover the conductive pattern CDP. In an embodiment, the intermediate insulating layer 114 may overlap the transmission area TA. The intermediate insulating layer 114 may be continuously formed in the transmission area TA. The intermediate insulating layer 114 may be formed by CVD. In this case, an upper surface of the intermediate insulating layer 114 may be mostly flat in the transmission area TA.

Referring to FIG. 10E, a second semiconductor layer Act2 including oxide semiconductor may be formed in the component area CA. In addition, a pattern layer PTL overlapping the component area CA may be formed. In an embodiment, the pattern layer PTL may overlap the transmission area TA. In an embodiment, the second semiconductor layer Act2 and the pattern layer PTL may be formed on the first insulating layer 113 and/or the intermediate insulating layer 114.

In an embodiment, the second semiconductor layer Act2 may be spaced apart from the pattern layer PTL. In an embodiment, the pattern layer PTL may include oxide semiconductor. In this case, the second semiconductor layer Act2 and the pattern layer PTL may include a same material.

In an embodiment, an oxide semiconductor layer may be entirely formed in the component area CA. In an embodiment, the oxide semiconductor layer may be sputtered and entirely formed in the component area CA. In addition, the oxide semiconductor layer may be patterned to form the second semiconductor layer Act2 and the pattern layer PTL. Thus, the second semiconductor layer Act2 and the pattern layer PTL may be formed simultaneously, and the pattern layer PTL may be formed without adding a mask process.

Each of the second semiconductor layer Act2 and the pattern layer PTL may include a Zn oxide-based material such as Zn oxide, In—Zn oxide, and Ga—In—Zn oxide. In some embodiments, each of the second semiconductor layer Act2 and the pattern layer PTL may include In—Ga—Zn—O (IGZO), In—Sn—Zn—O (ITZO), or In—Ga—Sn—Zn—O (IGTZO) semiconductor, in which a metal such as indium (In), gallium (Ga), or stannum (Sn) is included in ZnO.

Figure 10F:
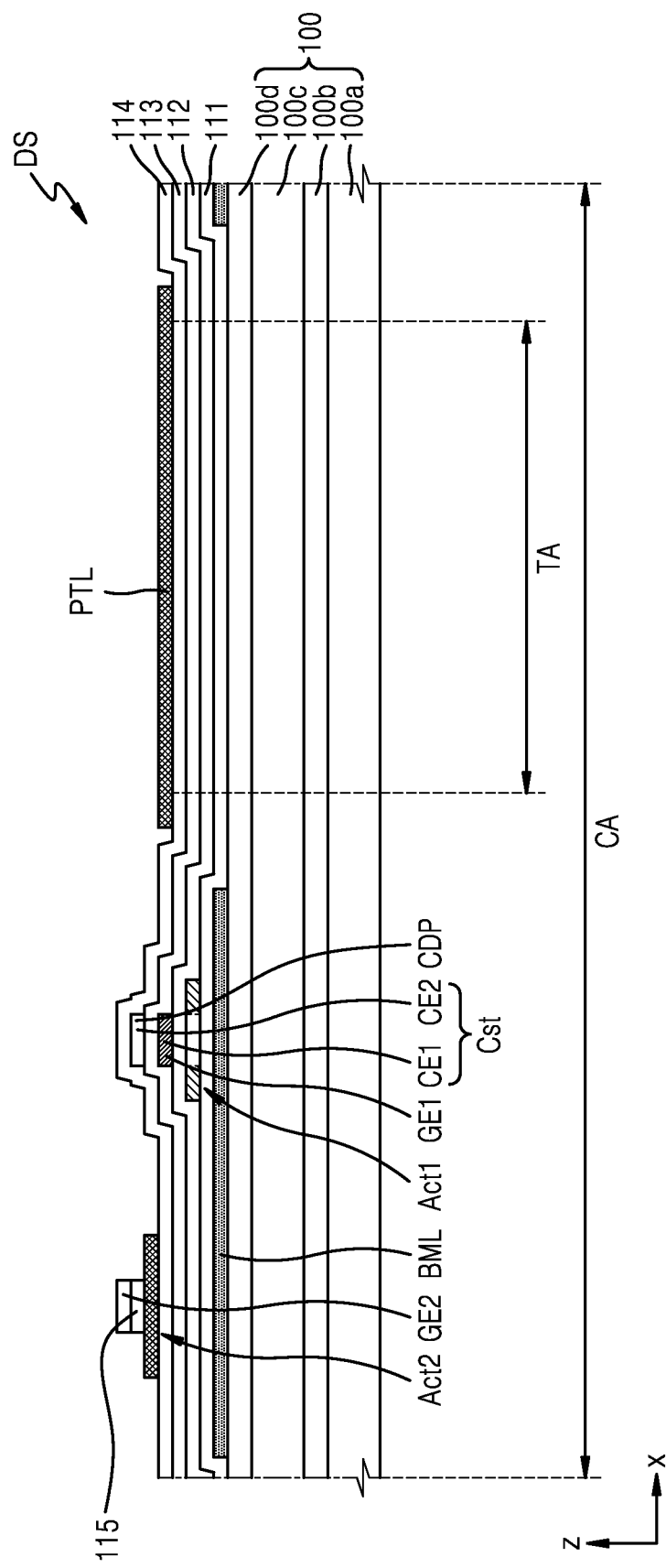

Referring to FIG. 10F, a second gate electrode GE2 and a second gate insulating layer 115 may be formed. The second gate electrode GE2 may overlap the second semiconductor layer Act2. The second gate electrode GE2 may overlap a channel area of the second semiconductor layer Act2. The second gate insulating layer 115 may be arranged between the second gate electrode GE2 and the second semiconductor layer Act2. In an embodiment, the second gate electrode GE2 and the second gate insulating layer 115 may be patterned simultaneously. In another embodiment, the second gate insulating layer 115 may be entirely formed on the substrate 100.

Figure 10G:
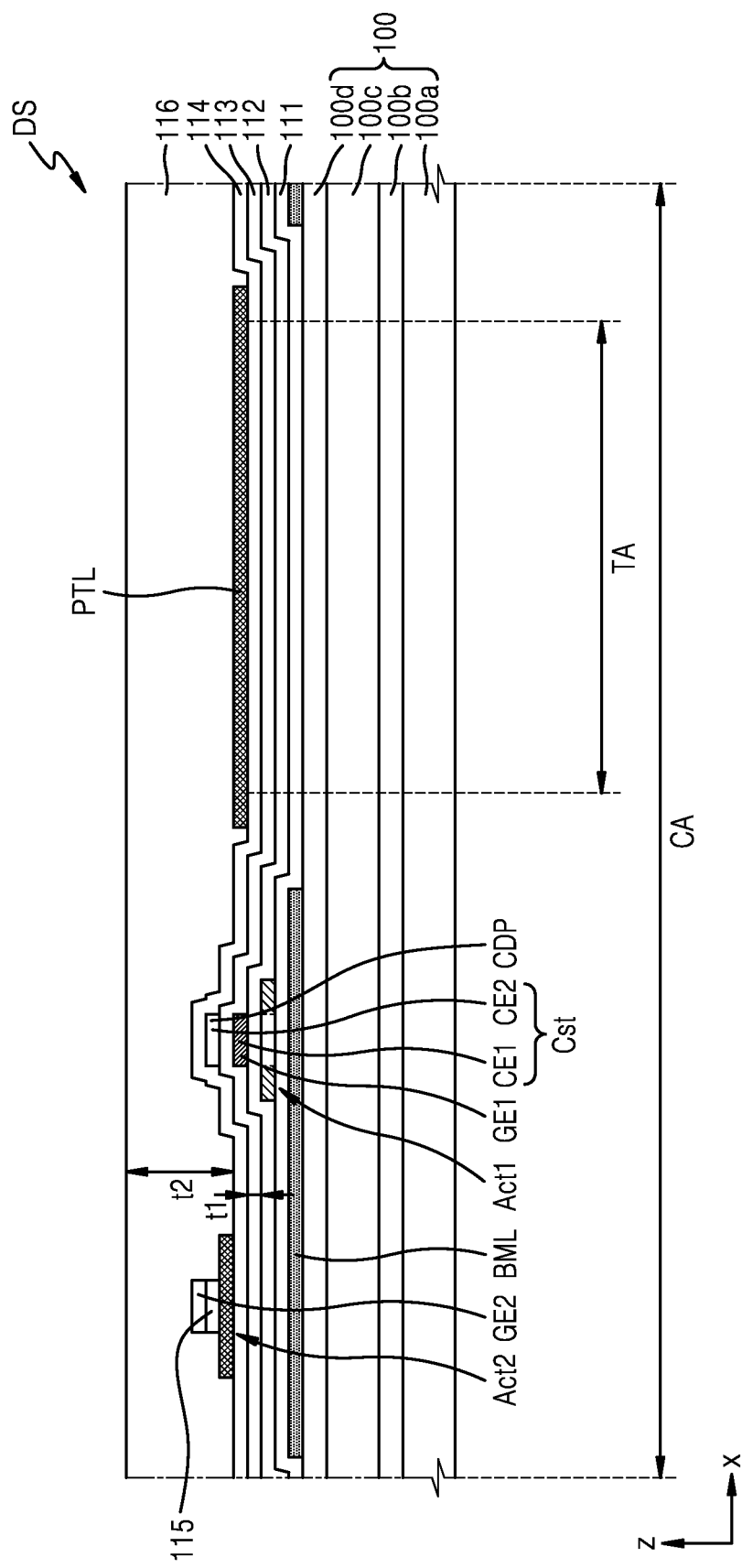

Referring to FIG. 10G, a second insulating layer 116 may be formed. The second insulating layer 116 may cover the second semiconductor layer Act2 and the pattern layer PTL. In an embodiment, the second insulating layer 116 may be formed on the second semiconductor layer Act2, the second gate electrode GE2, and the intermediate insulating layer 114. In an embodiment, a second thickness t2 of the second insulating layer 116 may be greater than a first thickness t1 of the first insulating layer 113.

Figure 10H:
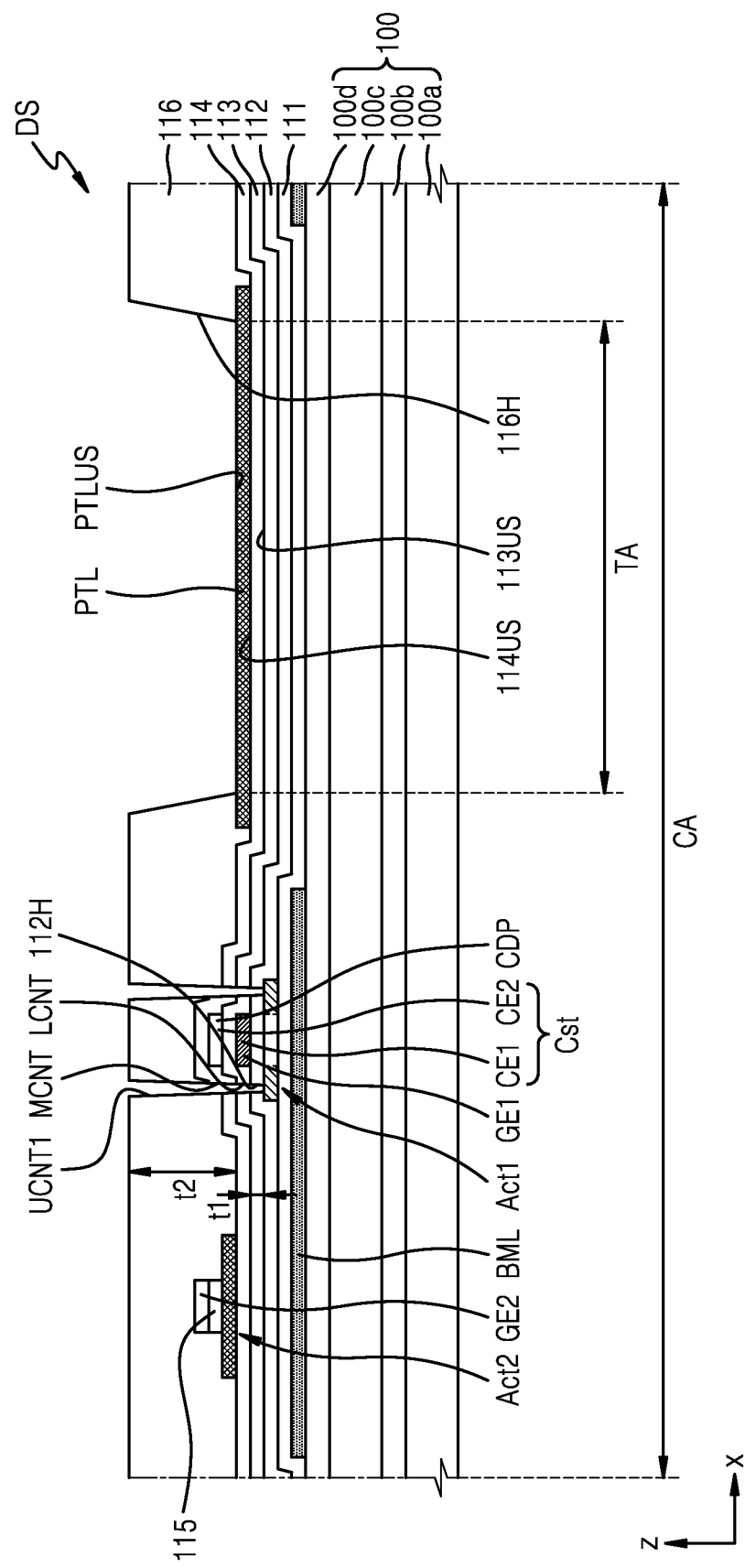

Referring to FIG. 10H, a transmission hole 116H of the second insulating layer 116 overlapping the transmission area TA may be formed. In an embodiment, the second insulating layer 116 may be dry etched, and the transmission hole 116H may be formed. In this case, part of the pattern layer PTL may be exposed. In an embodiment, at least part of an upper surface PTLUS of the pattern layer PTL may be exposed through the transmission hole 116H.

The pattern layer PTL may not be dry etched. In addition, the pattern layer PTL may prevent or reduce at least one of the buffer layer 111, the first gate insulating layer 112, the first insulating layer 113, and the intermediate insulating layer 114 arranged under the pattern layer PTL from being etched. Thus, upper surfaces of the insulating layers arranged under the pattern layer PTL may be kept flat. For example, an upper surface 113US of the first insulating layer 113 or an upper surface 114US of the intermediate insulating layer 114 is not etched and may be kept flat. In an embodiment, the upper surface 113US of the first insulating layer 113 may overlap the transmission hole 116H. In an embodiment, the upper surface 114US of the intermediate insulating layer 114 may overlap the transmission hole 116H.

A lower contact hole LCNT through which at least a portion of the first semiconductor layer Act1 is exposed may be formed in the first insulating layer 113. In addition, a first upper contact hole UCNT1 through which at least a portion of the first semiconductor layer Act1 is exposed may be formed in the second insulating layer 116. In other words, the first gate insulating layer 112, the first insulating layer 113, the intermediate insulating layer 114, and the second insulating layer 116 may be etched, and a lower hole 112H of the first gate insulating layer 112, the lower contact hole LCNT of the first insulating layer 113, an intermediate contact hole MCNT of the intermediate insulating layer 114, and the first upper contact hole UCNT1 of the second insulating layer 116 may be formed. The lower hole 112H, the lower contact hole LCNT, the intermediate contact hole MCNT, and the first upper contact hole UCNT1 may expose at least part of the first semiconductor layer Act1.

In an embodiment, when forming the transmission hole 116H, the lower hole 112H, the lower contact hole LCNT, the intermediate contact hole MCNT, and the first upper contact hole UCNT1 may be formed. Thus, the transmission hole 116H may be formed without an additional mask process.

Figure 10I:
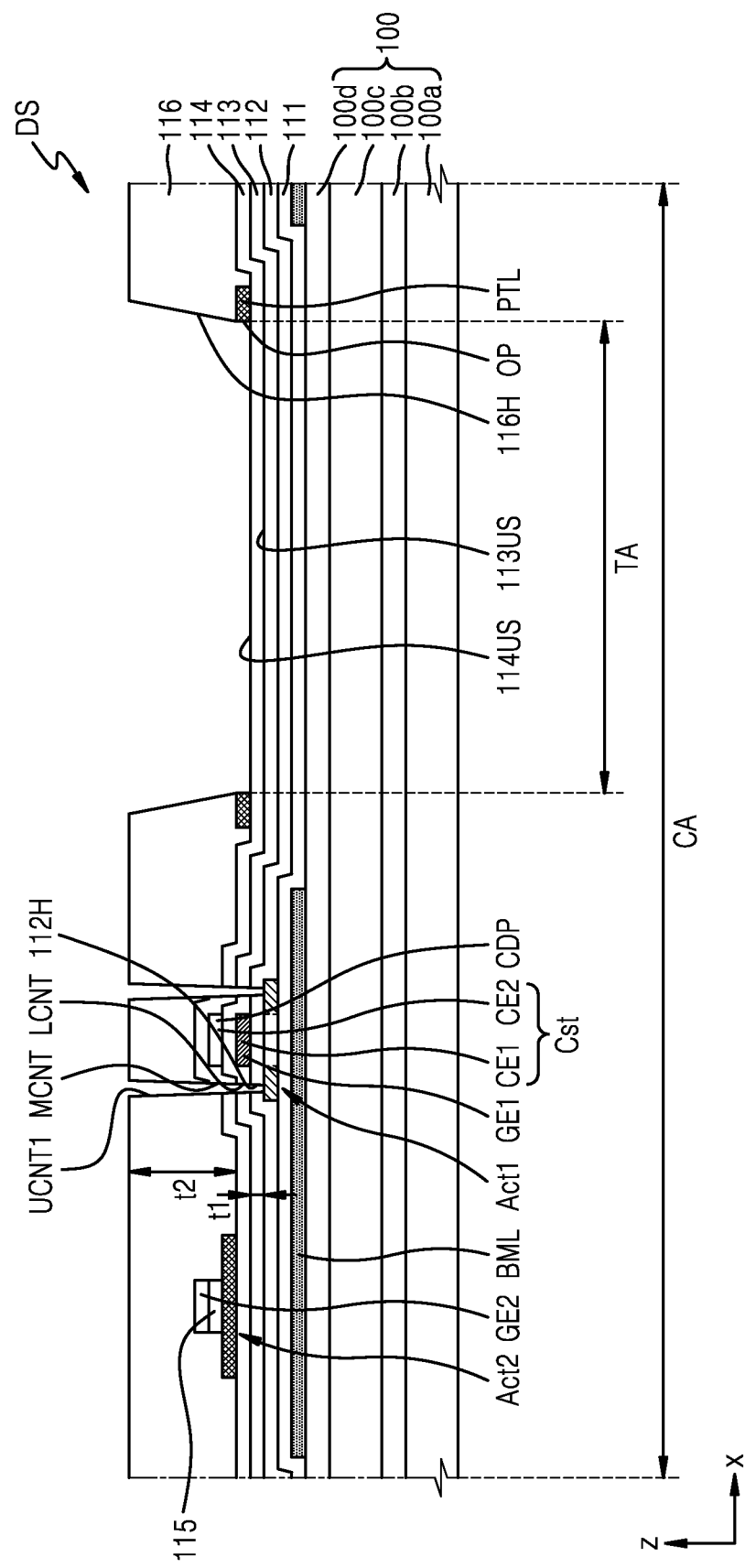

Referring to FIG. 10I, the pattern layer PTL may be etched. Accordingly, at least part of the pattern layer PTL may be removed. In an embodiment, an opening OP of the pattern layer PTL may be formed. The opening OP of the pattern layer PTL may overlap the transmission hole 116H.

The opening OP may expose an upper surface of the insulating layer arranged under the pattern layer PTL. For example, the opening OP may expose the upper surface 113US of the first insulating layer 113 or the upper surface 114US of the intermediate insulating layer 114. The opening OP may overlap the upper surface 113US of the first insulating layer 113 or the upper surface 114US of the intermediate insulating layer 114.

In an embodiment, the pattern layer PTL may be wet etched. For example, the pattern layer PTL may be wet etched using ammonium fluoride ($NH_4F$) and hydrofluoric acid (HF). In this case, the upper surface 113US of the first insulating layer 113 or the upper surface 114US of the intermediate insulating layer 114 may not be etched. Thus, the upper surface 113US of the first insulating layer 113 or the upper surface 114US of the intermediate insulating layer 114 may be kept flat.

When the pattern layer PTL is wet etched, at least one of an upper surface of the first semiconductor layer Act1, the lower hole 112H, the lower contact hole LCNT, the intermediate contact hole MCNT, and the first upper contact hole UCNT1 may be wet etched. When the lower hole 112H, the lower contact hole LCNT, the intermediate contact hole MCNT, and the first upper contact hole UCNT1 are formed by a dry etching process, silicon oxide ($SiO_2$) may be formed on the upper surface of the first semiconductor layer Act1. In this case, the silicon oxide ($SiO_2$) may be removed by wet etching at least one of the upper surface of the first semiconductor layer Act1, the lower hole 112H, the lower contact hole LCNT, the intermediate contact hole MCNT, and the first upper contact hole UCNT1.

When the pattern layer PTL is wet etched, the second semiconductor layer Act2 may not be wet etched because the second semiconductor layer Act2 is covered with the second insulating layer 116.

Figure 10J:
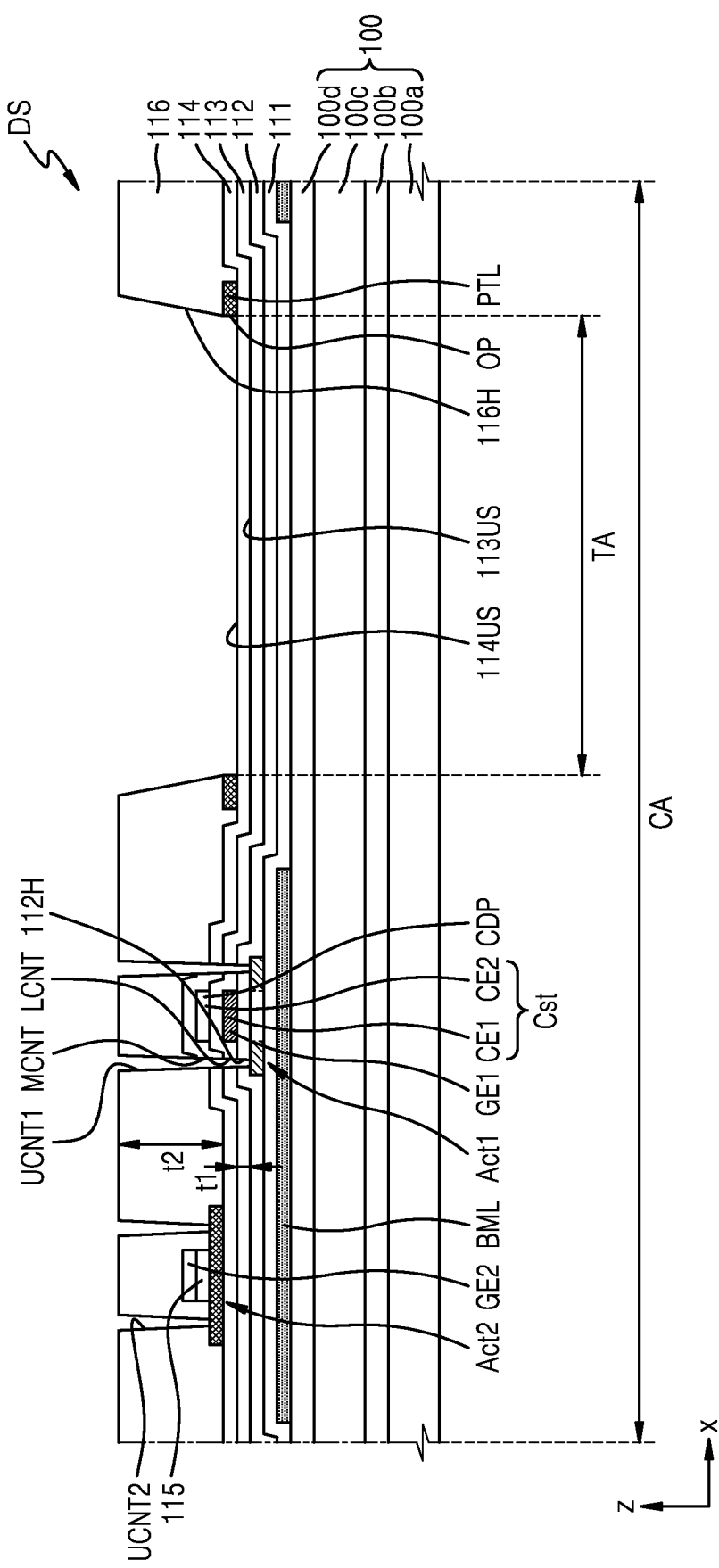

Referring to FIG. 10J, a second upper contact hole UCNT2 may be formed. The second upper contact hole UCNT2 may expose at least part of the second semiconductor layer Act2. The second upper contact hole UCNT2 may be formed by dry etching at least part of the second insulating layer 116. In an embodiment, after the first upper contact hole UCNT1 is formed, the second upper contact hole UCNT2 may be formed. Thus, when the first upper contact hole UCNT1 is formed, the second semiconductor layer Act2 may be prevented from being wet etched.

Referring to FIG. 10K, a first source electrode SE1 and a first drain electrode DE1 may be formed on the second insulating layer 116. The first source electrode SE1 and the first drain electrode DE1 may be connected to the first semiconductor layer Act1 through the lower hole 112H, the lower contact hole LCNT, the intermediate contact hole MCNT, and the first upper contact hole UCNT1. The second source electrode SE2 and the second drain electrode DE2 may be formed on the second insulating layer 116. The second source electrode SE2 and the second drain electrode DE2 may be connected to the second semiconductor layer Act2 through the second upper contact hole UCNT2 of the second insulating layer 116. The first source electrode SE1, the first drain electrode DE1, the second source electrode SE2, and the second drain electrode DE2 may be formed simultaneously.

Then, a first organic insulating layer 117 may be formed. The first organic insulating layer 117 may cover the first source electrode SE1, the first drain electrode DE1, the second source electrode SE2, and the second drain electrode DE2. In an embodiment, the first organic insulating layer 117 may also be formed in the transmission area TA. In another embodiment, the first organic insulating layer 117 may have a transmission hole overlapping the transmission hole 116H.

Then, a connection electrode CM and a line WL may be formed on the first organic insulating layer 117.

Then, a second organic insulating layer 118 may be formed. In an embodiment, the second organic insulating layer 118 may also be formed in the transmission area TA. In another embodiment, the second organic insulating layer 118 may have a transmission hole overlapping the transmission hole 116H.

Then, a display element may be formed on the second organic insulating layer 118. The display element may be formed on the second insulating layer 116. For example, a second organic light-emitting diode OLED2 may be formed on the second insulating layer 116. The second organic light-emitting diode OLED2 may be spaced apart from the transmission area TA. The second organic light-emitting diode OLED2 may include a pixel electrode 211, an emission layer 212, and an opposite electrode 213.

The pixel electrode 211 may be formed on the second organic insulating layer 118. In addition, a pixel-defining layer 119 includes an opening 119OP through which a central portion of the pixel electrode 211 is exposed, and may be formed on the second organic insulating layer 118. In an embodiment, the pixel-defining layer 119 may also be formed in the transmission area TA. In another embodiment, the pixel-defining layer 119 may have a transmission hole overlapping the transmission hole 116H.

The opposite electrode 213 and the emission layer 212 may be formed on the pixel electrode 211. In an embodiment, the opposite electrode 213 may have an opposite electrode hole 213H overlapping the transmission area TA.

A component COMP may then be arranged under the substrate 100. In an embodiment, the component COMP may overlap the component area CA. The component COMP may overlap the second organic light-emitting diode OLED2 and the transmission area TA.

Thus, according to an embodiment, a display device in which a transmittance of light incident on the component COMP or emitted from the component may be improved by forming the transmission hole 116H in the second insulating layer 116 may be manufactured. In addition, according to an embodiment, because the upper surface 113US of the first insulating layer 113 or the upper surface 114US of the intermediate insulating layer 114 are kept flat, a display device in which the occurrence of diffuse reflection or refraction of light passing through the transmission area TA may be reduced may be manufactured.

Figure 11:
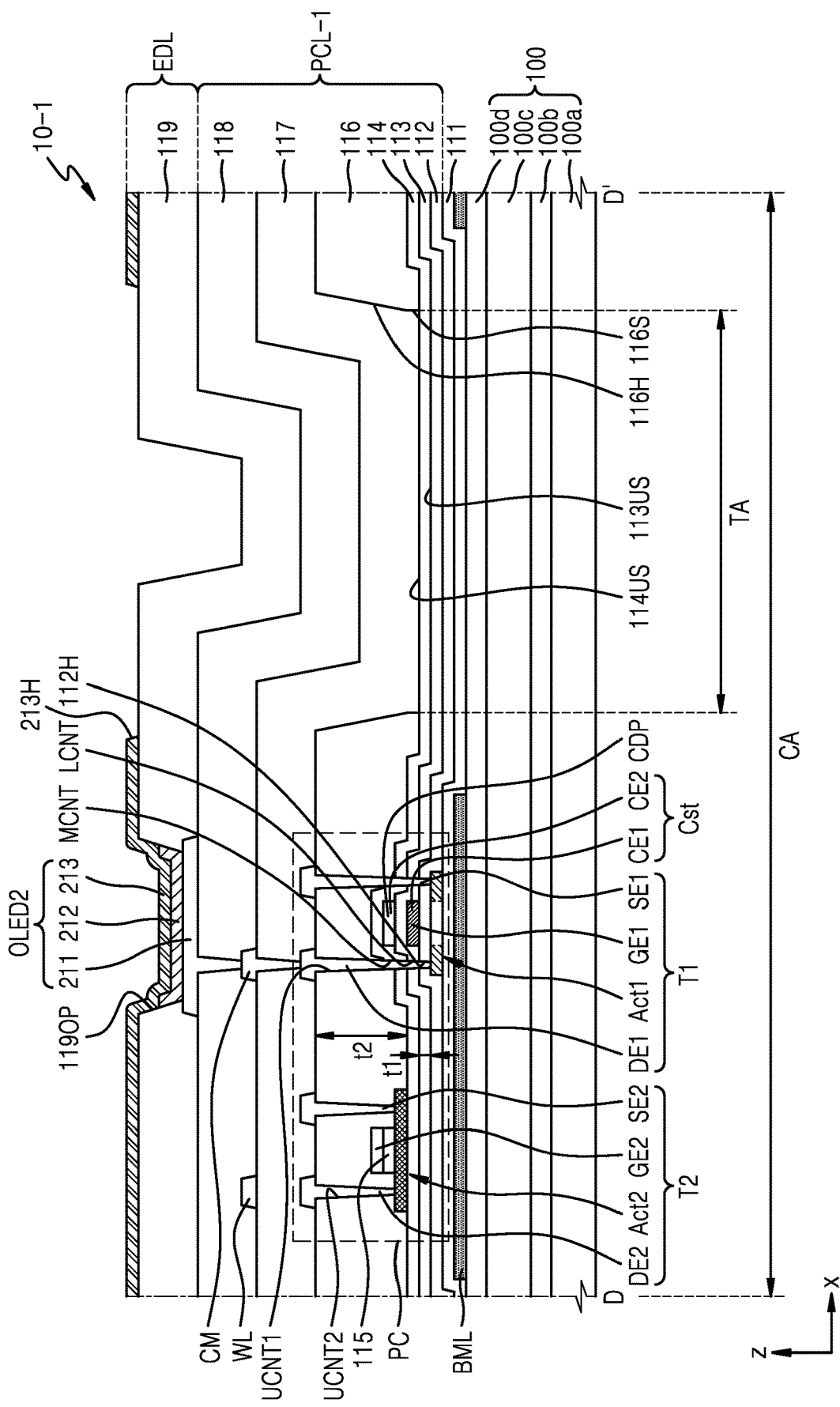
FIG. 11 is a cross-sectional view schematically illustrating a display panel according to another embodiment.

FIG. 11 is a cross-sectional view schematically illustrating a display panel 10-1 according to another embodiment. FIG. 11 is a cross-sectional view of the display panel in FIG. 6, taken along line D-D', according to an embodiment. In FIG. 11, the same reference symbols as those of FIG. 8 denote the same, and redundant descriptions thereof will be omitted.

Referring to FIG. 11, the display panel 10-1 may include a substrate 100, a bottom metal layer BML, a buffer layer 111, a pixel circuit layer PCL-1, and a display element layer EDL.

The substrate 100 may include a display area and a component area CA. The component area CA may include a transmission area TA.

The buffer layer 111 may be arranged on the substrate 100, and the pixel circuit layer PCL-1 may be arranged on the buffer layer 111. The pixel circuit layer PCL-1 may include a first gate insulating layer 112, a first insulating layer 113, an intermediate insulating layer 114, a second gate insulating layer 115, a second insulating layer 116, a first organic insulating layer 117, a second organic insulating layer 118, a pixel circuit PC, a connection electrode CM, a line WL, and a conductive pattern CDP. The pixel circuit PC may include a first thin-film transistor T1, a second thin-film transistor T2, and a storage capacitor Cst.

The first thin-film transistor T1 may include a first semiconductor layer Act1 arranged above the substrate 100 and including a silicon semiconductor, and a first gate electrode GE1 overlapping the first semiconductor layer Act1.

The first insulating layer 113 covers the first gate electrode GE1 and may overlap the transmission area TA.

The second thin-film transistor T2 may include a second semiconductor layer Act2 arranged on the first insulating layer 113 and including oxide semiconductor, and a second gate electrode GE2 overlapping the second semiconductor layer Act2.

The second insulating layer 116 may cover the second gate electrode GE2 and may have a transmission hole 116H overlapping the transmission area TA.

A second organic light-emitting diode OLED2 is arranged above the second insulating layer 116 and may be spaced apart from the transmission area TA. The transmission hole 116H of the second insulating layer 116 may expose an upper surface 113US of the first insulating layer 113. The transmission hole 116H of the second insulating layer 116 may overlap the upper surface 113US of the first insulating layer 113. In addition, the transmission hole 116H may expose the upper surface 114US of the intermediate insulating layer 114. The transmission hole 116H of the second insulating layer 116 may overlap an upper surface 114US of the intermediate insulating layer 114.

In the present embodiment, an inner surface 116S of the second insulating layer 116 defining the transmission hole 116H may contact the upper surface 113US of the first insulating layer 113 or the upper surface 114US of the intermediate insulating layer 114.

Figure 12A:
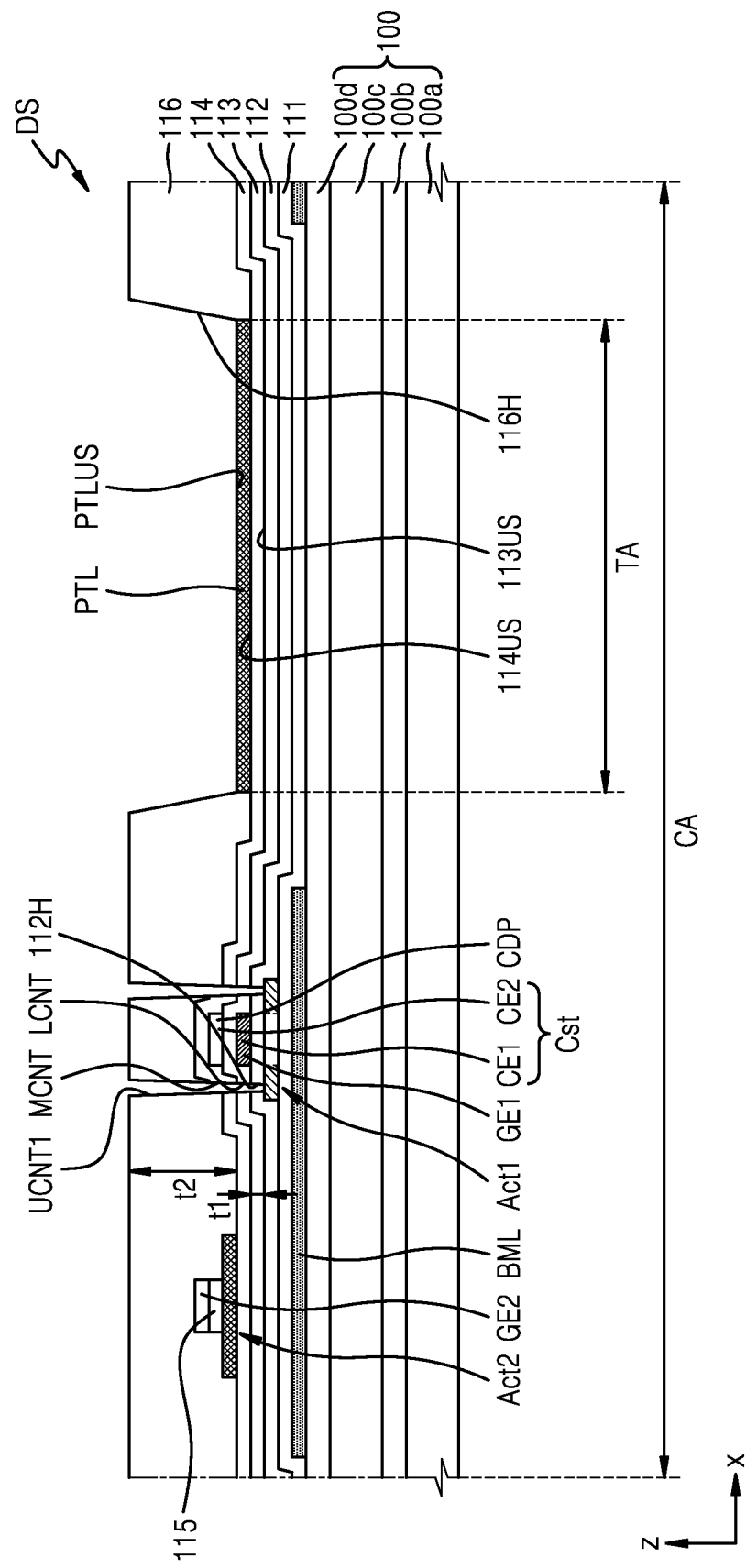
FIGS. 12A and 12B are cross-sectional views illustrating a method of manufacturing a display device, according to another embodiment.
Figure 12B:
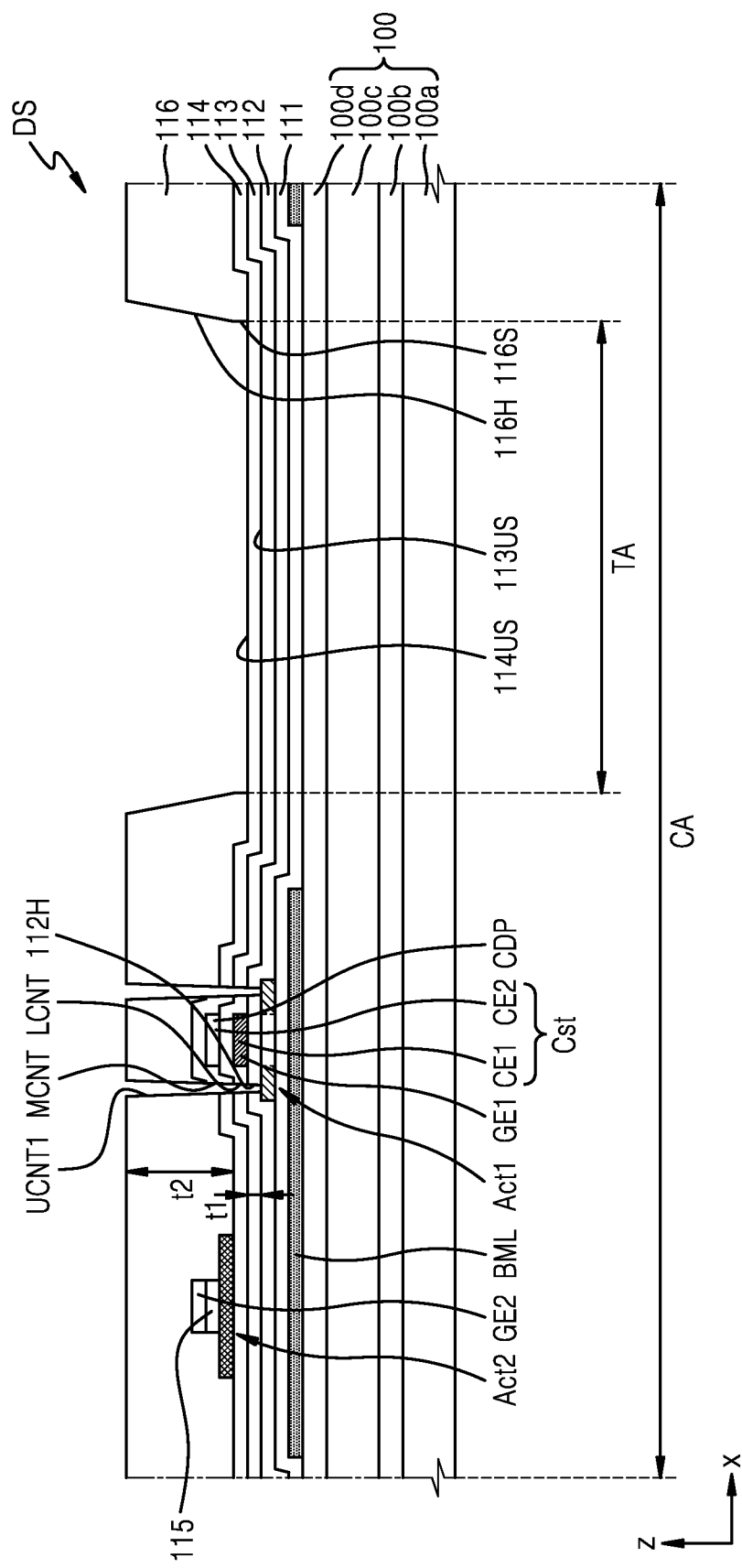

FIGS. 12A and 12B are cross-sectional views illustrating a method of manufacturing a display device, according to another embodiment. An embodiment shown in FIGS. 12A and 12B is different from the embodiment shown in FIGS. 10A to 10K in that the pattern layer PTL is entirely removed.

Referring to FIG. 12A, a transmission hole 116H of a second insulating layer 116 overlapping a transmission area TA may be formed. In an embodiment, the second insulating layer 116 may be dry etched, and the transmission hole 116H may be formed. In an embodiment, at least part of an upper surface PTLUS of a pattern layer PTL may be exposed through the transmission hole 116H. For example, the upper surface PTLUS of the pattern layer PTL may be entirely exposed.

The pattern layer PTL may not be dry etched. Thus, upper surfaces of insulating layers arranged under the pattern layer PTL may be kept flat. For example, an upper surface 113US of the first insulating layer 113 or an upper surface 114US of the intermediate insulating layer 114 is not etched and may be kept flat.

Referring to FIG. 12B, the pattern layer PTL may be etched. Accordingly, at least part of the pattern layer PTL may be removed. In an embodiment, the pattern layer PTL may be entirely removed.

In an embodiment, the pattern layer PTL may be wet etched. For example, the pattern layer PTL may be wet etched using ammonium fluoride (NH$_4$F) and hydrofluoric acid (HF). In this case, the upper surface 113US of the first insulating layer 113 or the upper surface 114US of the intermediate insulating layer 114 may not be etched. The upper surface 113US of the first insulating layer 113 or the upper surface 114US of the intermediate insulating layer 114 may overlap the transmission hole 116H of the second insulating layer 116. Thus, the upper surface 113US of the first insulating layer 113 or the upper surface 114US of the intermediate insulating layer 114 may be kept flat.

In an embodiment, an inner surface 116S of the second insulating layer 116 defining a transmission hole 116H of the second insulating layer 116 may contact the upper surface 113US of the first insulating layer 113 or the upper surface 114US of the intermediate insulating layer 114.

Thus, the transmission hole 116H of the second insulating layer 116 may be formed in the transmission area TA without an additional mask process.

Figure 13:
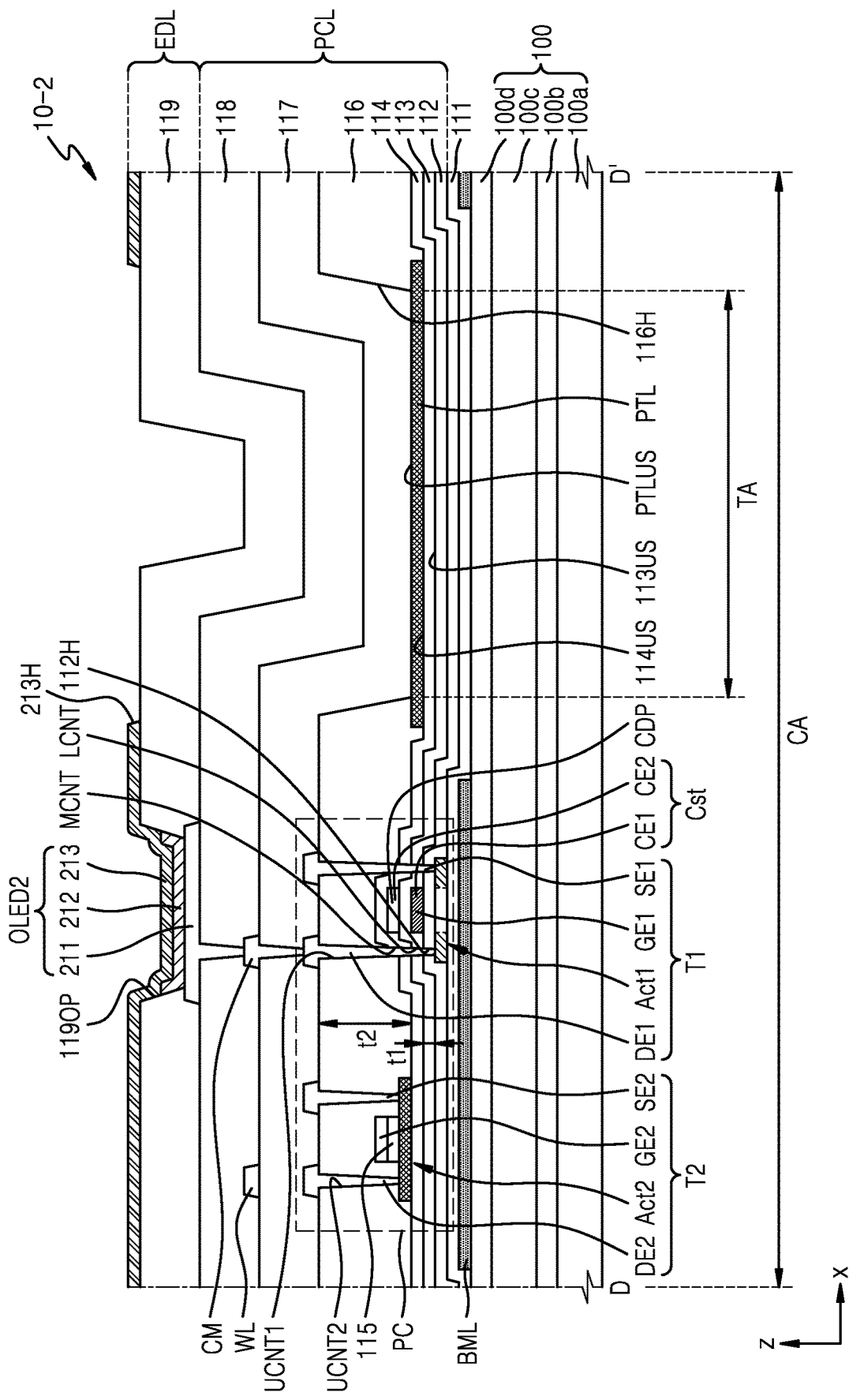
FIG. 13 is a cross-sectional view of a display panel according to another embodiment.

FIG. 13 is a cross-sectional view schematically illustrating a display panel 10-2 according to another embodiment. In FIG. 13, the same reference symbols as those of FIG. 8 denote the same, and redundant descriptions thereof will be omitted.

Referring to FIG. 13, the display panel 10-2 may include a substrate 100, a bottom metal layer BML, a buffer layer 111, a pixel circuit layer PCL, and a display element layer EDL.

The substrate 100 may include a display area and a component area CA. The component area CA may include a transmission area TA.

The buffer layer 111 may be arranged on the substrate 100, and the pixel circuit layer PCL may be arranged on the buffer layer 111. The pixel circuit layer PCL may include a first gate insulating layer 112, a first insulating layer 113, an intermediate insulating layer 114, a second gate insulating layer 115, a second insulating layer 116, a first organic insulating layer 117, a second organic insulating layer 118, a pixel circuit PC, a pattern layer PTL, a connection electrode CM, a line WL, and a conductive pattern CDP.

A first thin-film transistor T1 may include a first semiconductor layer Act1 arranged above the substrate 100 and including a silicon semiconductor, and a first gate electrode GE1 overlapping the first semiconductor layer Act1.

The first insulating layer 113 covers the first gate electrode GE1 and may overlap the transmission area TA.

The second thin-film transistor T2 may include a second semiconductor layer Act2 arranged above the first insulating layer 113 and including oxide semiconductor, and a second gate electrode GE2 overlapping the second semiconductor layer Act2.

The second insulating layer 116 may cover the second gate electrode GE2, and may have a transmission hole 116H overlapping the transmission area TA.

A second organic light-emitting diode OLED2 is arranged above the second insulating layer 116 and may be spaced apart from the transmission area TA. In addition, the upper surface 113US of the first insulating layer 113 or the upper surface 114US of the intermediate insulating layer 114 may overlap the transmission hole 116H of the second insulating layer 116.

The pattern layer PTL may be arranged between the first insulating layer 113 and the second insulating layer 116, and may overlap the transmission area TA. The pattern layer PTL and the second semiconductor layer Act2 may include a same material. An upper surface PTLUS of the pattern layer PTL may be flat.

In the present embodiment, the upper surface PTLUS of the pattern layer PTL may be exposed through the transmission hole 116H of the second insulating layer 116. In this case, the upper surface PTLUS of the pattern layer PTL and upper surfaces of insulating layers arranged under the pattern layer PTL may be flat. In an embodiment, the buffer layer 111, the first gate insulating layer 112, the first insulating layer 113, and the intermediate insulating layer 114, which overlap the transmission area TA, may each have a flat upper surface. For example, the upper surface PTLUS of the pattern layer PTL, the upper surface 113US of the first insulating layer 113, or the upper surface 114US of the intermediate insulating layer 114 may be mostly flat in the transmission area TA. Thus, the unexpected refraction of light passing through the transmission area TA may be reduced or prevented. In addition, the diffuse reflection of light passing through the transmission area TA may be reduced or prevented.

Figure 14A:
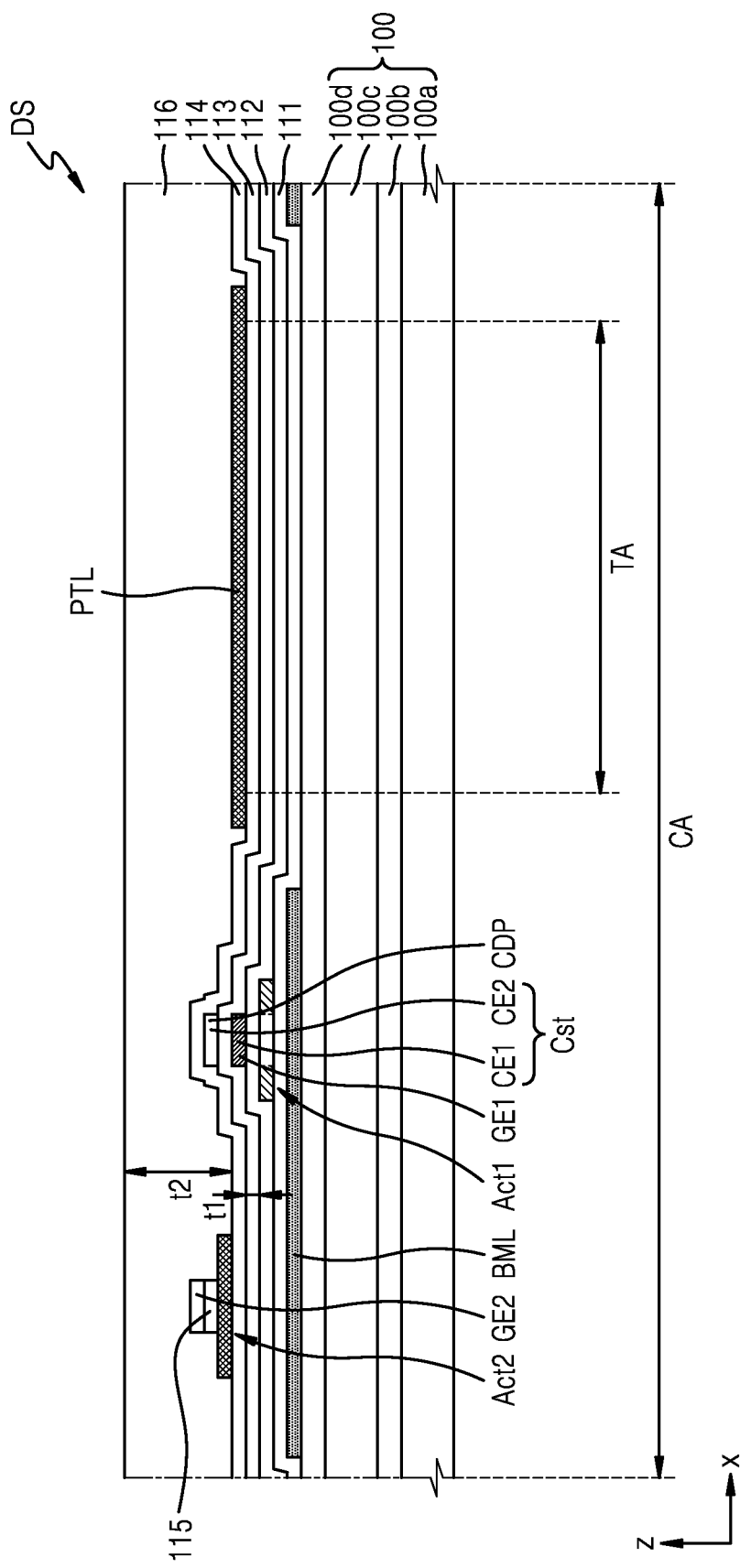
FIGS. 14A, 14B, and 14C are cross-sectional views illustrating a method of manufacturing a display device, according to another embodiment.
Figure 14B:
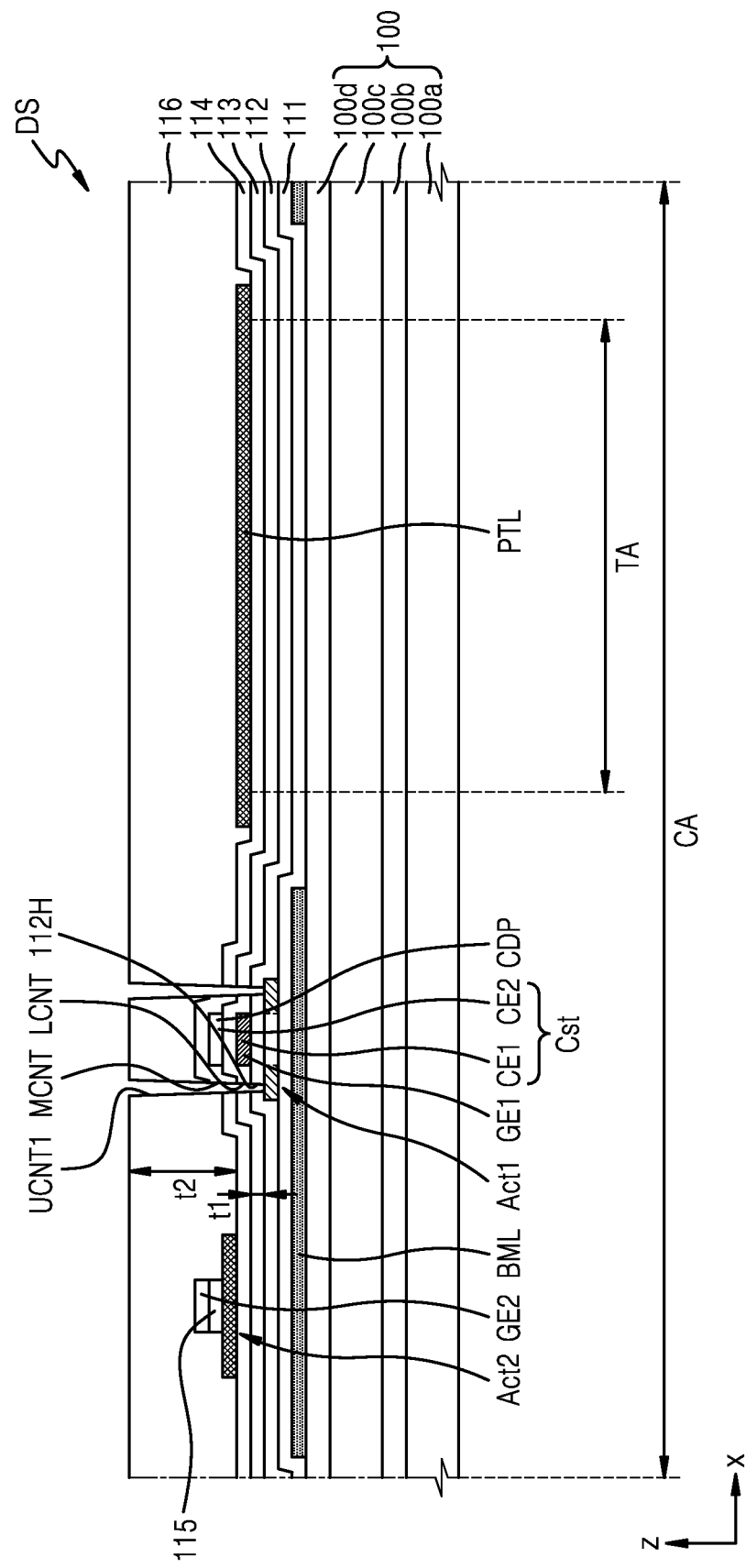
Figure 14C:
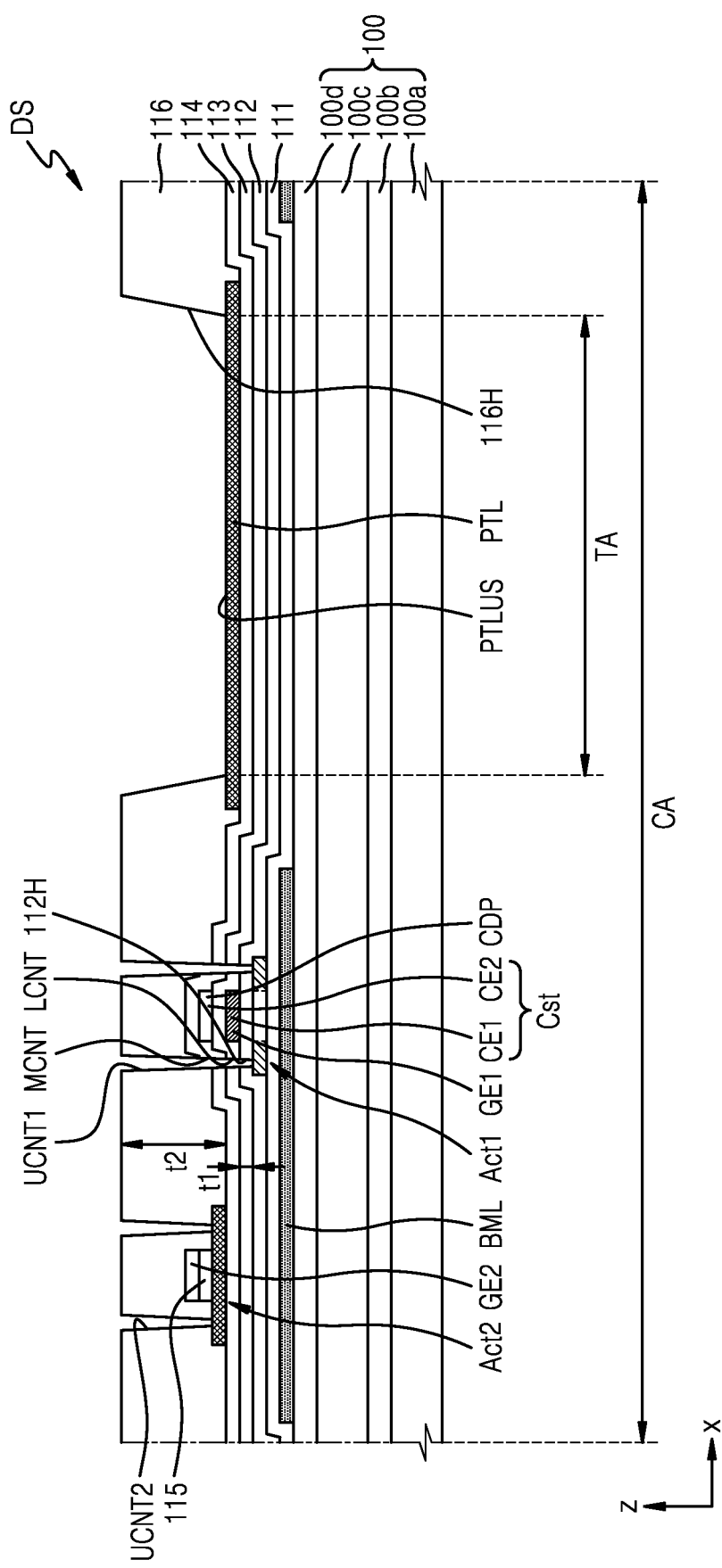

FIGS. 14A to 14C are cross-sectional views illustrating a method of manufacturing a display device, according to another embodiment. An embodiment shown in FIGS. 14A to 14C differs from the embodiment shown in FIGS. 10A to 10K in that a transmission hole 116H of a second insulating layer 116 is formed simultaneously with a second upper contact hole UCNT2.

Referring to FIG. 14A, the second insulating layer 116 may be formed. The second insulating layer 116 may cover a second semiconductor layer Act2 and a pattern layer PTL. In an embodiment, the second insulating layer 116 may be formed on the second semiconductor layer Act2, a second gate electrode GE2, and an intermediate insulating layer 114. A second thickness t2 of the second insulating layer 116 may be greater than a first thickness t1 of a first insulating layer 113.

Referring to FIG. 14B, a lower contact hole LCNT through which at least a portion of a first semiconductor layer Act1 is exposed may be formed in the first insulating layer 113. In addition, a first upper contact hole UCNT1 through which at least a portion of the first semiconductor layer Act1 is exposed may be formed in the second insulating layer 116. In other words, a first gate insulating layer 112, the first insulating layer 113, the intermediate insulating layer 114, and the second insulating layer 116 may be etched, and a lower hole 112H of the first gate insulating layer 112, a lower contact hole LCNT of the first insulating layer 113, an intermediate contact hole MCNT of the intermediate insulating layer 114, and the first upper contact hole UCNT1 of the second insulating layer 116 may be formed. The lower hole 112H, the lower contact hole LCNT, the intermediate contact hole MCNT, and the first upper contact hole UCNT1 may expose at least part of the first semiconductor layer Act1.

Then, at least one of an upper surface of the first semiconductor layer Act1, the lower hole 112H, the lower contact hole LCNT, the intermediate contact hole MCNT, and the first upper contact hole UCNT1 may be wet etched. For example, at least one of the upper surface of the first semiconductor layer Act1, the lower hole 112H, the lower contact hole LCNT, the intermediate contact hole MCNT, and the first upper contact hole UCNT1 may be wet etched using ammonium fluoride ($NH_4F$) and hydrofluoric acid (HF). Thus, silicon oxide ($SiO_2$) formed on the upper surface of the first semiconductor layer Act1 by dry etching may be removed.

When at least one of the upper surface of the first semiconductor layer Act1, the lower hole 112H, the lower contact hole LCNT, the intermediate contact hole MCNT, and the first upper contact hole UCNT1 is wet etched, the second semiconductor layer Act2 and the pattern layer PTL are covered with the second insulating layer 116, and thus, the second semiconductor layer Act2 and the pattern layer PTL may not be wet etched.

Referring to FIG. 14C, the transmission hole 116H of the second insulating layer 116 overlapping a transmission area TA may be formed. In an embodiment, the second insulating layer 116 may be dry etched, and the transmission hole 116H may be formed. In this case, part of the pattern layer PTL may be exposed. In an embodiment, at least part of an upper surface PTLUS of the pattern layer PTL may be exposed through the transmission hole 116H. In this case, the pattern layer PTL may not be dry etched. Thus, the upper surface PTLUS of the pattern layer PTL may be kept flat.

When forming the transmission hole 116H of the second insulating layer 116, the second upper contact hole UCNT2 may be formed. The second upper contact hole UCNT2 may expose at least part of the second semiconductor layer Act2. The second upper contact hole UCNT2 may be formed by dry etching at least part of the second insulating layer 116. Thus, the transmission hole 116H of the second insulating layer 116 may be formed in the transmission area TA without an additional mask process.

In a process of forming the second upper contact hole UCNT2, the second semiconductor layer Act2 may not be etched. In addition, when forming the transmission hole 116H of the second insulating layer 116, the pattern layer PTL including a same material as the second semiconductor layer Act2 may not be etched. Thus, the pattern layer PTL may prevent insulating layers arranged therebelow from being etched, and the upper surfaces of the insulating layers arranged under the pattern layer PTL may be kept flat.

Figure 15:
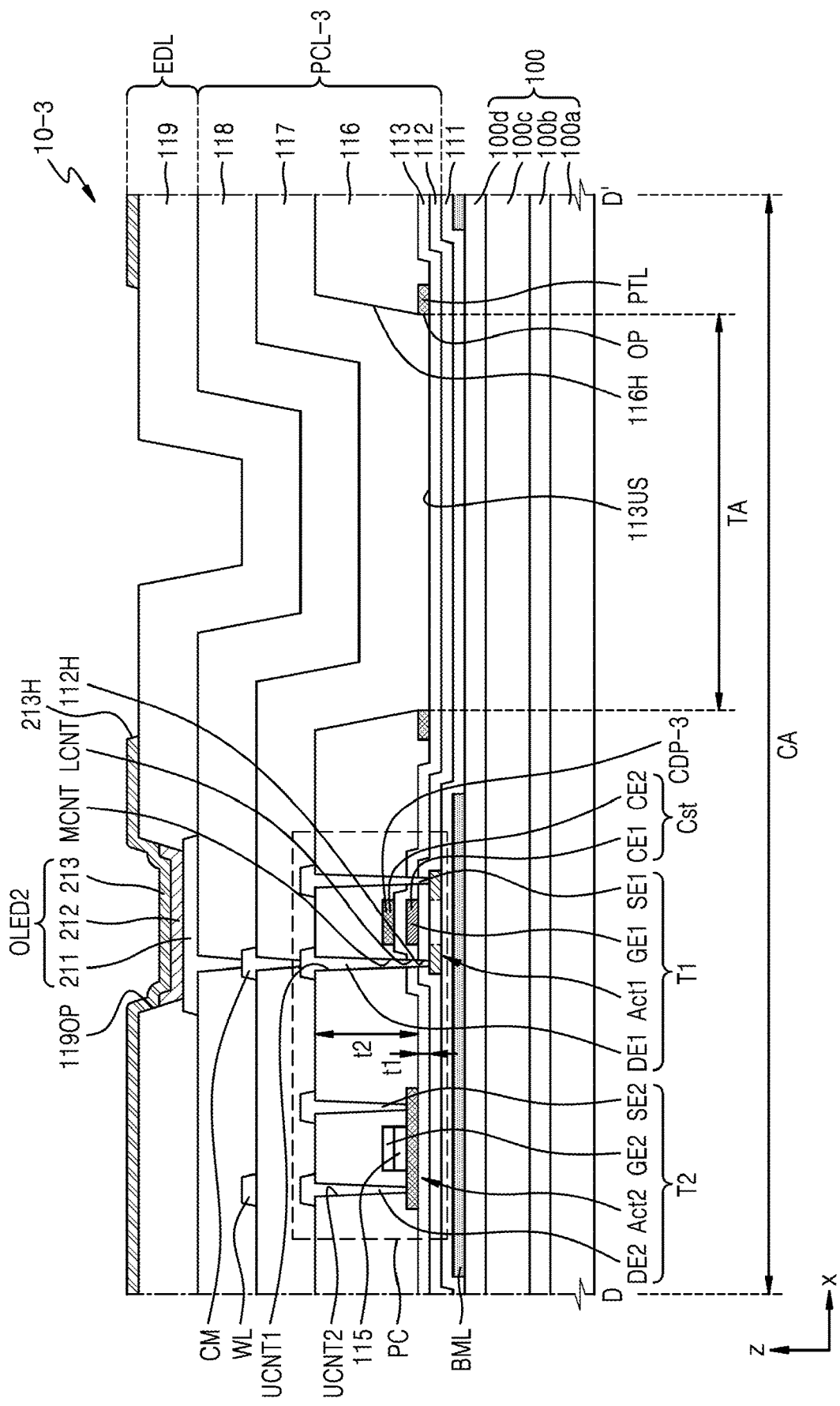
FIG. 15 is a cross-sectional view schematically illustrating a display panel according to another embodiment.

FIG. 15 is a cross-sectional view schematically illustrating a display panel 10-3 according to another embodiment. In FIG. 15, the same reference symbols as those of FIG. 8 denote the same, and redundant descriptions thereof are omitted.

Referring to FIG. 15, the display panel 10-3 may include a substrate 100, a bottom metal layer BML, a buffer layer 111, a pixel circuit layer PCL-3, and a display element layer EDL.

The substrate 100 may include a display area and a component area CA. The component area CA may include a transmission area TA.

The buffer layer 111 may be arranged on the substrate 100, and the pixel circuit layer PCL-3 may be arranged on the buffer layer 111. The pixel circuit layer PCL-3 may include a first gate insulating layer 112, a first insulating layer 113, a second gate insulating layer 115, a second insulating layer 116, a first organic insulating layer 117, a second organic insulating layer 118, a pixel circuit PC, a pattern layer PTL, a connection electrode CM, a line WL, and a conductive pattern CDP-3.

A first thin-film transistor T1 may include a first semiconductor layer Act1 arranged above the substrate 100 and including a silicon semiconductor, and a first gate electrode GE1 overlapping the first semiconductor layer Act1.

The first insulating layer 113 covers the first gate electrode GE1 and may overlap the transmission area TA.

The conductive pattern CDP-3 may be arranged on the first insulating layer 113. The conductive pattern CDP-3 may be arranged between the first insulating layer 113 and the second insulating layer 116.

In an embodiment, the conductive pattern CDP-3 may overlap the first gate electrode GE1 therebelow. In this case, the first gate electrode GE1 of the first thin-film transistor T1 and the conductive pattern CDP-3 overlapping each other with the first insulating layer 113 therebetween may form a storage capacitor Cst. In other words, the first gate electrode GE1 of the first thin-film transistor T1 may function as a lower electrode CE1 of the storage capacitor Cst. The conductive pattern CDP-3 may function as an upper electrode CE2 of the storage capacitor Cst.

In an embodiment, the conductive pattern CDP-3 and a second semiconductor layer Act2 may include a same material. The conductive pattern CDP-3 may include a Zn oxide-based material such as Zn oxide, In—Zn oxide, and Ga—In—Zn oxide. In some embodiments, the conductive pattern CDP-3 may include In—Ga—Zn—O (IGZO), In—Sn—Zn—O (ITZO), or In—Ga—Sn—Zn—O (IGTZO) semiconductor, in which a metal such as indium (In), gallium (Ga), or stannum (Sn) is included in ZnO.

A second thin-film transistor T2 may include the second semiconductor layer Act2 arranged on the first insulating layer 113 and including oxide semiconductor, and a second gate electrode GE2 overlapping the second semiconductor layer Act2.

The second insulating layer 116 may cover the second gate electrode GE2 and may have a transmission hole 116H overlapping the transmission area TA.

A second organic light-emitting diode OLED2 is arranged above the second insulating layer 116 and may be spaced apart from the transmission area TA. The transmission hole 116H of the second insulating layer 116 may expose an upper surface 113US of the first insulating layer 113. The transmission hole 116H of the second insulating layer 116 may overlap the upper surface 113US of the first insulating layer 113.

The pattern layer PTL may be arranged in the component area CA. The pattern layer PTL may be arranged between the first insulating layer 113 and the second insulating layer 116. In some embodiments, the pattern layer PTL may be omitted.

In an embodiment, the pattern layer PTL may have an opening OP overlapping the transmission hole 116H. The opening OP may expose the upper surface 113US of the first insulating layer 113.

In the present embodiment, the conductive pattern CDP-3 and the second semiconductor layer Act2 may include a same material. Because the conductive pattern CDP-3 and the second semiconductor layer Act2 are arranged on a same layer, the intermediate insulating layer 114 (see FIG. 8) may be omitted. Accordingly, thicknesses of insulating layers overlapping the transmission area TA may be reduced. Thus, the light transmittance in the transmission area TA may be improved.

Figure 16A:
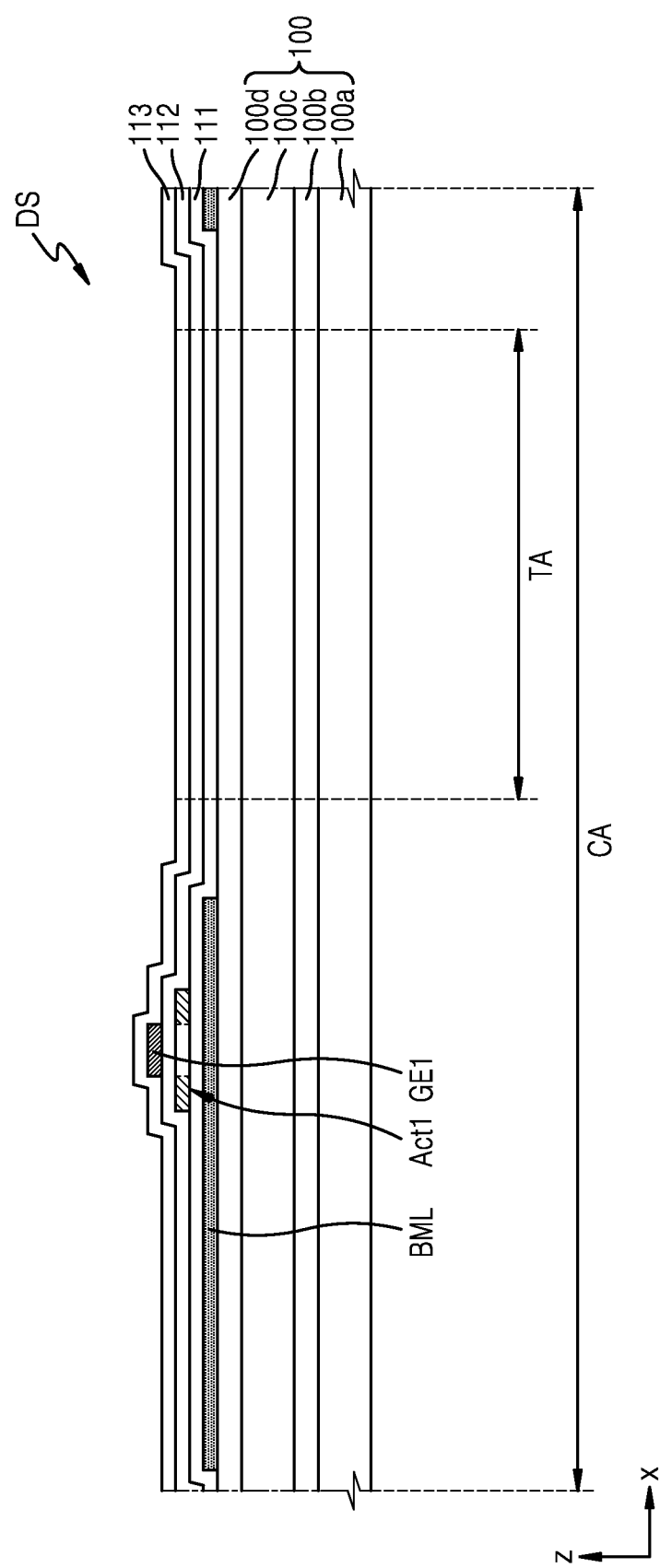
FIGS. 16A, 16B, and 16C are cross-sectional views schematically illustrating a method of manufacturing a display device, according to another embodiment.
Figure 16B:
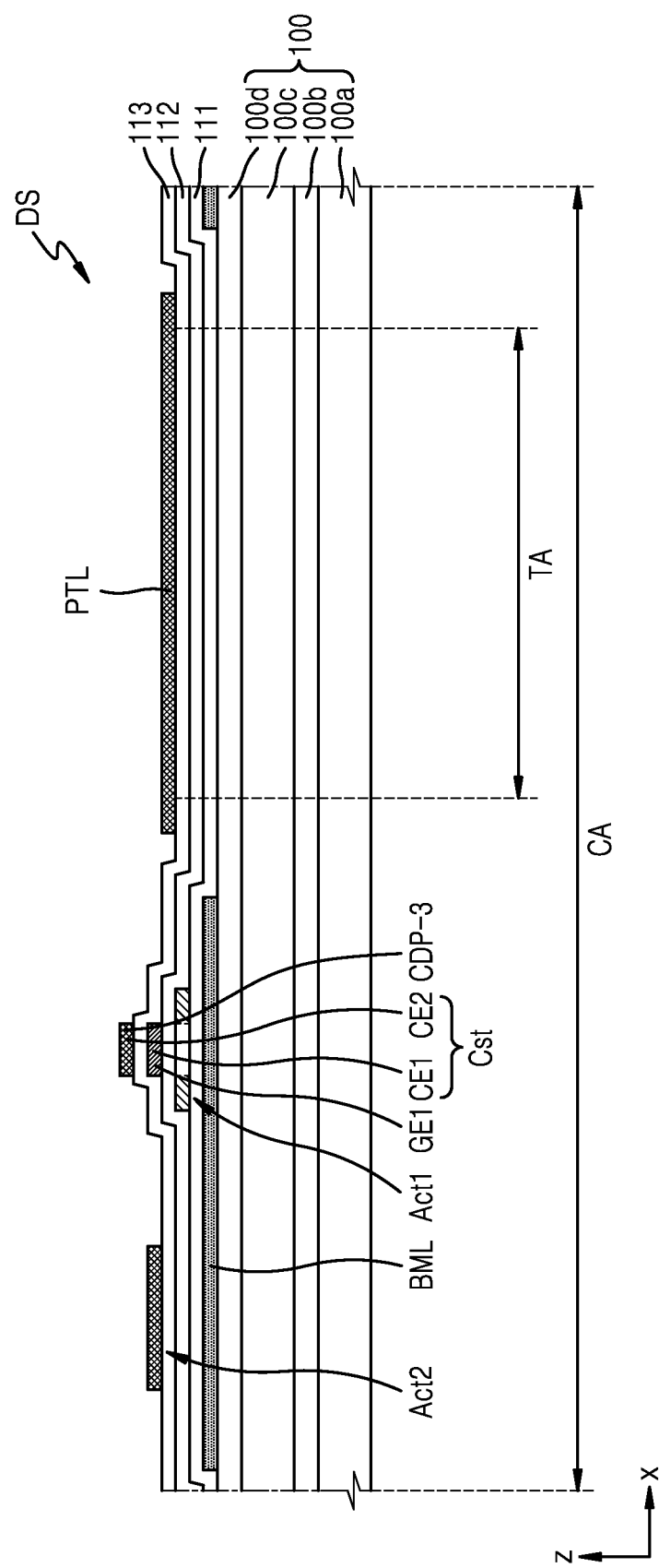
Figure 16C:
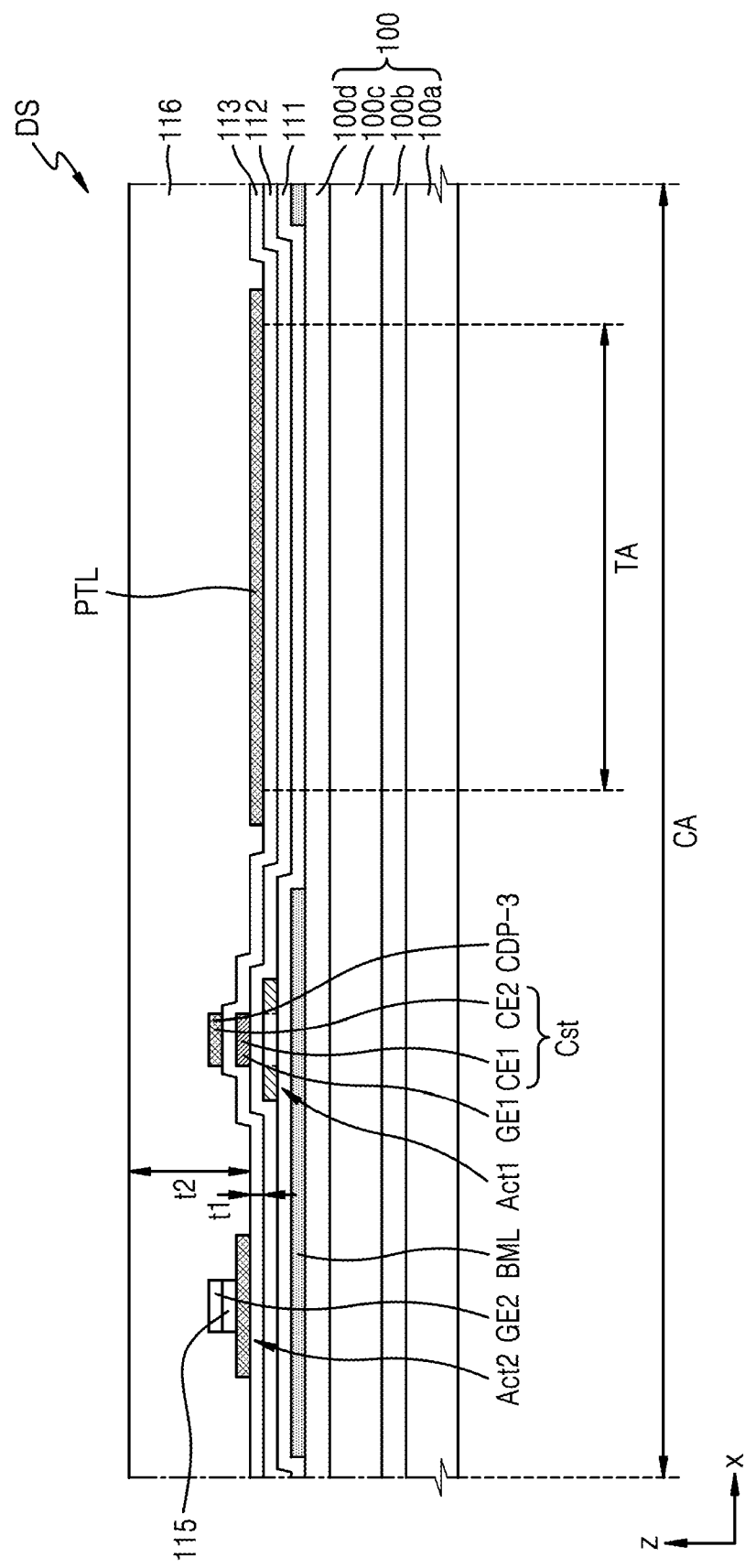

FIGS. 16A to 16C are cross-sectional views schematically illustrating a method of manufacturing a display device, according to another embodiment.

Referring to FIG. 16A, a display substrate DS may be prepared. The display substrate DS may be a display device being manufactured. The display substrate DS may include a substrate 100, a bottom metal layer BML, a buffer layer 111, a first semiconductor layer Act1, a first gate insulating layer 112, and a first gate electrode GE1.

The substrate 100 may include a display area and a component area CA. The component area CA may include a transmission area TA.

The first semiconductor layer Act1 may be arranged on the substrate 100. The first gate electrode GE1 may overlap the first semiconductor layer Act1. The first gate insulating layer 112 is arranged between the first semiconductor layer Act1 and the first gate electrode GE1, and the first semiconductor layer Act1 may be insulated from the first gate electrode GE1.

Then, a first insulating layer 113 may be formed. The first insulating layer 113 may cover the first gate electrode GE1.

Referring to FIG. 16B, a second semiconductor layer Act2, a conductive pattern CDP-3, and a pattern layer PTL may be formed. In an embodiment, the second semiconductor layer Act2, the conductive pattern CDP-3, and the pattern layer PTL may be formed on the first insulating layer 113. In an embodiment, the second semiconductor layer Act2 including oxide semiconductor may be formed in the component area CA. In an embodiment, the conductive pattern CDP-3 may be formed to overlap the first gate electrode GE1. In an embodiment, the pattern layer PTL overlapping the transmission area TA may be formed.

In an embodiment, an oxide semiconductor layer may be entirely formed in the component area CA. In an embodiment, the oxide semiconductor layer may be sputtered and entirely formed in the component area CA. In addition, the oxide semiconductor layer may be patterned to form the second semiconductor layer Act2, the conductive pattern CDP-3, and the pattern layer PTL. Thus, the second semiconductor layer Act2, the conductive pattern CDP-3, and the pattern layer PTL may be formed simultaneously, and a process of manufacturing the display device may be simplified.

The second semiconductor layer Act2, the conductive pattern CDP-3, and the pattern layer PTL may be spaced apart from one another. In an embodiment, each of the second semiconductor layer Act2, the conductive pattern CDP-3, and the pattern layer PTL may include oxide semiconductor. In this case, the second semiconductor layer Act2, the conductive pattern CDP-3, and the pattern layer PTL may include a same material. Each of the second semiconductor layer Act2, the conductive pattern CDP-3, and the pattern layer PTL may include a Zn oxide-based material such as Zn oxide, In—Zn oxide, and Ga—In—Zn oxide. In some embodiments, each of the second semiconductor layer Act2, the conductive pattern CDP-3, and the pattern layer PTL may include In—Ga—Zn—O (IGZO), In—Sn—Zn—O (ITZO), or In—Ga—Sn—Zn—O (IG-TZO) semiconductor, in which a metal such as indium (In), gallium (Ga), or stannum (Sn) is included in ZnO.

Referring to FIG. 16C, a second insulating layer 116 may be formed. The second insulating layer 116 may cover the second semiconductor layer Act2, the conductive pattern CDP-3, and the pattern layer PTL. A second thickness t2 of the second insulating layer 116 may be greater than a first thickness t1 of the first insulating layer 113.

A method of manufacturing a display device thereafter may be similar to that in the embodiment described with reference to FIGS. 10H to 10K, the embodiment described with reference to FIGS. 12A and 12B, or the embodiment described with reference to FIGS. 14A to 14C.

As described above, a display device according to the embodiments of the present disclosure has a transmission hole in a second insulating layer through which an upper surface of an intermediate insulating layer is exposed, so as to not only improve the light transmittance of the transmission area but also improve optical functions of the transmission area.

In a method of manufacturing a display device according to the embodiments of the present disclosure, a pattern layer including oxide semiconductor may be formed together with a second semiconductor layer. In addition, a transmission hole exposing at least part of the pattern layer and overlapping the transmission area may be formed in the second insulating layer. Thus, a display device with improved light transmittance of the transmission area and improved optical functions of the transmission area may be manufactured.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure including the following claims.

What is claimed is:

1. A display device comprising:
   a substrate comprising a component area and a display area adjacent to the component area, the component area including a transmission area;
   a first thin-film transistor comprising a first semiconductor layer arranged on the substrate and a first gate electrode overlapping the first semiconductor layer, the first semiconductor layer including a silicon semiconductor;
   a first insulating layer covering the first gate electrode and overlapping the transmission area;
   a second thin-film transistor comprising a second semiconductor layer arranged on the first insulating layer and a second gate electrode overlapping the second semiconductor layer, the second semiconductor layer including an oxide semiconductor;

a second insulating layer covering the second gate electrode and having a transmission hole overlapping the transmission area;

a conductive pattern between the first insulating layer and the second insulating layer;

a display element arranged on the second insulating layer and spaced apart from the transmission area; and a pattern layer arranged between the first insulating layer and the second insulating layer and overlapping the component area, wherein the transmission hole exposes an upper surface of the first insulating layer, and the pattern layer comprises an opening that overlaps the transmission hole and exposes the upper surface of the first insulating layer.

2. The display device of claim 1, wherein the conductive pattern includes a same material as the second semiconductor layer.

3. The display device of claim 1, wherein the display area surrounds the component area.

4. The display device of claim 1, wherein the second semiconductor layer is arranged between the first insulating layer and the second insulating layer, and the first thin-film transistor further comprises any one of a first source electrode and a first drain electrode arranged above the second insulating layer and electrically connected to the first semiconductor layer through a lower contact hole of the first insulating layer, and a first upper contact hole of the second insulating layer.

5. The display device of claim 1, wherein the second thin-film transistor further comprises any one of a second source electrode and a second drain electrode arranged above the second insulating layer and electrically connected to the second semiconductor layer through a second upper contact hole of the second insulating layer.

6. The display device of claim 1, wherein the pattern layer and the second semiconductor layer include a same material.

7. The display device of claim 1, wherein a second thickness of the second insulating layer is greater than a first thickness of the first insulating layer.

8. The display device of claim 1, further comprising a bottom metal layer arranged between the substrate and the first semiconductor layer and overlapping the component area, wherein at least one of the first thin-film transistor and the second thin-film transistor overlaps the bottom metal layer.

9. The display device of claim 1, further comprising a component overlapping the component area, wherein the display element comprises a first display element and a second display element, the first display element overlaps the display area, and the second display element overlaps the component area.

* * * * *